(12) United States Patent
Sugizaki

(10) Patent No.: US 11,044,446 B2
(45) Date of Patent: Jun. 22, 2021

(54) IMAGING DEVICE AND ELECTRONIC APPARATUS

(71) Applicant: Sony Semiconductor Solutions Corporation, Kanagawa (JP)

(72) Inventor: Taro Sugizaki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/465,586

(22) PCT Filed: Dec. 12, 2017

(86) PCT No.: PCT/JP2017/044625
§ 371 (c)(1),
(2) Date: May 31, 2019

(87) PCT Pub. No.: WO2018/110569
PCT Pub. Date: Jun. 21, 2018

(65) Prior Publication Data
US 2020/0021782 A1    Jan. 16, 2020

(30) Foreign Application Priority Data
Dec. 13, 2016 (JP) .............................. JP2016-241252

(51) Int. Cl.
*H04N 9/04* (2006.01)
*G02B 5/20* (2006.01)
(Continued)

(52) U.S. Cl.
CPC ........... *H04N 9/0455* (2018.08); *G02B 5/201* (2013.01); *G02B 5/28* (2013.01); *H01L 27/14645* (2013.01); *H04N 9/083* (2013.01)

(58) Field of Classification Search
CPC ............. H04N 9/0455; H04N 9/083; H01L 27/14645; H01L 27/14685; H01L 27/14621; G02B 5/28; G02B 5/201
See application file for complete search history.

(56) References Cited

U.S. PATENT DOCUMENTS

2007/0236757 A1* 10/2007 Stewart ................ H04N 5/2254
358/509
2012/0057055 A1    3/2012 Yokogawa
(Continued)

FOREIGN PATENT DOCUMENTS

EP      2428993 A2    3/2012
EP      2738810 A1    6/2014
(Continued)

OTHER PUBLICATIONS

International Search Report and English translation thereof dated Feb. 27, 2018 in connection with International Application No. PCT/JP2017/044625.
(Continued)

*Primary Examiner* — Yogesh K Aggarwal
(74) *Attorney, Agent, or Firm* — Wolf, Greenfield & Sacks, P.C.

(57) ABSTRACT

The present technology relates to an imaging device capable of selectively taking out only a specific electromagnetic wavelength and generating a signal with an enhanced wavelength resolution, and an electronic apparatus.
There are provided a first pixel including a metallic thin film filter configured to transmit a light in a first frequency band and a second pixel including a color filter configured to transmit a light in a second frequency band wider than the first frequency band. A signal in a third frequency band is generated from the respective signals of a plurality of first pixels each including a metallic thin film filter configured to transmit a light in the different first frequency bands. The
(Continued)

present technology can be applied to a CMOS image sensor of backside irradiation type or surface irradiation type, for example.

12 Claims, 40 Drawing Sheets

(51) Int. Cl.
*G02B 5/28* (2006.01)
*H01L 27/146* (2006.01)
*H04N 9/083* (2006.01)

(56) References Cited

U.S. PATENT DOCUMENTS

| | | | |
|---|---|---|---|
| 2014/0146207 A1 | 5/2014 | Yokogawa | |
| 2014/0191113 A1 | 7/2014 | Atwater et al. | |
| 2015/0029366 A1* | 1/2015 | Numata | G02B 5/201 348/273 |
| 2015/0270314 A1 | 9/2015 | Miyazaki et al. | |
| 2016/0254303 A1* | 9/2016 | Takimoto | G02B 5/20 257/432 |
| 2017/0278826 A1 | 9/2017 | Sugizaki et al. | |

FOREIGN PATENT DOCUMENTS

| | | |
|---|---|---|
| JP | WO 2005/013369 A1 | 2/2005 |
| JP | WO 2006-028128 A1 | 3/2006 |
| JP | 2012-059865 A | 3/2012 |
| JP | 2013-030626 A | 2/2013 |
| JP | 2015-022279 A | 2/2015 |
| JP | 2015-179731 A | 10/2015 |
| KR | 101 416 552 B1 | 8/2014 |
| WO | WO 2005/013369 A1 | 2/2005 |
| WO | WO 2006/028128 A1 | 3/2006 |
| WO | WO 2015/049981 A1 | 4/2015 |
| WO | WO 2016/031922 A1 | 3/2016 |
| WO | WO 2016/056396 A1 | 4/2016 |

OTHER PUBLICATIONS

Ahn et al., Fabrication of a 50 nm half-pitch wire grid polarizer using nanoimprint lithography, Nanotechnolgy, Jul. 2005, vol. 16, No. 9, p. 1874, https://www.researchgate.net/publication/231087783_Fabrication_of_a_50_nm_half-pitch_wire_grid_polarizer_using_nanoimprint_lithography, retrieved Mar. 27, 2017.

Catrysse et al., Itegrated color pixels in 0.18-microm complementary metal oxide semiconductor technolgy, J. Opt. Soc. Am. A, Dec. 2003, vol. 20, No. 12, pp. 2293-2306.

Goldsmith, P.F., Quasioptical Frequency Selective Components, Planar Structures, In: Quasioptical Systems: Gaussian Beam Quasioptical Propogation and Applications, 1998, Chapter 9:242-251.

International Written Opinion dated Feb. 27, 2018 in connection with International Application No. PCT/JP2017/044625, and English translation thereof.

International Preliminary Report on Patentability dated Jun. 27, 2019 in connection with International Application No. PCT/JP2017/044625, and English translation thereof.

Extended European Search Report dated Apr. 20, 2020 in connection with European Application No. 17882045.2.

Japanese Office Action dated Jul. 17, 2020 in connection with Japanese Application No. 2016-241252, and English translation thereof.

* cited by examiner

| W1 | MS1 | W2 | MS2 |
|---|---|---|---|
| MS3 | W3 | MS4 | W4 |
| W5 | MS5 | W6 | MS6 |
| MS7 | W7 | MS8 | W8 |

| G1 | R1 | G2 | R2 |
|----|----|----|----|
| B1 | MS1 | B2 | MS2 |
| G3 | R3 | G4 | R4 |
| B3 | MS3 | B4 | MS4 |

| G1 | R1 | G2 | R2 |
|----|----|----|----|
| B1 | G3 | B2 | G4 |
| G5 | R3 | MS1 | MS2 |
| B3 | G6 | MS3 | MS4 |

| R1 | G1 | R2 | G2 | R3 | G3 |
|---|---|---|---|---|---|
| G4 | B1 | G5 | B2 | G6 | B3 |
| R4 | G7 | R5 | MS1 | MS2 | G8 |
| G9 | B4 | G10 | MS3 | MS4 | B5 |
| R6 | G11 | R7 | G12 | R8 | G13 |
| G14 | B6 | G15 | B7 | G16 | B8 |

FIG. 37

| G1 | W1 | G2 | W2 |
|---|---|---|---|
| W3 | B1 | W4 | R1 |
| G3 | MS1 | G4 | W6 |
| W7 | R2 | W8 | B2 |

FIG. 40

| OBJECT TO BE DETECTED | ITEM TO BE DETECTED | PEAK WAVELENGTH | HALF BANDWIDTH |
|---|---|---|---|
| MYOGLOBIN | UMAMI | 580-630nm | 30-50nm |
| OLEIC ACID | FRESHNESS | 970nm | 50-100nm |
| CHLOROPHYLL | FRESHNESS | 650-700nm | 50-100nm |

FIG. 41

| FRUITS | OBJECT TO BE DETECTED | ITEM TO BE DETECTED | PEAK WAVELENGTH | HALF BANDWIDTH |
|---|---|---|---|---|
| MELON RAIDEN | SUGAR CONTENT | PULP OPTICAL PATH LENGTH | 880nm | 20~30nm |
| | | SUCROSE | 910nm | 40~50nm |
| MELON RAIDEN RED | SUGAR CONTENT | SUCROSE | 915nm | 40~50nm |
| | | WATER | 955nm | 20~30nm |
| APPLE | SUGAR CONTENT | SUCROSE | 912nm | 40~50nm |
| | WATER | WATER | 844nm | 30nm |
| MIKAN | SUGAR CONTENT | SUCROSE | 914nm | 40~50nm |

FIG. 42

| OBJECT TO BE DETECTED | PEAK WAVELENGTH | HALF BANDWIDTH |
|---|---|---|
| PET | 1669nm | 30~50nm |
| PS | 1688nm | 30~50nm |
| PE | 1735nm | 30~50nm |
| PVC | 1716~1726nm | 30~50nm |
| PP | 1716~1735nm | 30~50nm |

IMAGING DEVICE AND ELECTRONIC APPARATUS

CROSS-REFERENCE TO RELATED APPLICATIONS

This application claims the benefit under 35 U.S.C. § 371 as a U.S. National Stage Entry of International Application No. PCT/JP2017/044625, filed in the Japanese Patent Office as a Receiving Office on Dec. 12, 2017, which claims priority to Japanese Patent Application Number JP2016-241252, filed in the Japanese Patent Office on Dec. 13, 2016, each of which is hereby incorporated by reference in its entirety.

TECHNICAL FIELD

The present technology relates to an imaging device and an electronic apparatus, and for example, an imaging device capable of selectively taking out only an electromagnetic component with a specific wavelength and generating an image with a plurality of colors, and an electronic apparatus.

BACKGROUND ART

In recent years, electronic devices for shooting an object by an imaging device to be an image, such as digital still camera or camcorder, have increased. Imaging devices such as charge coupled device (CCD) image sensor or complementary metal oxide semiconductor (CMOS) image sensor are currently available. Additionally, these imaging devices will be collectively denoted as image sensor below. An image sensor has a wide range of sensitivity from visible wavelength to near-infrared wavelength.

However, an image sensor cannot discriminate color information unlike human eyes, and for example, cannot discriminate a red color from a blue color. Thus, a conventional image sensor is configured such that a color filter for transmitting only an electromagnetic wave with a specific wavelength such as red (R), green (G), blue (B), or complementary colors (cyan (Cy), magenta (Mg), yellow (Ye), and green (G)) is formed in front of each pixel. By use of such a conventional image sensor, intensity information of each color is obtained from the intensity of a transmitted light and a signal processing or the like is performed on the intensity information of each color thereby to perform color imaging.

An organic material such as pigment or dye is used for the color filters employed in such a conventional image sensor in many cases. However, bond energy of molecules including carbon or hydrogen, which are components of the color filters, is as high as ultraviolet energy. Therefore, if the color filters are irradiated with a high-energy light for a long time, the carbon bond or the carbon-hydrogen bond can be broken. Because of this, the transmission characteristics of the color filters change due to the long-time use outdoors to be exposed to a sunlight including ultraviolet ray, or due to the use in an environment with particularly-strong ultraviolet ray, for example. Consequently, the characteristics of color reproduction of a shot image can be deteriorated.

Thus, color filters using inorganic material or photonic crystal have been increasingly put to practical use (See Patent Documents 1 and 2, for example). Furthermore, color filters denoted as wire grid or metallic optical filter have been used (see Non-Patent Documents 1 to 3, for example).

CITATION LIST

Patent Document

Patent Document 1: Re-publication of PCT International Publication No. 2006/028128
Patent Document 2: Re-publication of PCT International Publication No. 2005/013369

Non-Patent Document

Non-Patent Document 1: Quasioptical Systems, Paul F. Goldsmith, IEEE Press, ISBN 0-7803-3439-6
Non-Patent Document 2: J. Opt. Soc. Am. A, P. B. Catrysse & B. A. Wandell, Vol. 20, No. 12, December 2003, p. 2293-2306
Non-Patent Document 3: Nanotechnology, Seh-Won Ahn et al., Vol. 16, 1874-1877, 2005 (LG)

SUMMARY OF THE INVENTION

Problems to be Solved by the Invention

A technology for selectively taking out only an electromagnetic component with a specific wavelength is requested to be realized in an image sensor in a physically and chemically stable manner and at low cost. However, the conventional color filters including Patent Documents 1 and 2 and Non-Patent Documents 2 to 3 cannot sufficiently meet such a request.

The present invention has been made in terms of such a situation, and is directed to selectively taking out a specific electromagnetic wavelength and to generating an image with a plurality of colors.

Solutions to Problems

An imaging device according to one aspect of the present technology includes a first pixel including a metallic thin film filter configured to transmit a light in a first frequency band, and a second pixel including a color filter configured to transmit a light in a second frequency band wider than the first frequency band.

An electronic apparatus according to one aspect of the present technology includes an imaging device, and a signal processing part configured to process a signal output from the imaging device, in which the imaging device includes a first pixel including a metallic thin film filter configured to transmit a light in a first frequency band, and a second pixel including a color filter configured to transmit a light in a second frequency band wider than the first frequency band.

An imaging device according to one aspect of the present technology is provided with a first pixel including a metallic thin film filter configured to transmit a light in a first frequency band, and a second pixel including a color filter configured to transmit a light in a second frequency band wider than the first frequency band.

An electronic apparatus according to one aspect of the present technology includes the imaging device.

Additionally, the electronic apparatus may be an independent apparatus, or may be an internal block configuring one apparatus.

Effects of the Invention

According to one aspect of the present technology, it is possible to selectively take out a specific electromagnetic wavelength and to generate an image with a plurality of colors.

Additionally, the effects described herein are not necessarily restrictive, and any of the effects described in the present disclosure may be obtained.

BRIEF DESCRIPTION OF DRAWINGS

FIG. 34 is a diagram for explaining other color arrangement including multispectral pixels.

FIG. 35 is a diagram for explaining other color arrangement including multispectral pixels.

FIG. 36 is a diagram for explaining other color arrangement including multispectral pixels.

FIG. 37 is a diagram for explaining other color arrangement including multispectral pixels.

FIG. 40 is a diagram illustrating exemplary detection bands in a case where umami or freshness of food is detected.

FIG. 41 is a diagram illustrating exemplary detection bands in a case where sugar content or water of a fruit is detected.

FIG. 42 is a diagram illustrating exemplary detection bands in a case where plastics are classified.

MODE FOR CARRYING OUT THE INVENTION

Modes for carrying out the present technology (denoted as embodiment below) will be described below.

FIRST EMBODIMENT

A first embodiment of the present technology will be first described with reference to FIG. 1 to FIG. 22.

<Exemplary Configuration of Shooting Apparatus>

Figure 1:
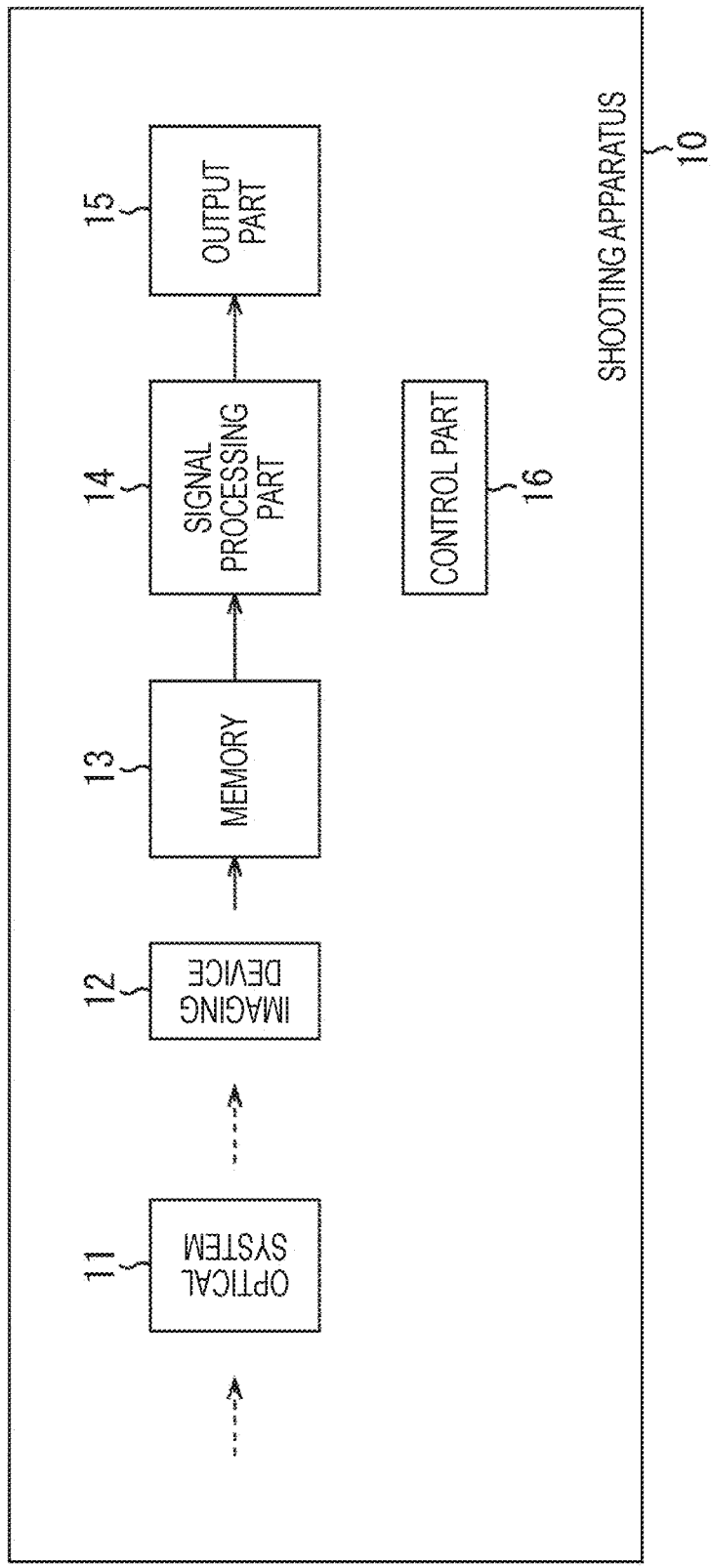
FIG. 1 is a block diagram illustrating one embodiment of a shooting apparatus according to the present technology.

FIG. 1 is a block diagram illustrating one embodiment of a shooting apparatus as a kind of electronic apparatus according to the present technology.

A shooting apparatus 10 of FIG. 1 is configured of a digital camera capable of shooting both a still image and a moving picture, for example. Further, the shooting apparatus 10 is configured of a multispectral camera capable of detecting lights (multispectral) in four or more wavelength bands (four bands or more) more than the conventional three wavelength bands (three bands) of R (red), G (green), and B (blue) or Y (yellow), M (magenta), and C (cyan) based on the three primary colors or the color-matching function, for example.

The shooting apparatus 10 includes an optical system 11, an imaging device 12, a memory 13, a signal processing part 14, an output part 15, and a control part 16.

The optical system 11 includes a zoom lens, a focus lens, a diaphragm, and the like (not illustrated), for example, and puts a light from the outside into the imaging device 12. Further, the optical system 11 is provided with various filters such as polarization filter as needed.

The imaging device 12 is configured of a complementary metal oxide semiconductor (CMOS) image sensor, for example. The imaging device 12 receives an incident light from the optical system 11, photoelectrically converts it, and outputs image data corresponding to the incident light.

The memory 13 temporarily stores the image data output by the imaging device 12.

The signal processing part 14 performs signal processings (for example, processings such as noise cancellation and white balance adjustment) on the image data stored in the memory 13, and supplies the processed image data to the output part 15.

The output part 15 outputs the image data from the signal processing part 14. For example, the output part 15 has a display (not illustrated) configured of liquid crystal or the like, and displays a spectrum (image) corresponding to the image data from the signal processing part 14 as a through image. For example, the output part 15 includes a driver (not illustrated) for driving a recording medium such as semiconductor memory, magnetic disc, or optical disc, and records the image data from the signal processing part 14 into the recording medium. For example, the output part 15 functions as a communication interface for making communication with an external apparatus (not illustrated), and transmits the image data from the signal processing part 14 to an external apparatus in a wireless or wired manner.

The control part 16 controls each part in the shooting apparatus 10 in response to a user operation or the like.

<Exemplary Configuration of Circuits in Imaging Device>

Figure 2:
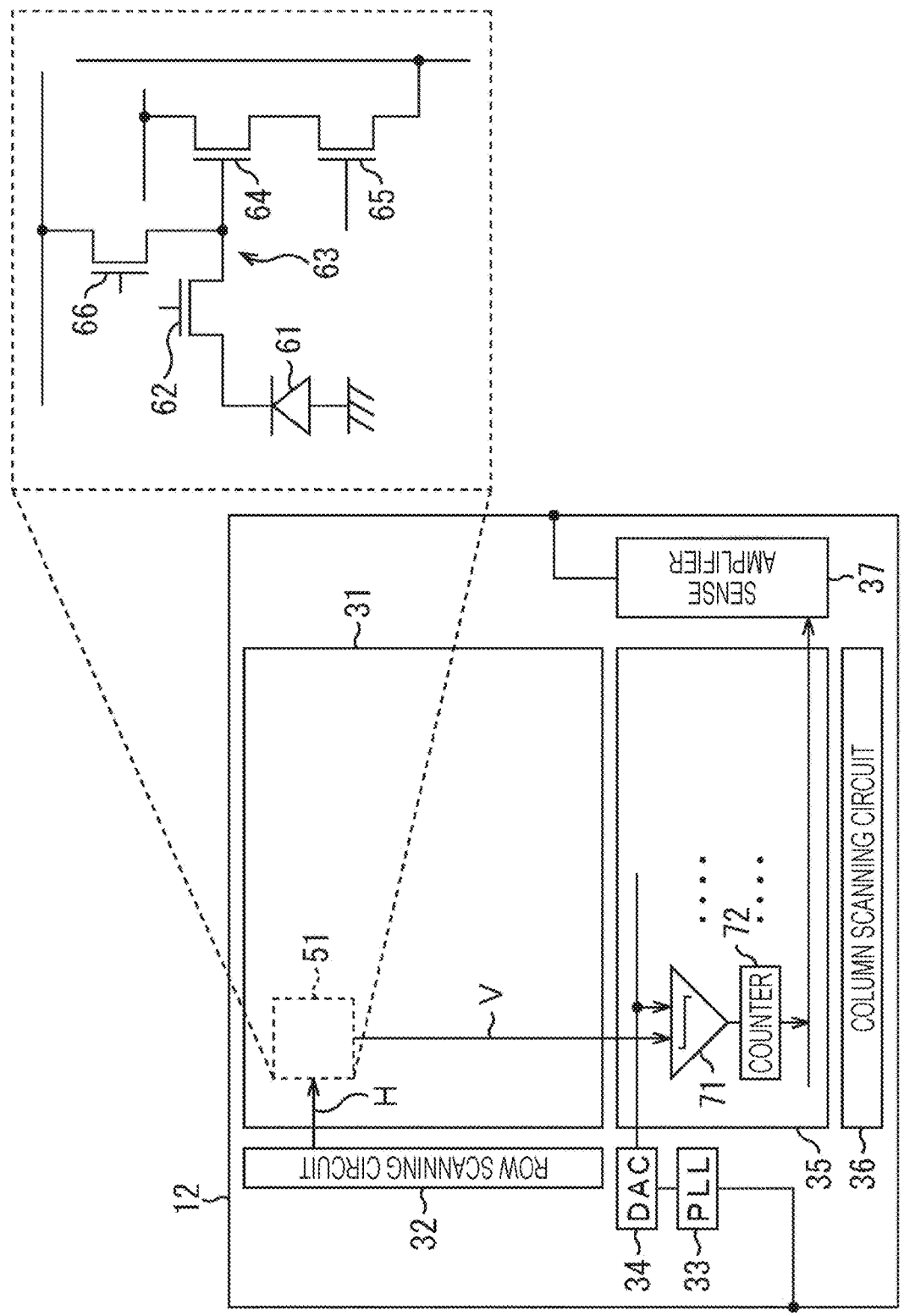
FIG. 2 is a block diagram illustrating an exemplary configuration of circuits in an imaging device.

FIG. 2 is a block diagram illustrating an exemplary configuration of circuits in the imaging device 12 of FIG. 1.

The imaging device 12 includes a pixel array 31, a row scanning circuit 32, a phase locked loop (PLL) 33, a digital analog converter (DAC) 34, a column analog digital converter (ADC) circuit 35, a column scanning circuit 36, and a sense amplifier 37.

A plurality of pixels 51 are two-dimensionally arranged in the pixel array 31.

The pixels 51 are arranged at the points where horizontal signal lines H connected to the row scanning circuit 32 and vertical signal lines V connected to the column ADC circuit 35 cross each other, and each of them includes a photodiode 61 for performing photoelectric conversion and some kinds of transistors for reading an accumulated signal. That is, a pixel 51 includes the photodiode 61, a transfer transistor 62, floating diffusion 63, an amplification transistor 64, a selection transistor 65, and a reset transistor 66 as enlarged on the right of FIG. 2.

Charges accumulated in the photodiode 61 are transferred to the floating diffusion 63 via the transfer transistor 62. The floating diffusion 63 is connected to a gate of the amplification transistor 64. When a signal of a pixel 51 is to be read, the selection transistor 65 is turned on from the row scanning circuit 32 via the horizontal signal line H, and the amplification transistor 64 is source follower driven so that the signal of the selected pixel 51 is read to the vertical signal line V as a pixel signal corresponding to the amount of accumulated charges in the photodiode 61. Further, the reset transistor 66 is turned on so that the pixel signal is reset.

The row scanning circuit 32 sequentially outputs a drive signal for driving (transferring, selecting, resetting, and the like, for example) the pixels 51 in the pixel array 31 per row.

The PLL 33 generates and outputs a clock signal with a predetermined frequency required for driving each part in the imaging device 12 on the basis of a clock signal supplied from the outside.

The DAC 34 generates and outputs a lamp signal in a form (substantially saw-like form) in which a voltage lowers from a predetermined voltage value at a certain tilt and then returns to the predetermined voltage value.

The column ADC circuit 35 has as many comparators 71 and counters 72 as the columns of the pixels 51 in the pixel array 31, extracts signal levels of pixel signals output from the pixels 51 in response to the correlated double sampling (CDS) operation, and outputs image data. That is, the comparator 71 compares the lamp signal supplied from the DAC 34 with the pixel signal (luminance value) output from the pixel 51, and supplies the counter 72 with a resultant comparison result signal. The counter 72 then counts a counter clock signal with a predetermined frequency in response to the comparison result signal output from the comparator 71 so that the pixel signal is A/D converted.

The column scanning circuit 36 supplies the counters 72 in the column ADC circuit 35 with signals for sequentially outputting pixel data at predetermined timings.

The sense amplifier 37 amplifies the pixel data supplied from the column ADC circuit 35, and outputs it outside the imaging device 12.

<First Embodiment of Imaging Device>

Figure 3:
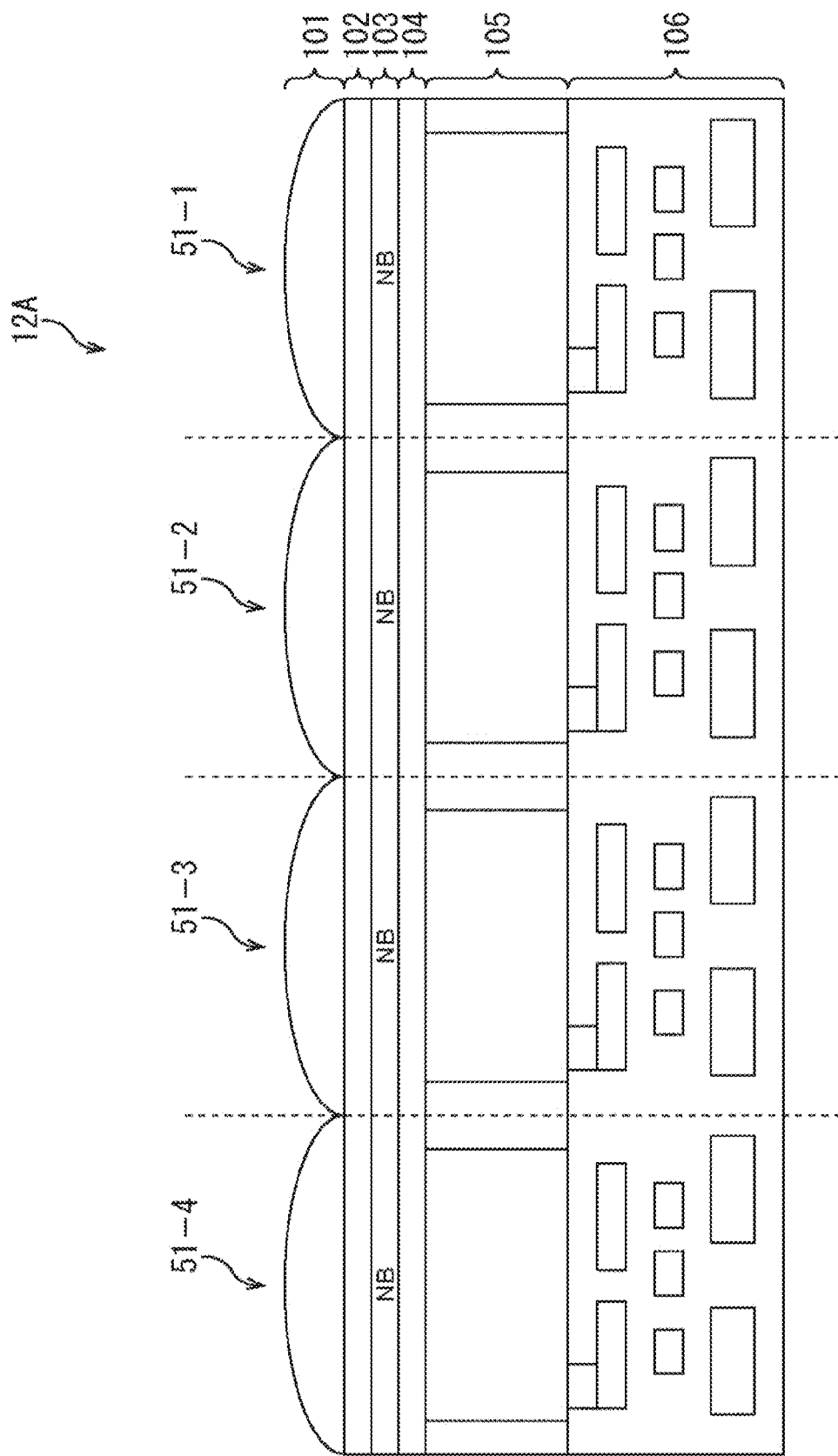
FIG. 3 is a cross-section view schematically illustrating an exemplary configuration of a first embodiment of the imaging device.

FIG. 3 schematically illustrates an exemplary cross-section configuration of an imaging device 12A as a first embodiment of the imaging device 12 of FIG. 1. FIG. 3 illustrates the cross section of four pixels including pixel 51-1 to pixel 51-4 in the imaging device 12. Additionally, in a case where the pixel 51-1 to the pixel 51-4 do not need to be individually discriminated, they will be simply denoted as pixel 51 below.

An on-chip microlens 101, an interlayer film 102, a narrowband filter layer 103, an interlayer film 104, a photoelectric conversion device layer 105, and a signal wiring layer 106 are laminated from the top in each pixel 51. That is, the imaging device 12 is configured of a CMOS image sensor of backside irradiation type in which the photoelectric conversion device layer 105 is arranged closer to the light incident side than the signal wiring layer 106.

The on-chip microlens 101 is an optical device for condensing a light to the photoelectric conversion device layer 105 in each pixel 51.

The interlayer film 102 and the interlayer film 104 include dielectric such as SiO2. As described below, it is desirable that the dielectric constants of the interlayer film 102 and the interlayer film 104 are as low as possible.

The narrowband filter layer 103 is provided with a narrowband filter NB as an optical filter for transmitting a narrowband light in a predetermined narrow wavelength band (narrowband) in each pixel 51. For example, a plasmon filter using surface plasmon, which is a kind of metallic thin film filter using a thin film including metal such as aluminum, is used for the narrowband filter NB. Further, the transmission band of the narrowband filter NB is set per pixel 51. The kinds of transmission bands (the number of bands) of the narrowband filter NB are arbitrary, and are set at four or more, for example.

Here, the narrowband is a wavelength band narrower than the transmission bands of the conventional color filters of R (red), G (green), and B (blue), or Y (yellow), M (magenta), and C (cyan) based on the three primary colors or the color-matching function, for example. Further, a pixel which receives a narrowband light transmitting through the narrowband filter NB will be denoted as multispectral pixel or MS pixel below.

The photoelectric conversion device layer 105 includes the photodiode 61 and the like of FIG. 2, for example, receives a light (narrowband light) transmitting through the narrowband filter layer 103 (the narrowband filter NB) and converts the received light into a charge. Further, the photoelectric conversion device layer 105 is configured such that the respective pixels 51 are electrically separated by the device separation layers.

The signal wiring layer 106 is provided with a wiring or the like for reading the charges accumulated in the photoelectric conversion device layer 105.

<Plasmon Filter>

A plasmon filter capable of being used for the narrowband filter NB will be described below with reference to FIG. 4 to FIG. 15.

Figure 4:
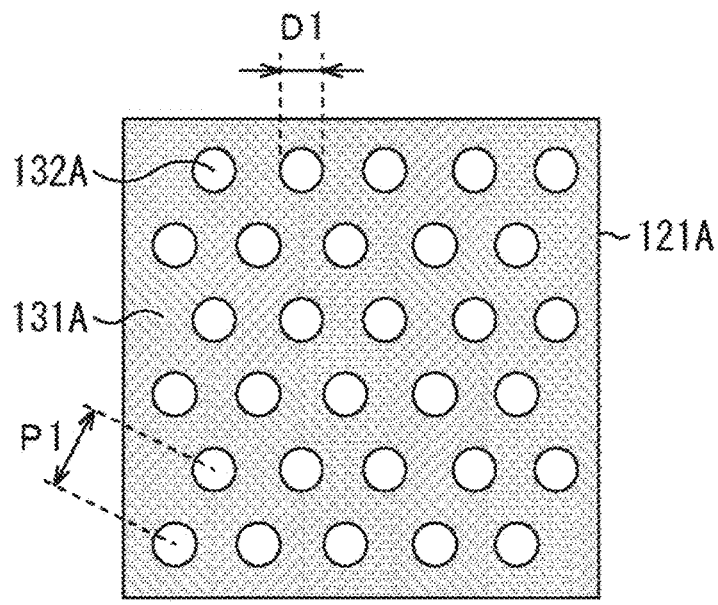
FIG. 4 is a diagram illustrating an exemplary configuration of a plasmon filter in a hole array structure.

FIG. 4 illustrates an exemplary configuration of a plasmon filter 121A in a hole array structure.

The plasmon filter 121A is configured of a plasmon resonator in which holes 132A are arranged in a metallic thin film (denoted as conductive thin film below) 131A in a honeycomb shape.

Each hole 132A penetrates through the conductive thin film 131A, and operates as a waveguide. Generally, a cutoff frequency and a cutoff wavelength, which are determined depending on the shape such as the lengths of the sides or the diameter, are present for the waveguide, and the waveguide has the nature that it does not propagate a light with a frequency less than or equal to the cutoff frequency (a wavelength more than or equal to the cutoff wavelength). The cutoff wavelength of the hole 132A mainly depends on an opening diameter D1, and as the opening diameter D1 is smaller, the cutoff wavelength is also shorter. Additionally, the opening diameter D1 is set to be smaller than the wavelength of a light to be transmitted.

On the other hand, when a light is incident into the conductive thin film 131A in which the holes 132A are periodically formed at a shorter cycle than the wavelength of the light, there occurs a phenomenon that a light with a longer wavelength than the cutoff wavelength of the holes 132A transmits. The phenomenon is denoted as plasmon abnormal transmission phenomenon. The phenomenon occurs when surface plasmon is excited on the border between the conducive thin film 131A and the interlayer film 102 arranged thereon.

The conditions under which the plasmon abnormal transmission phenomenon (surface plasmon resonance) occurs will be described herein with reference to FIG. 5.

Figure 5:
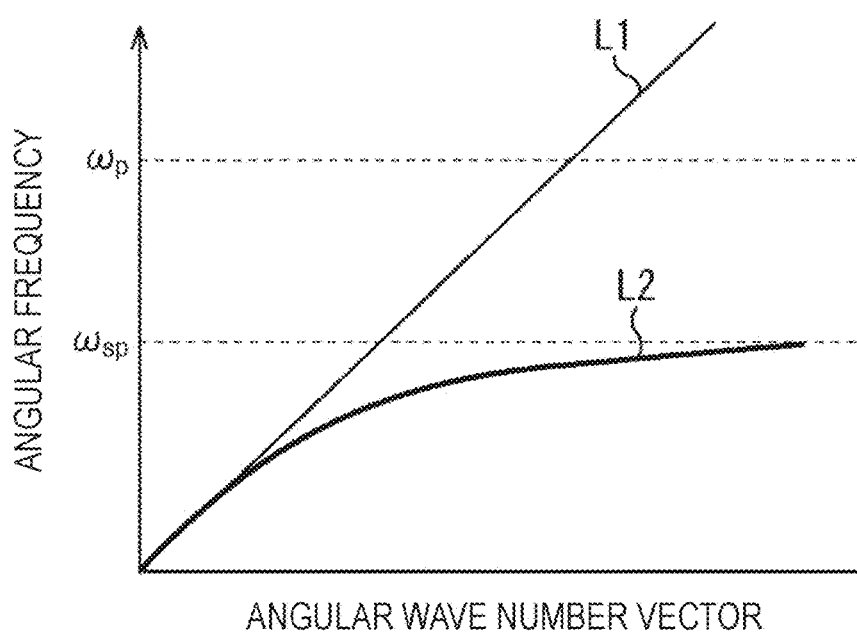
FIG. 5 is a graph illustrating a dispersion relationship of surface plasmon.

FIG. 5 is a graph illustrating a dispersion relationship of the surface plasmon. The horizontal axis in the graph indicates an angular wave number vector k and the vertical axis indicates an angular frequency $\omega$. $\omega_p$ indicates a plasma frequency of the conductive thin film 131A. $\omega_{sp}$ indicates a surface plasma frequency on the border face between the interlayer film 102 and the conductive thin film 131A, and is expressed in the following Equation (1).

[Math. 1]

$$\omega_{sp} = \frac{\omega_p}{\sqrt{1+\varepsilon_d}} \tag{1}$$

$\varepsilon_d$ indicates a dielectric constant of the dielectric configuring the interlayer film 102.

In Equation (1), the surface plasma frequency $\omega_{sp}$ is higher as the plasma frequency $\omega_p$ is higher. Further, the surface plasma frequency $\omega_{sp}$ is higher as the dielectric constant $\varepsilon_d$ is lower.

The line L1 indicates a dispersion relationship of light (light line), and is expressed in the following Equation (2).

[Math. 2]

$$\omega = \frac{c}{\sqrt{\varepsilon_d}}k \tag{2}$$

c indicates a light speed.

The line L2 indicates a dispersion relationship of surface plasmon, and is expressed in the following Equation (3).

[Math. 3]

$$\omega = ck\sqrt{\frac{\varepsilon_m + \varepsilon_d}{\varepsilon_m \varepsilon_d}} \tag{3}$$

$\varepsilon_m$ indicates a dielectric constant of the conductive thin film 131A.

The dispersion relationship of surface plasmon indicated by the line L2 asymptotically approaches the light line indicated by the line L1 in a range where the angular wave number vector k is small, and asymptotically approaches the surface plasma frequency $\omega_{sp}$ as the angular wave number vector k is larger.

Then, when the following Equation (4) is established, the plasmon abnormal transmission phenomenon occurs.

[Math. 4]

$$\operatorname{Re}\left[\frac{\omega_{sp}}{c}\right] = \sqrt{\frac{\varepsilon_m \varepsilon_d}{\varepsilon_m + \varepsilon_d}} = \left|\frac{2\pi}{\lambda}\sin\theta + iG_x + jG_y\right| \tag{4}$$

$\lambda$ indicates a wavelength of an incident light. $\theta$ indicates an incident angle of an incident light. $G_x$ and $G_y$ are expressed in the following Equation (5).

$$|G_x|=|G_y|=2\pi/a_0 \tag{5}$$

$a_0$ indicates a lattice constant of the hole array structure configured of the holes 132A in the conductive thin film 131A.

The left side in Equation (4) indicates an angular wave number vector of surface plasmon, and the right side indicates an angular wave number vector of the hole array cycle of the conductive thin film 131A. Thus, when the angular wave number vector of surface plasmon equals to the angular wave number vector of the hole array cycle of the conductive thin film 131A, the plasmon abnormal transmission phenomenon occurs. Then, the value of $\lambda$ at this time is a plasmon resonance wavelength (transmission wavelength of the plasmon filter 121A).

Additionally, the angular wave number vector of surface plasmon in the left side of Equation (4) is determined by the dielectric constant $\varepsilon_m$ of the conductive thin film 131A and the dielectric constant $\varepsilon_d$ of the interlayer film 102. On the other hand, the angular wave number vector of the hole array cycle in the right side is determined by the light incident angle θ, and a pitch (hole pitch) P1 between adjacent holes 132A in the conductive thin film 131A. Thus, the resonance wavelength and the resonance frequency of plasmon are determined by the dielectric constant $\varepsilon_m$ of the conductive thin film 131A, the dielectric constant $\varepsilon_d$ of the interlayer film 102, the light incident angle θ, and the hole pitch P1. Additionally, in a case where the light incident angle is 0°, the resonance wavelength and the resonance frequency of plasmon are determined by the dielectric constant $\varepsilon_m$ of the conductive thin film 131A, the dielectric constant $\varepsilon_d$ of the interlayer film 102, and the hole pitch P1.

Therefore, the transmission band of the plasmon filter 121A (the resonance wavelength of plasmon) changes due to the material and film thickness of the conductive thin film 131A, the material and film thickness of the interlayer film 102, the pattern cycle of the hole array (the opening diameter D1 and the hole pitch P1 of the holes 132A, for example), and the like. Particularly in a case where the materials and film thicknesses of the conductive thin film 131A and the interlayer film 102 are determined, the transmission band of the plasmon filter 121A changes due to the pattern cycle of the hole array, particularly the hole pith P1. That is, the transmission band of the plasmon filter 121A shifts toward the shorter wavelength side as the hole pitch P1 is narrower, and the transmission band of the plasmon filter 121A shifts toward the longer wavelength side as the hole pitch P1 is wider.

Figure 6:
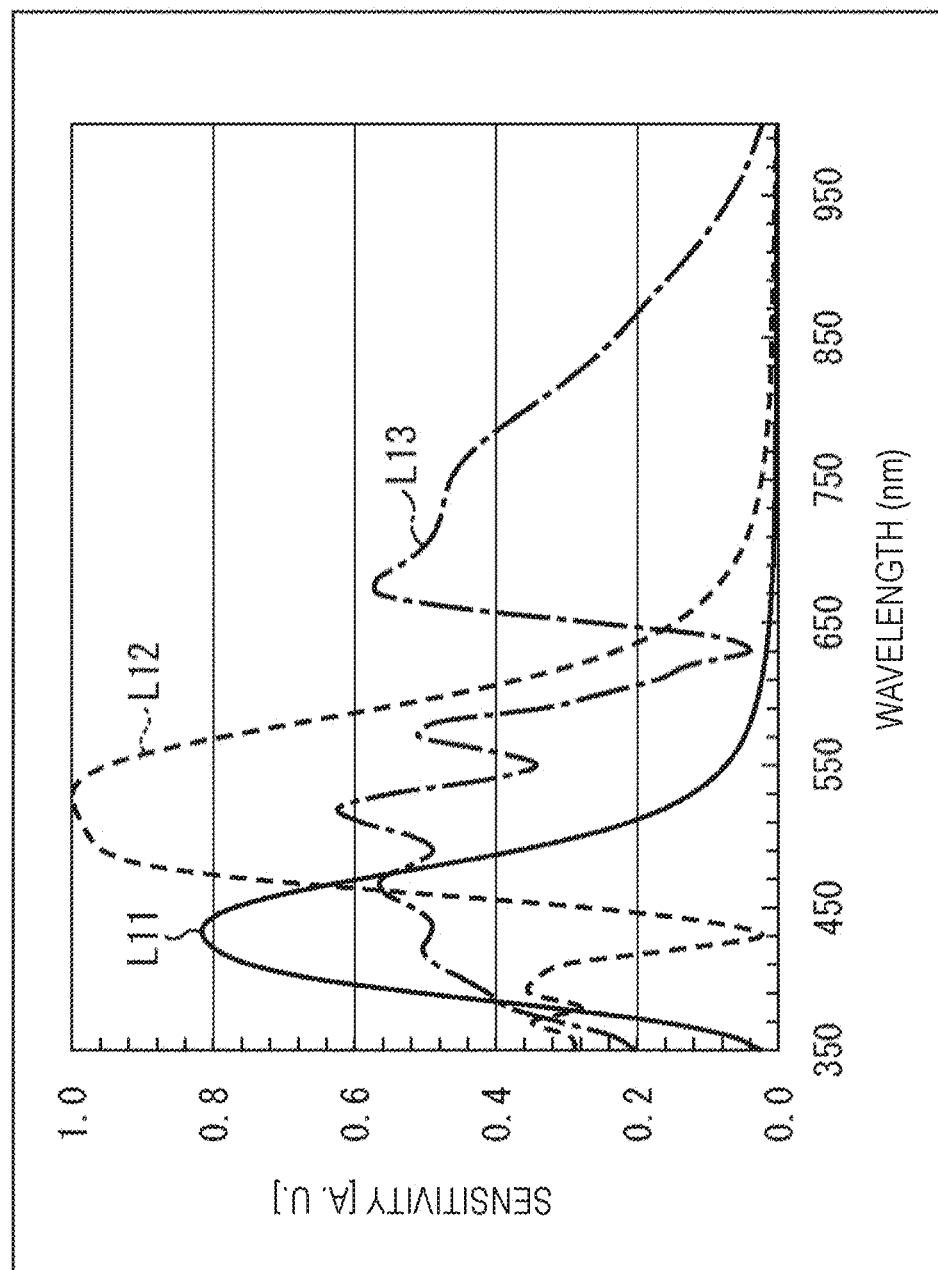
FIG. 6 is a graph illustrating a first example of spectroscopic characteristics of the plasmon filter in the hole array structure.

FIG. 6 is a graph illustrating exemplary spectroscopic characteristics of the plasmon filter 121A in a case where the hole pitch P1 is changed. The horizontal axis in the graph indicates a wavelength (nm) and the vertical axis indicates a sensitivity (arbitrary unit). The line L11 indicates spectroscopic characteristics in a case where the hole pitch P1 is set at 250 nm, the line L12 indicates spectroscopic characteristics in a case where the hole pitch P1 is set at 325 nm, and the line L13 indicates spectroscopic characteristics in a case where the hole pith P1 is set at 500 nm.

In a case where the hole pitch P1 is set at 250 nm, the plasmon filter 121A mainly transmits a light in the blue wavelength band. In a case where the hole pitch P1 is set at 325 nm, the plasmon filter 121A mainly transmits a light in the green wavelength band. In a case where the hole pitch P1 is set at 500 nm, the plasmon filter 121A mainly transmits a light in the red wavelength band. In a case where the hole pitch P1 is set at 500 nm, however, the plasmon filter 121A transmits more lights in lower wavelength bands than red due to the waveguide mode described below.

Figure 7:
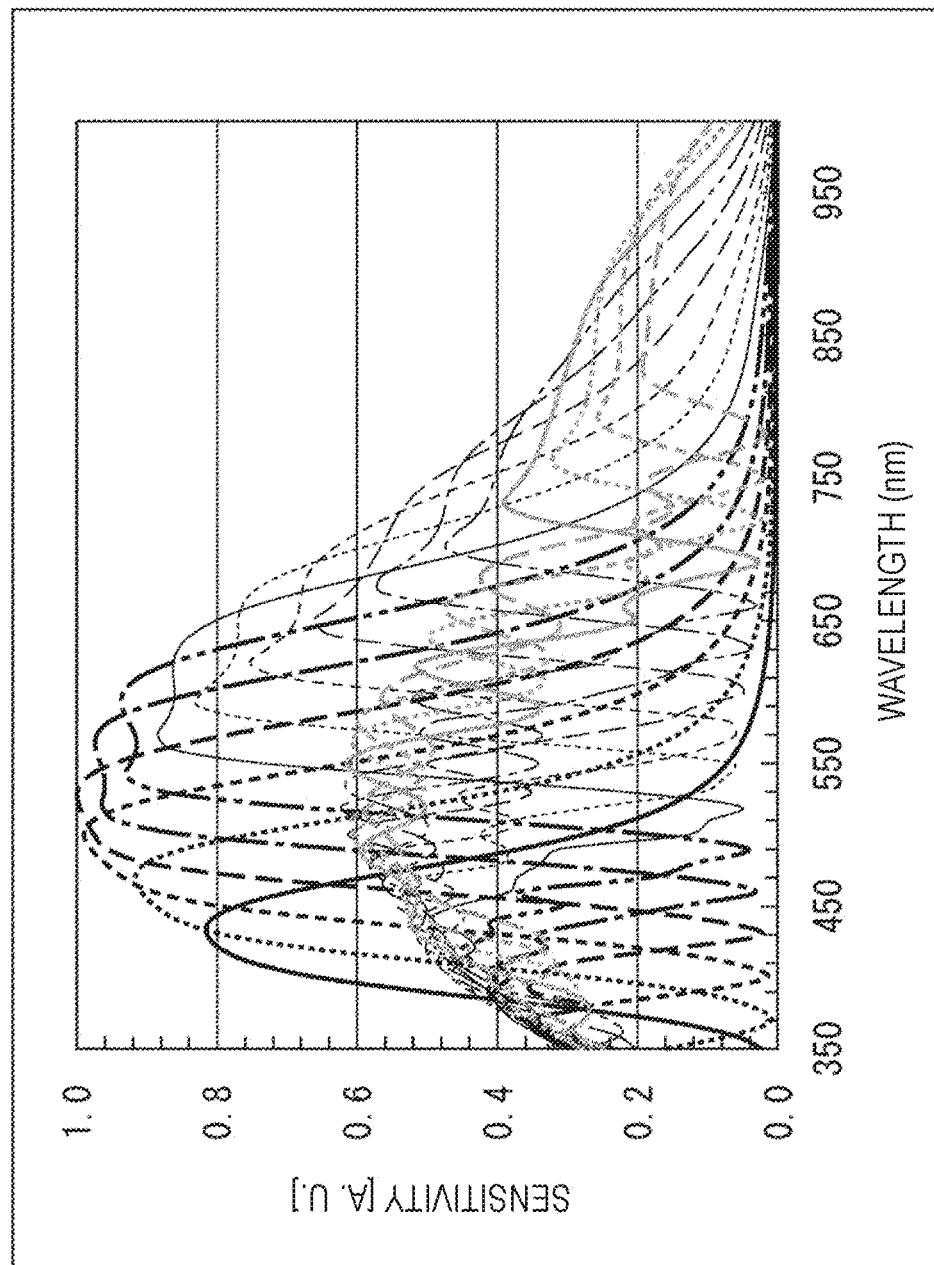
FIG. 7 is a graph illustrating a second example of the spectroscopic characteristics of the plasmon filter in the hole array structure.

FIG. 7 is a graph illustrating other exemplary spectroscopic characteristics of the plasmon filter 121A in a case where the hole pith P1 is changed. The horizontal axis in the graph indicates a wavelength (nm), and the vertical axis indicates a sensitivity (arbitrary unit). This example indicates exemplary spectroscopic characteristics of 16 kinds of plasmon filters 121A in a case where the hole pitch P1 is changed from 250 nm to 625 nm by 25 nm.

Additionally, the transmissivity of the plasmon filter 121A is mainly determined by the opening diameter D1 of the holes 132A. As the opening diameter D1 is larger, the transmissivity is higher while color mixture easily occurs. Generally, it is desirable that the opening diameter D1 is set such that the aperture is 50% to 60% of the hole pitch P1.

Further, as described above, each hole 132A in the plasmon filter 121A operates as a waveguide. Thus, not only the wavelength component transmitted due to surface plasmon resonance (the wavelength component in the plasmon mode) but also the wavelength component transmitting through the holes 132A (the wavelength component in the waveguide mode) may be larger in the spectroscopic characteristics depending on a pattern of the hole array of the plasmon filter 121A.

Figure 8:
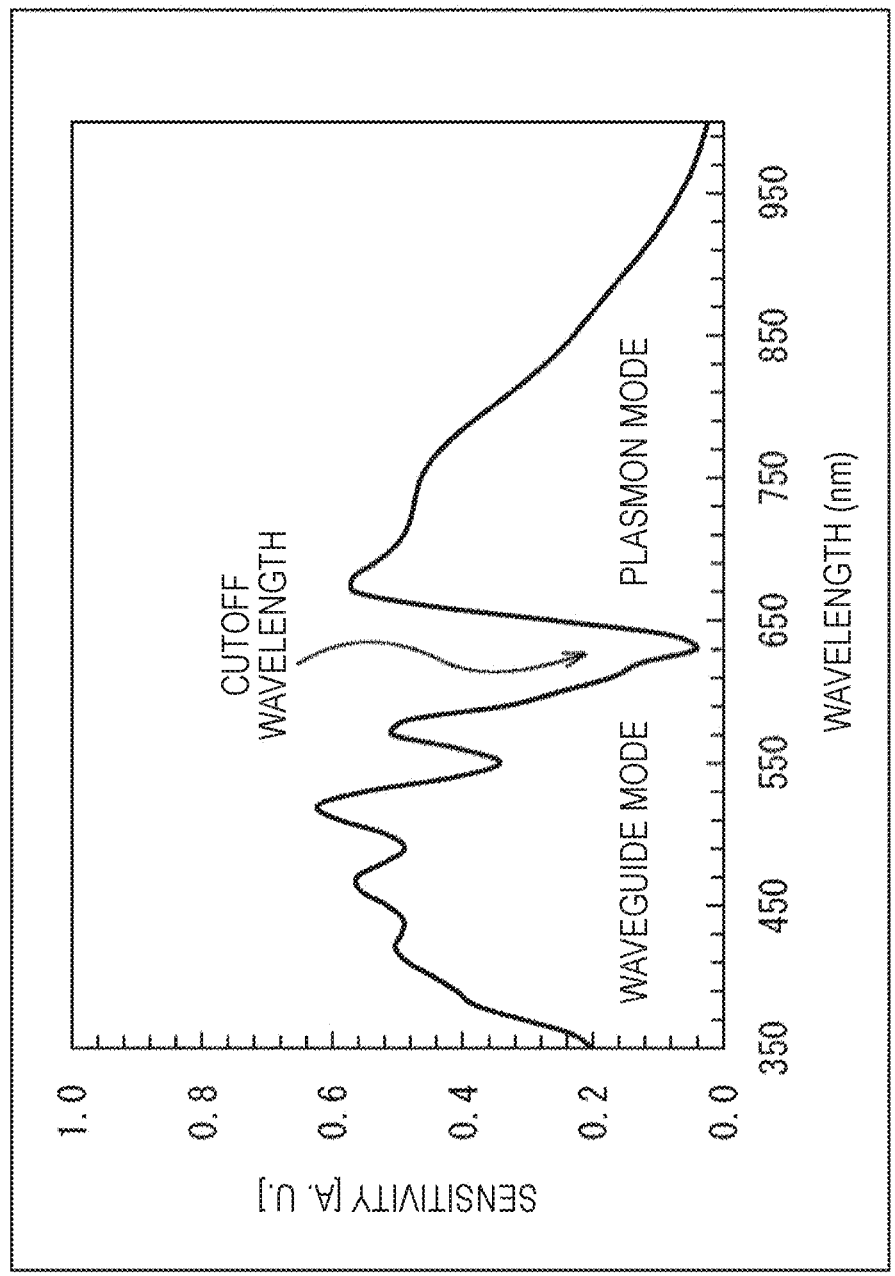
FIG. 8 is a graph illustrating a plasmon mode and a waveguide mode.

FIG. 8 illustrates spectroscopic characteristics of the plasmon filter 121A in a case where the hole pitch P1 is set at 500 nm similarly to the spectroscopic characteristics indicated by the line L13 of FIG. 6. In this example, a longer wavelength than the cutoff wavelength of around 630 nm is a wavelength component in the plasmon mode, and a shorter wavelength than the cutoff wavelength is a wavelength component in the waveguide mode.

As described above, the cutoff wavelength mainly depends on the opening diameter D1 of the holes 132A, and the cutoff wavelength is also shorter as the opening diameter D1 is shorter. Then, as a difference between the cutoff wavelength and a peak wavelength in the plasmon mode is made larger, the wavelength resolution characteristics of the plasmon filter 121A enhance.

Further, as described above, as the plasma frequency $\omega_p$ of the conductive thin film 131A is higher, the surface plasma frequency $\omega_{sp}$ of the conductive thin film 131A is higher. Further, as the dielectric constant $\varepsilon_d$ of the interlayer film 102 is lower, the surface plasma frequency $\omega_{sp}$ is higher. Then, as the surface plasma frequency $\omega_{sp}$ is higher, the plasmon resonance frequency can be set to be higher, and the transmission band (plasmon resonance wavelength) of the plasmon filter 121A can be set in a shorter wavelength band.

Thus, when a metal with the lower plasma frequency $\omega_p$ is used for the conductive thin film 131A, the transmission band of the plasmon filter 121A can be set in a shorter wavelength band. For example, aluminum, silver, gold, and the like are preferable. However, in a case where the transmission band is set in a longer wavelength band such as infrared ray, copper and the like can be used.

Further, when a dielectric with the lower dielectric constant $\varepsilon_d$ is used for the interlayer film 102, the transmission band of the plasmon filter 121A can be set in a shorter wavelength band. For example, SiO2, Low-K, and the like are preferable.

Figure 9:
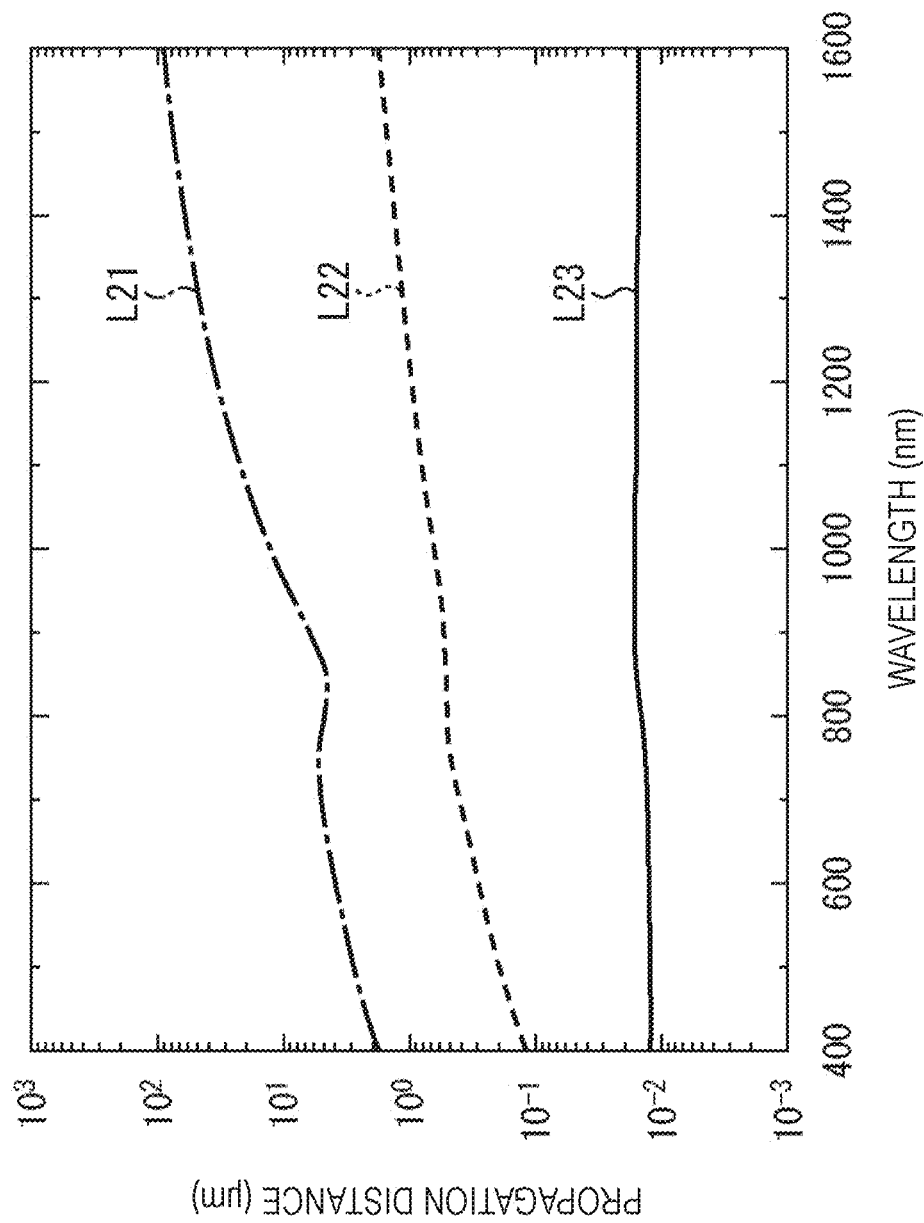
FIG. 9 is a graph illustrating exemplary propagation characteristics of the surface plasmon.

Further, FIG. 9 is a graph illustrating propagation characteristics of surface plasmon on the interface between the conductive thin film 131A and the interlayer film 102 in a case where aluminum is used for the conductive thin film 131A and SiO2 is used for the interlayer film 102. The horizontal axis in the graph indicates a light wavelength (nm), and the vertical axis indicates a propagation distance (μm). Further, the line L21 indicates propagation characteristics in the interface direction, the line L22 indicates propagation characteristics in the depth direction of the interlayer film 102 (in the direction vertical to the interface), and the line L23 indicates propagation characteristics in the depth direction of the conductive thin film 131A (in the direction vertical to the interface).

A propagation distance $\Lambda_{SPP}(\lambda)$ in the depth direction of the surface plasmon is expressed in the following Equation (6).

[Math. 5]

$$\Lambda_{SPP}(\lambda) \equiv \frac{4\pi k_{SPP}}{\lambda} = \frac{4\pi}{\lambda}\text{Im}\left[\sqrt{\frac{\varepsilon_m \varepsilon_d}{\varepsilon_m + \varepsilon_d}}\right] \quad (6)$$

$k_{SPP}$ indicates an absorption coefficient of a material propagated by the surface plasmon. $\varepsilon_m(\lambda)$ indicates a dielectric constant of the conductive thin film 131A relative to a light with a wavelength λ. $\varepsilon_d(\lambda)$ indicates a dielectric constant of the interlayer film 102 relative to the light with the wavelength λ.

Thus, as illustrated in FIG. 9, the surface plasmon relative to a light with a wavelength of 400 nm propagates down to about 100 nm in the depth direction from the surface of the interlayer film 102 including SiO2. Therefore, the thickness of the interlayer film 102 is set at 100 nm or more so that a material laminated on the opposite side to the conductive thin film 131A of the interlayer film 102 is prevented from influencing the surface plasmon on the interface between the interlayer film 102 and the conductive thin film 131A.

Further, the surface plasmon relative to the light with a wavelength of 400 nm propagates down to about 10 nm in the depth direction from the surface of the conductive thin film 131A including aluminum. Thus, the thickness of the conductive thin film 131A is set at 10 nm or more so that the interlayer film 104 is prevented from influencing the surface plasmon on the interface between the interlayer film 102 and the conductive thin film 131A.

<Other Exemplary Plasmon Filters>

Other exemplary plasmon filters will be described below with reference to FIG. 10 to FIG. 15.

Figure 10:
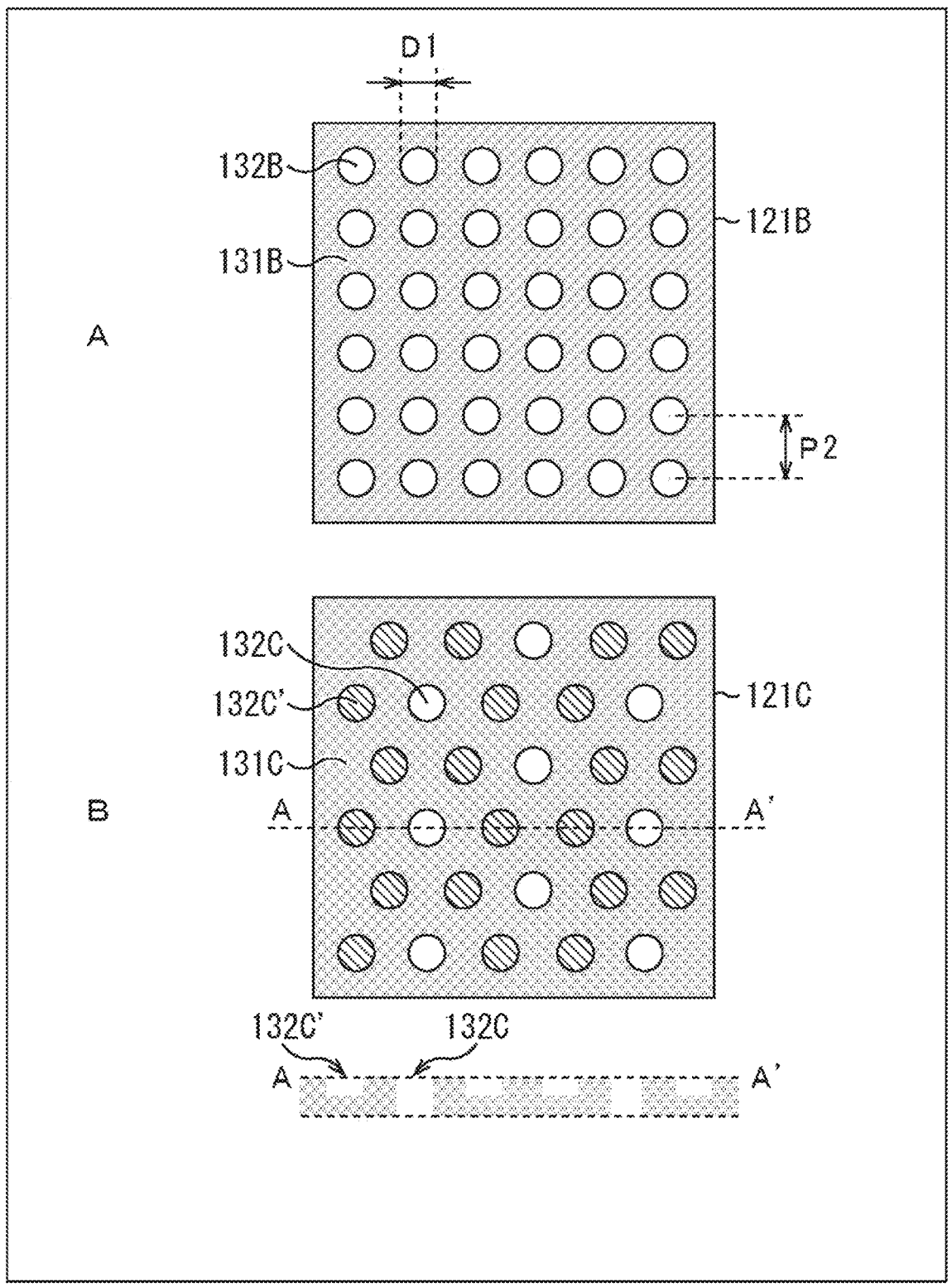
FIG. 10 is a diagram illustrating other exemplary configurations of the plasmon filter in the hole array structure.

A plasmon filter 121B in A of FIG. 10 is configured of a plasmon resonator in which holes 132B are arranged in a conductive thin film 131B in an orthogonal matrix shape. For example, the transmission band changes due to a pitch P2 between adjacent holes 132B in the plasmon filter 121B.

Further, all the holes do not need to penetrate through the conductive thin film in the plasmon resonator, and the plasmon resonator functions as a filter even if some holes are configured as non-through holes which do not penetrate through the conductive thin film.

For example, B of FIG. 10 illustrates a plan view and a cross-section view (cross-section view along A-A' in the plan view) of a plasmon filter 121C in which holes 132C as through holes and holes 132C' as non-through holes are arranged in a conductive thin film 131C in a honeycomb shape. That is, the holes 132C as through holes and the holes 132C' as non-through holes are periodically arranged in the plasmon filter 121C.

Further, the plasmon filter basically uses a single-layer plasmon resonator, but may be configured of a double-layer plasmon resonator, for example.

Figure 11:
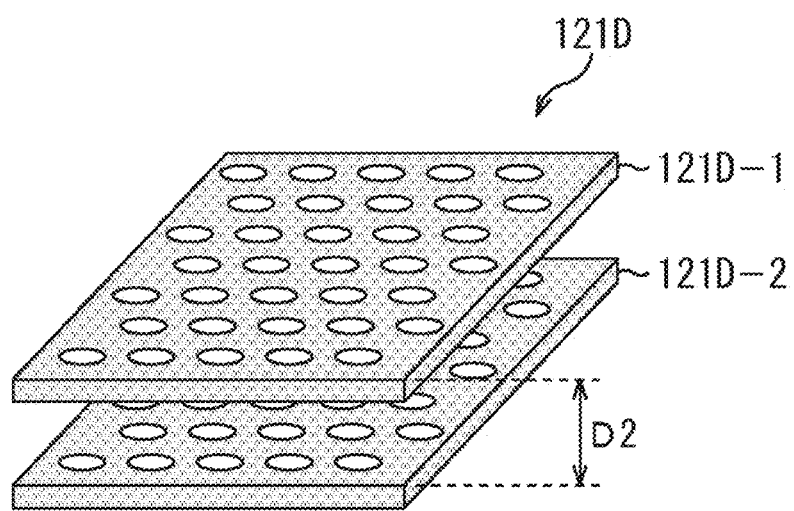
FIG. 11 is a diagram illustrating an exemplary configuration of a plasmon filter in a double-layer structure.

For example, a plasmon filter 121D illustrated in FIG. 11 is configured in two layers including a plasmon filter 121D-1 and a plasmon filter 121D-2. The plasmon filter 121D-1 and the plasmon filter 121D-2 are configured such that holes are arranged in a honeycomb shape similarly to the plasmon resonator configuring the plasmon filter 121A of FIG. 4.

Further, an interval D2 between the plasmon filter 121D-1 and the plasmon filter 121D-2 is preferably set at about ¼ of the peak wavelength of the transmission band. Further, the interval D2 is more preferably at ½ or less of the peak wavelength of the transmission band in consideration of a degree of freedom of design.

Additionally, as in the plasmon filter 121D, the holes may be arranged in the same pattern in the plasmon filter 121D-1 and the plasmon filter 121D-2, and additionally the holes may be arranged in the mutually similar patterns in the double-layer plasmon resonator structure, for example. Further, in the double-layer plasmon resonator structure, holes and dots may be arranged in a pattern in which the hole array structure and the dot array structure (described below) are inverted. Furthermore, the plasmon filter 121D is in the double-layer structure, but may be multilayered in three or more layers.

Further, the exemplary configurations of the plasmon filters configured of a plasmon resonator in a hole array structure have been described above, but a plasmon resonator in a dot array structure may be employed for the plasmon filter.

A plasmon filter in a dot array structure will be described with reference to FIG. 12.

Figure 12:
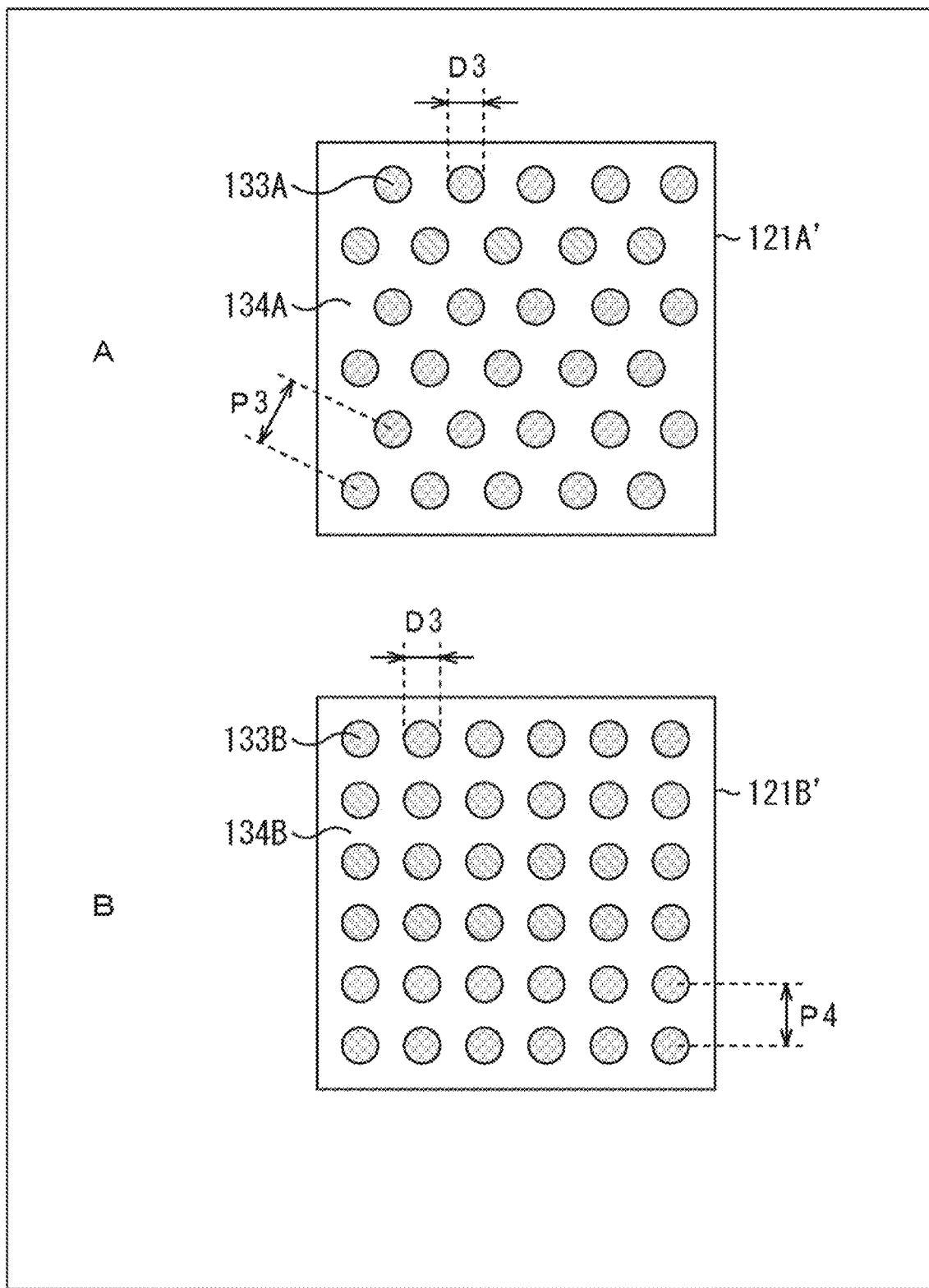
FIG. 12 is a diagram illustrating exemplary configurations of a plasmon filter in a dot array structure.

A plasmon filter 121A' in A of FIG. 12 is configured to be negative-positive inverted to the plasmon resonator of the plasmon filter 121A of FIG. 4, or is configured of a plasmon resonator in which dots 133A are arranged in a dielectric layer 134A in a honeycomb shape. The dielectric layer 134A is filled between the dots 133A.

The plasmon filter 121A' absorbs a light in a predetermined wavelength band, and thus is used as a complementary color-based filter. The wavelength band (denoted as absorption band below) of a light absorbed by the plasmon filter 121A' changes due to a pitch (denoted as dot pitch below) P3 between adjacent dots 133A, or the like. Further, a diameter D3 of the dots 133A is adjusted according to the dot pitch P3.

A plasmon filter 121B' in B of FIG. 12 is configured to be negative-positive inverted to the plasmon resonator of the plasmon filter 121B in A of FIG. 10, or is configured in a plasmon resonator structure in which dots 133B are arranged in a dielectric layer 134B in an orthogonal matrix shape. The dielectric layer 134B is filled between the dots 133B.

The absorption band of the plasmon filter 121B' changes due to a dot pitch P4 between adjacent dots 133B, or the like. Further, the diameter D3 of the dots 133B is adjusted according to the dot pitch P4.

Figure 13:
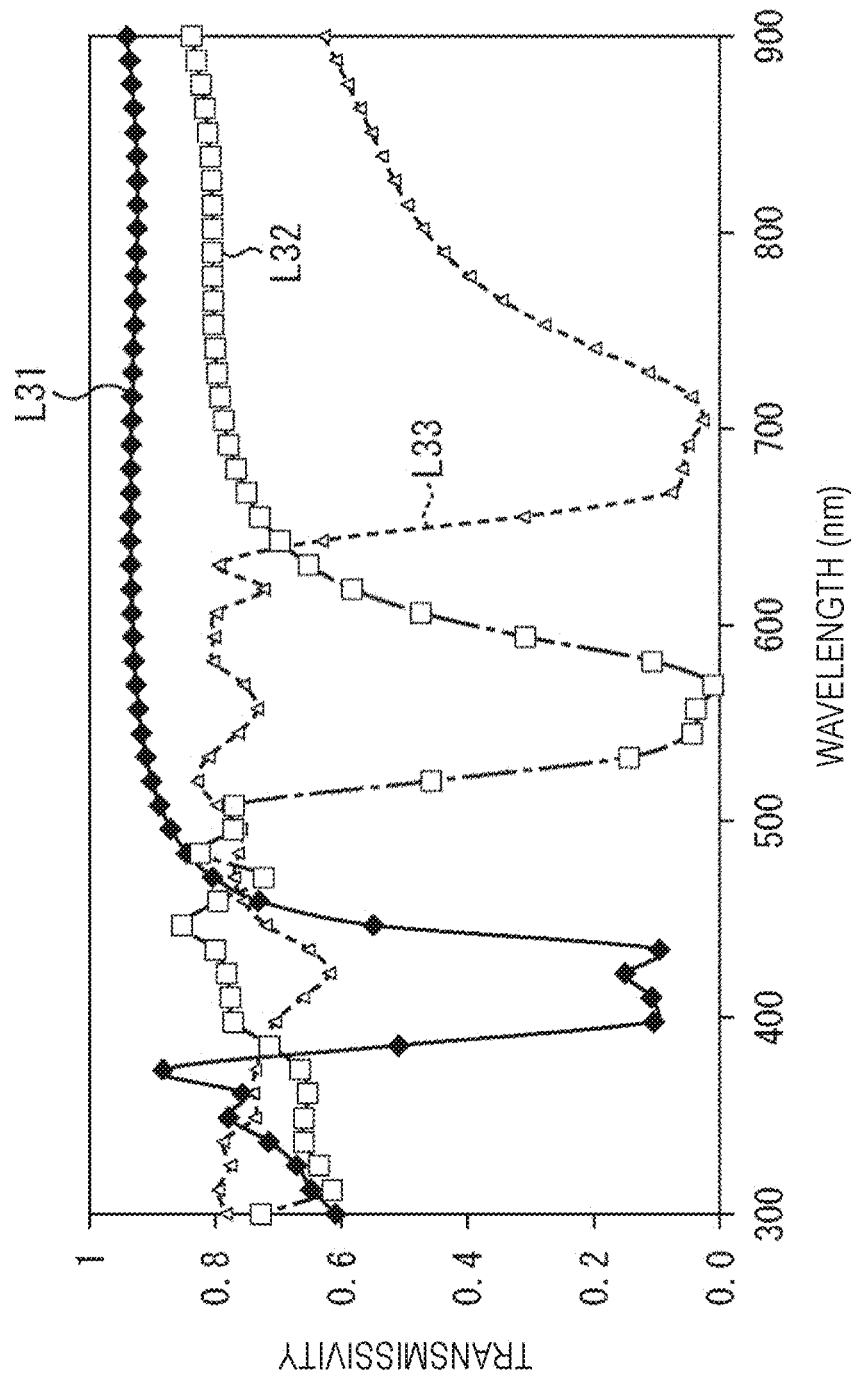
FIG. 13 is a graph illustrating exemplary spectroscopic characteristics of the plasmon filter in the dot array structure.

FIG. 13 is a graph illustrating exemplary spectroscopic characteristics in a case where the dot pitch P3 of the plasmon filter 121A' in A of FIG. 12 is changed. The horizontal axis in the graph indicates a wavelength (nm), and the vertical axis indicates a transmissivity. The line L31 indicates spectroscopic characteristics in a case where the dot pitch P3 is set at 300 nm, the line L32 indicates spectroscopic characteristics in a case where the dot pitch P3 is set at 400 nm, and the line L33 indicates spectroscopic characteristics in a case where the dot pitch P3 is set at 500 nm.

As illustrated, as the dot pitch P3 is narrower, the absorption band of the plasmon filter 121A' shifts toward the shorter wavelength side, and as the dot pitch P3 is wider, the absorption band of the plasmon filter 121A' shifts toward the longer wavelength side.

Additionally, the transmission band or the absorption band can be adjusted only by adjusting a pitch of holes or dots in the plane direction also in any plasmon filter in the hole array structure and in the dot array structure. Thus, for example, the transmission band or the absorption band can be individually set per pixel only by adjusting a pitch of holes or dots in a lithography step, thereby achieving more colors of the filter in less steps.

Further, the thickness of the plasmon filter is almost similar to an organic material-based color filter at about 100 to 500 nm, and is excellent in process affinity.

Figure 14:
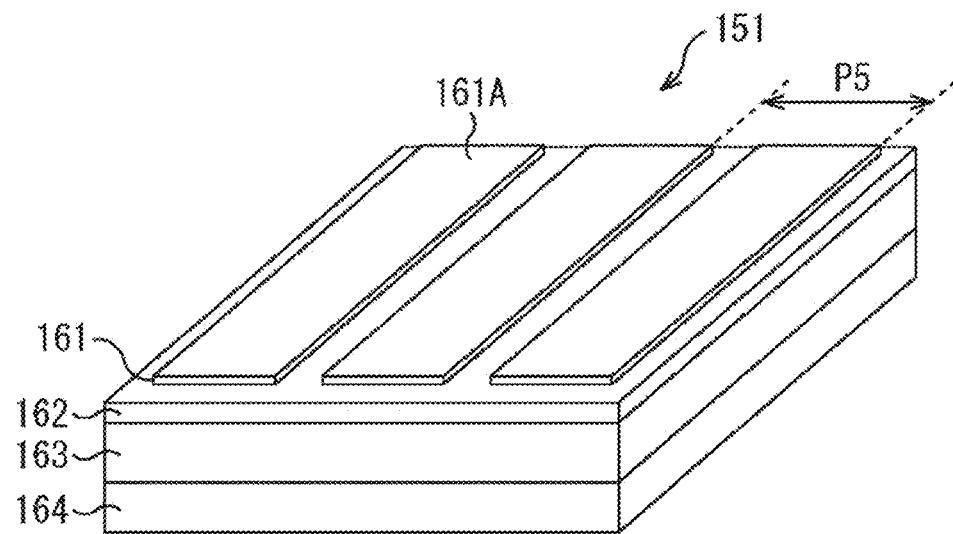
FIG. 14 is a diagram illustrating an exemplary configuration of a plasmon filter using GMR.

Further, the narrowband filter NB can employ a plasmon filter 151 using guided mode resonant (GMR) illustrated in FIG. 14.

A conductive layer 161, an SiO2 film 162, an SiN film 163, and an SiO2 substrate 164 are laminated from the top in the plasmon filter 151. The conductive layer 161 is included in the narrowband filter layer 103 of FIG. 3, for example, and the SiO2 film 162, the SiN film 163, and the SiO2 substrate 164 are included in the interlayer film 104 of FIG. 3, for example.

Rectangular conductive thin films 161A including aluminum, for example, are arranged at a predetermined pitch P5 on the conductive layer 161 such that the long sides of the conductive thin films 161A are adjacent. Then, the transmission band of the plasmon filter 151 changes due to the pitch P5 or the like.

Figure 15:
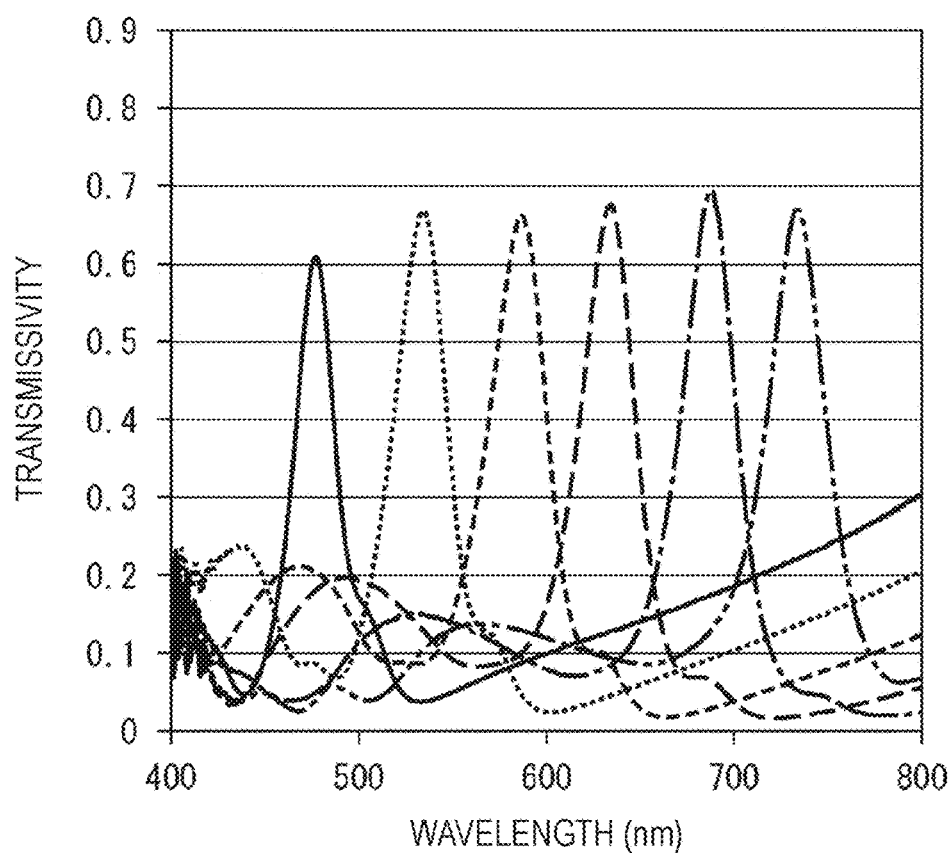
FIG. 15 is a graph illustrating exemplary spectroscopic characteristics of the plasmon filter using GMR.

FIG. 15 is a graph illustrating exemplary spectroscopic characteristics of the plasmon filter 151 in a case where the pitch P5 is changed. The horizontal axis in the graph indicates a wavelength (nm), and the vertical axis indicates a transmissivity. This example indicates exemplary spectroscopic characteristics in a case where the pitch P5 is changed in six kinds from 280 nm to 480 nm by 40 nm and the width of a slit between adjacent conductive thin films 161A is set at ¼ of the pitch P5. Further, a waveform with the shortest peak wavelength in the transmission band indicates spectroscopic characteristics in a case where the pitch P5 is set at 280 nm, and as the pitch P5 is wider, the peak wavelength is longer. That is, as the pitch P5 is narrower, the transmission band of the plasmon filter 151 shifts toward the shorter wavelength side, and as the pitch P5 is wider, the transmission band of the plasmon filter 151 shifts towards the longer wavelength side.

The plasmon filter 151 using GMR is also excellent in affinity with an organic material-based color filter similarly to the plasmon filters in the hole array structure and in the dot array structure described above.

<Second Embodiment of Imaging Device>

A second embodiment of the imaging device 12 of FIG. 1 will be described below with reference to FIG. 16 to FIG. 21.

Figure 16:
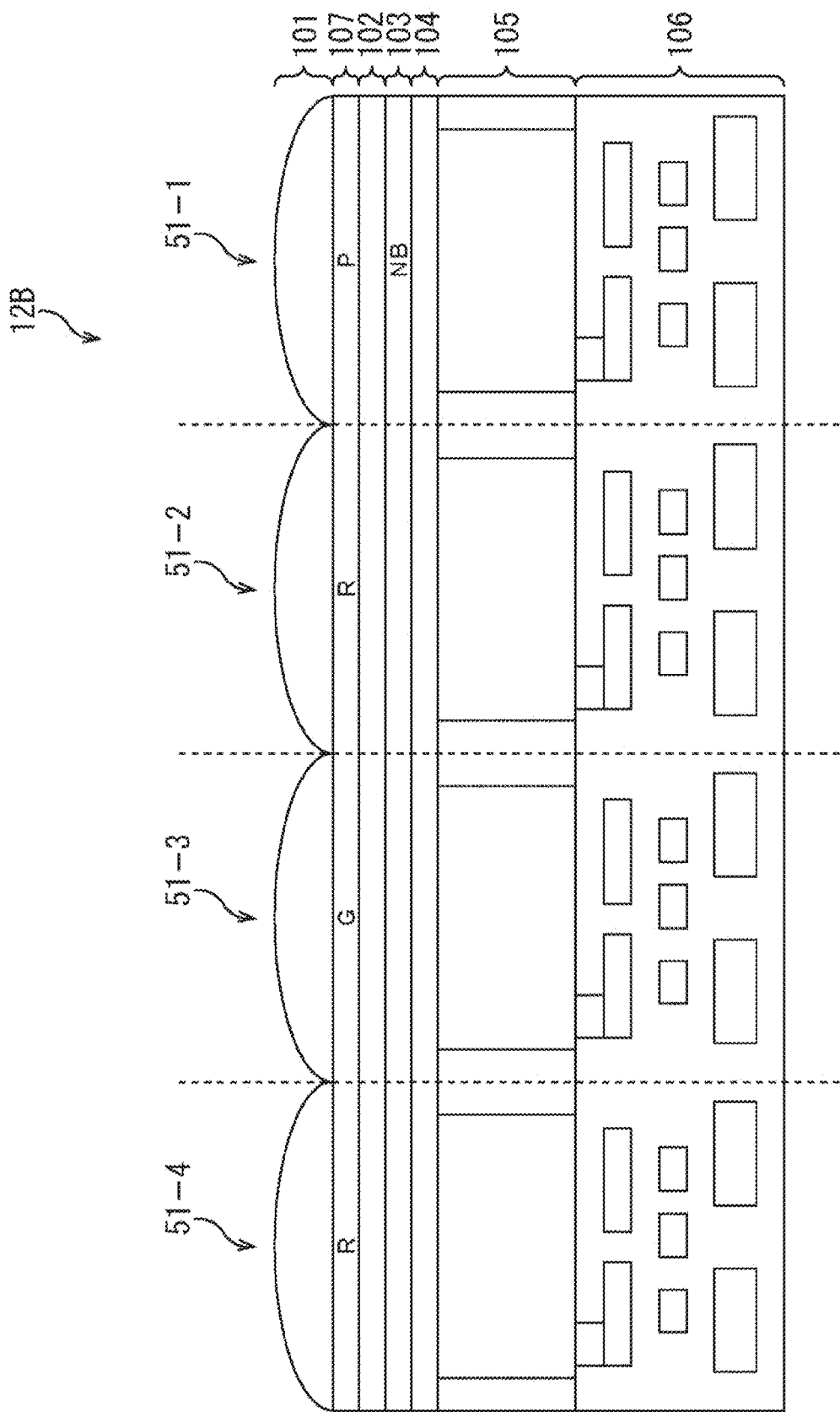
FIG. 16 is a cross-section view schematically illustrating an exemplary configuration of a second embodiment of the imaging device.

FIG. 16 schematically illustrates an exemplary cross-section configuration of an imaging device 12B as the second embodiment of the imaging device 12. Additionally, the parts corresponding to those in the imaging device 12A of FIG. 3 are denoted with the same reference numerals in the Figure, and the description thereof will be omitted as needed.

The imaging device 12B is different from the imaging device 12A in that a color filter layer 107 is laminated between the on-chip microlens 101 and the interlayer film 102.

The narrowband filters NB are provided not in all the pixels 51 but in some pixels 51 in the narrowband filter layer 103 in the imaging device 12B. The kinds of transmission bands (the number of bands) of the narrowband filter NB are arbitrary, and are set at 1 or more, for example.

Each pixel 51 is provided with a color filter in the color filter layer 107. For example, any of general red filter R, green filter G, and blue filter B (not illustrated) is provided in a pixel 51 which is not provided with the narrowband filter NB. Thereby, for example, R pixels provided with the red filter R, G pixels provided with the green filter G, B pixels provided with the blue filter, and MS pixels provided with the narrowband filter NB are arranged in the pixel array 31.

Further, a transmission filter P is provided in the color filter layer 107 in a pixel 51 provided with the narrowband filter NB. The transmission filter P is configured of an optical filter (lowpass filter, highpass filter, or bandpass filter) for transmitting a light in a wavelength band including the transmission band of the narrowband filter NB of the same pixel 51 as described below.

Additionally, the color filter provided in the color filter layer 107 may be organic material based or inorganic material based.

An organic material-based color filter is dye/colorant based using synthetic resin or native protein, and pigment-containing based using pigment or dye, for example.

An inorganic material-based color filter employs a material such as TiO2, ZnS, SiN, MgF2, SiO2, and Low-k. Further, an inorganic material-based color filter is formed in a method such as deposition, sputtering, or chemical vapor deposition (CVD) film formation.

Further, the interlayer film 102 is set at a film thickness capable of preventing the color filter layer 107 from influencing the surface plasmon on the interface between the interlayer film 102 and the narrowband filter layer 103 as described above with reference to FIG. 9.

An occurrence of flares is restricted by the transmission filter P provided in the color filter layer 107. This point will be described with reference to FIG. 17 and FIG. 18.

Figure 17:
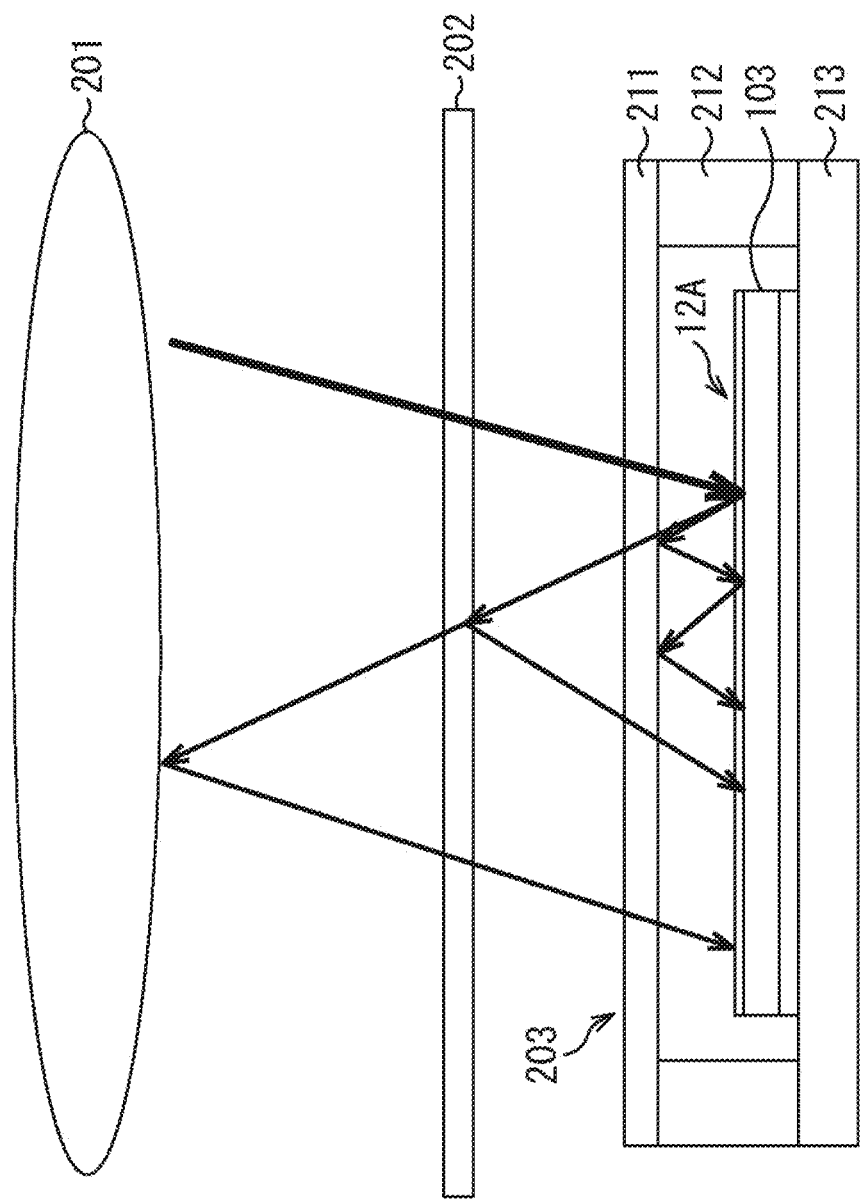
FIG. 17 is a diagram schematically illustrating how flares occur in the shooting apparatus.

FIG. 17 schematically illustrates how flares occur in the shooting apparatus 10 using the imaging device 12A of FIG. 2 not provided with the color filter layer 107.

In this example, the imaging device 12A is provided in a semiconductor chip 203. Specifically, the semiconductor chip 203 is mounted on a substrate 213, and its surrounding is covered with seal glass 211 and resin 212. Then, a light transmitting through a lens 201 and an IR cut filter 202 provided in the optical system 11 of FIG. 1 as well as the seal glass 211 is incident into the imaging device 12A.

Here, in a case where the narrowband filter NB in the narrowband filter layer 103 in the imaging device 12A is configured of a plasmon filter, a metallic conductive thin film is formed in the plasmon filter. The conductive thin film is high in its reflectivity, and thus easily reflects a light with a wavelength outside the transmission band. Then, part of a light reflected on the conductive thin film is reflected on the seal glass 211, the IR cut filter 202, or the lens 201, and is incident into the imaging device 12A again as illustrated in FIG. 17, for example. Flares occur due to the re-incident light. Particularly the plasmon filter in the hole array structure is low in its aperture, and thus flares easily occur.

The use of an antireflective film including a different metal from the conductive thin film or a high-dielectric material, for example, is considered in order to prevent the reflected light. However, the plasmon filter uses surface plasmon resonance, and if such an antireflective film contacts the surface of the conductive thin film, the characteristics of the plasmon filter can be deteriorated or desired characteristics can be difficult to obtain.

Figure 18:
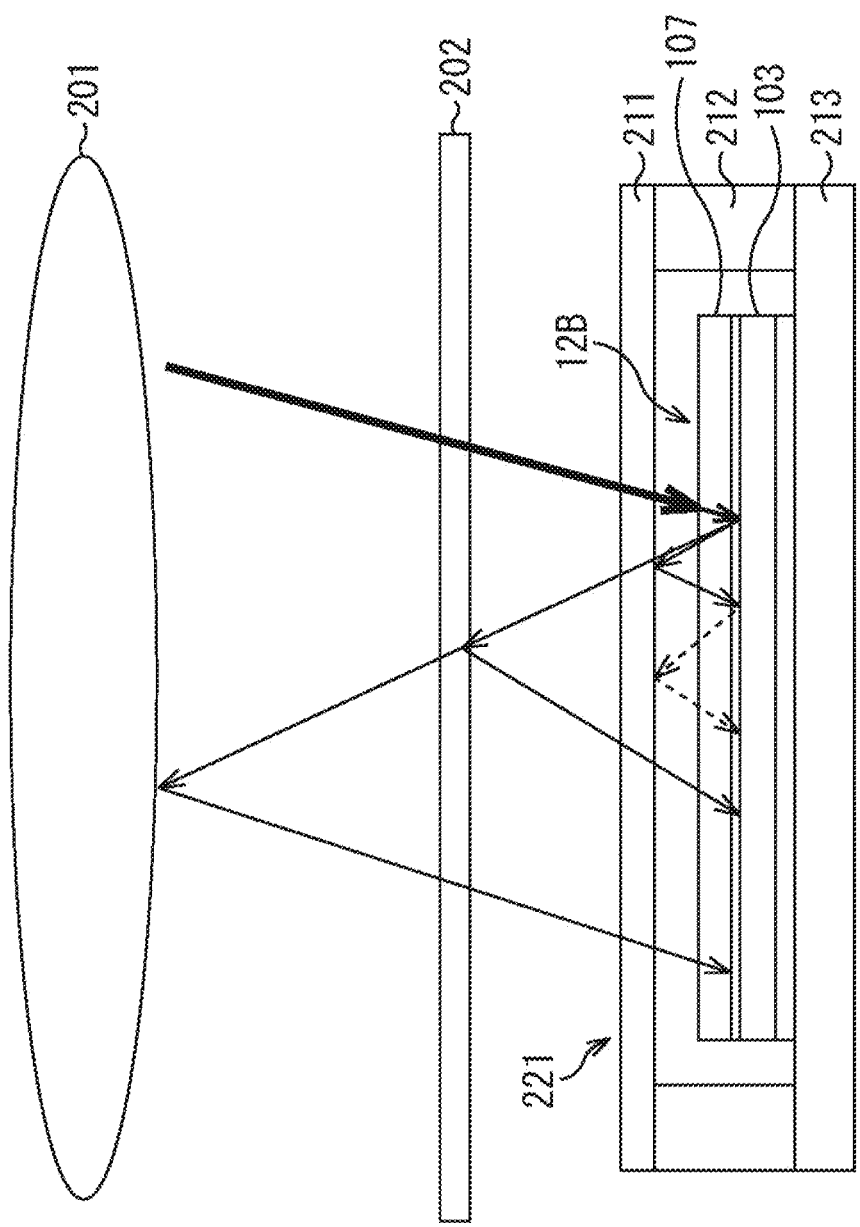
FIG. 18 is a diagram for explaining a method for reducing flares in the shooting apparatus.

On the other hand, FIG. 18 schematically illustrates how flares occur in the shooting apparatus 10 using the imaging device 12B of FIG. 16 provided with the color filter layer 107. Additionally, the parts corresponding to those in FIG. 17 are denoted with the same reference numerals in the Figure.

The example of FIG. 18 is different from the example of FIG. 17 in that a semiconductor chip 221 is provided instead of the semiconductor chip 203. The semiconductor chip 221 is different from the semiconductor chip 203 in that the imaging device 12B is provided instead of the imaging device 12A.

As described above, the transmission filter P is provided above the narrowband filter NB (toward the light incident side) in the imaging device 12B. Thus, a light incident into the imaging device 12B is cut off in its predetermined wavelength band by the transmission filter P and is then incident into the narrowband filter NB, and thus the amount of the incident light into the narrowband filter NB is restricted. Consequently, the amount of reflected light on the conductive thin film in the narrowband filter NB (plasmon filter) also reduces, and thus flares reduce.

Figure 19:
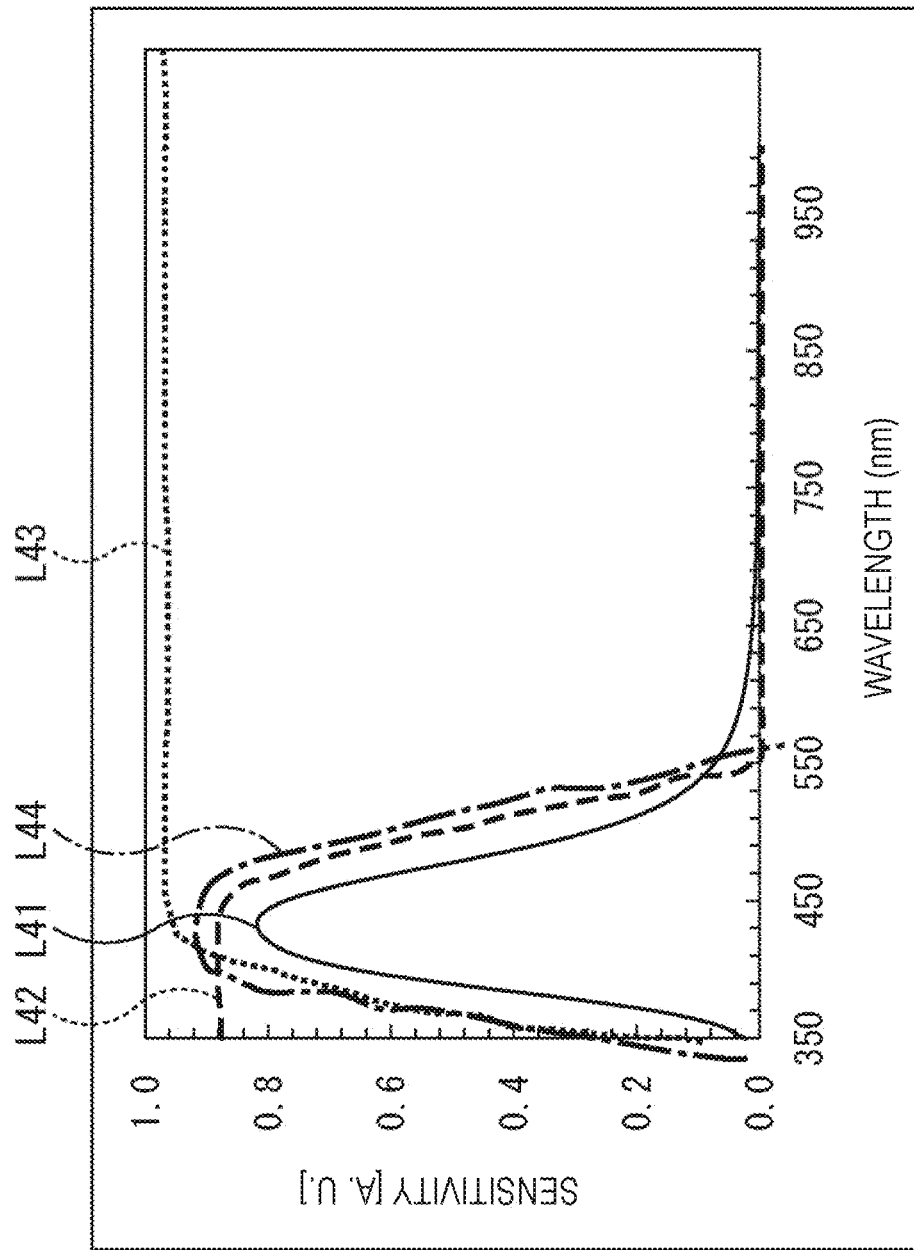
FIG. 19 is a graph illustrating a first example of spectroscopic characteristics of a narrowband filter and a transmission filter.
Figure 20:
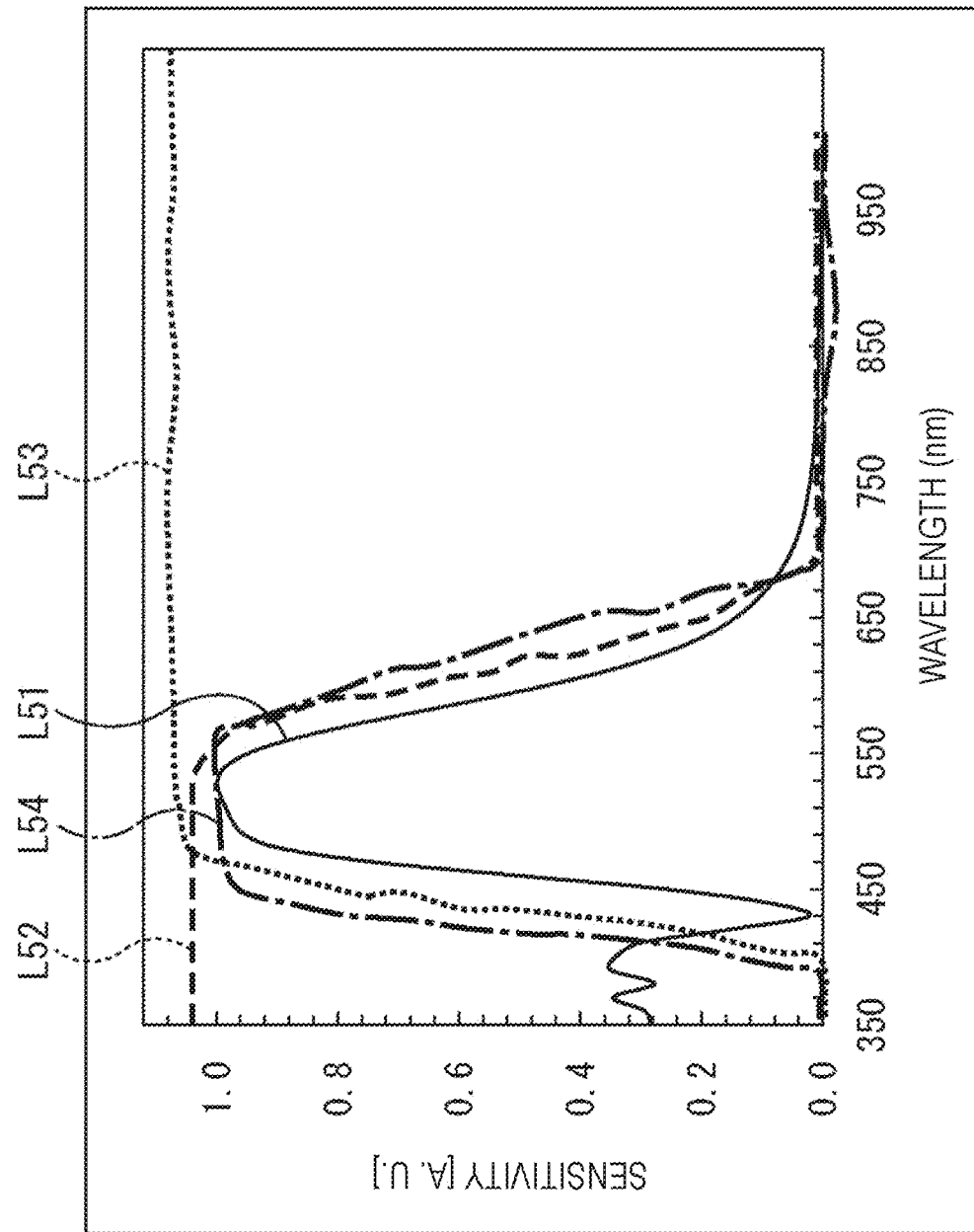
FIG. 20 is a graph illustrating a second example of the spectroscopic characteristics of the narrowband filter and the transmission filter.
Figure 21:
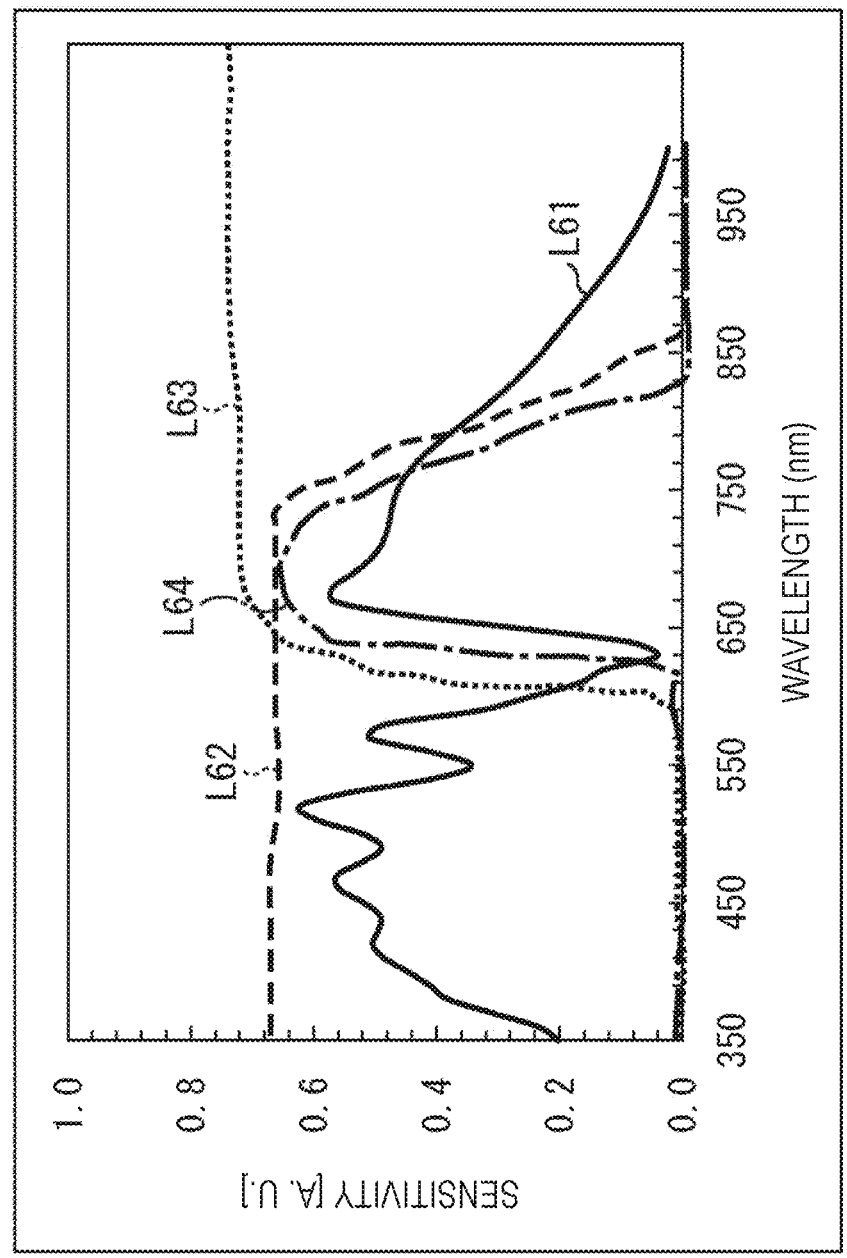
FIG. 21 is a graph illustrating a third example of the spectroscopic characteristics of the narrowband filter and the transmission filter.

FIG. 19 to FIG. 21 illustrate exemplary spectroscopic characteristics of the narrowband filter NB and exemplary spectroscopic characteristics of the transmission filter P arranged above the narrowband filter NB. Additionally, the horizontal axes in the graphs of FIG. 19 to FIG. 21 indicate a wavelength (nm), and the vertical axes indicate a sensitivity (arbitrary unit).

The line L41 in FIG. 19 indicates spectroscopic characteristics of the narrowband filter NB. The peak wavelength of the spectroscopic characteristics of the narrowband filter NB is around 430 nm. The line L42 indicates spectroscopic characteristics of the lowpass transmission filter P. The line L43 indicates spectroscopic characteristics of the highpass transmission filter P. The line L44 indicates spectroscopic characteristics of the bandpass transmission filter P. The sensitivity of any transmission filter P is higher than the sensitivity of the narrowband filter NB in a predetermined wavelength band including the peak wavelength of the spectroscopic characteristics of the narrowband filter NB. Thus, even if any transmission filter P is used, the amount of incident light into the narrowband filter NB can be reduced without almost attenuating the light in the transmission band of the narrowband filter NB.

The line L51 of FIG. 20 indicates spectroscopic characteristics of the narrowband filter NB. The peak wavelength of the spectroscopic characteristics of the narrowband filter NB is around 530 nm. The line L52 indicates spectroscopic characteristics of the lowpass transmission filter P. The line L53 indicates spectroscopic characteristics of the highpass transmission filter P. The line L54 indicates spectroscopic characteristics of the bandpass transmission filter P. The sensitivity of any transmission filter is higher than the sensitivity of the narrowband filter NB in a predetermined wavelength band including the peak wavelength of the spectroscopic characteristics of the narrowband filter NB. Thus, even if any transmission filter P is used, the amount of incident light into the narrowband filter NB can be reduced without almost attenuating the light in the transmission band of the narrowband filter NB.

The line L61 in FIG. 21 indicates spectroscopic characteristics of the narrowband filter NB. The peak wavelength of the spectroscopic characteristics of the narrowband filter NB in the plasmon mode is around 670 nm. The line L62 indicates spectroscopic characteristics of the lowpass transmission filter P. The line L63 indicates spectroscopic characteristics of the highpass transmission filter P. The line L64 indicates spectroscopic characteristics of the bandpass transmission filter P. The sensitivity of any transmission filter P is higher than the sensitivity of the narrowband filter NB in a predetermined wavelength band including the peak wavelength in the plasmon mode of about 630 nm or more as a cutoff wavelength of the spectroscopic characteristics of the narrowband filter NB. Thus, even if any transmission filter P is used, the amount of incident light into the narrowband filter NB can be reduced without almost attenuating the light in the transmission band of the narrowband filter NB in the plasmon mode. However, the highpass or bandpass transmission filter P can further cut off a light in the wavelength band of the narrowband filter NB in the waveguide mode, and thus is more desirable in the narrowband filter characteristics.

Additionally, in a case where the transmission band of the red filter R, the green filter G, or the blue filter B includes the transmission band of the narrowband filter NB in the lower layer, the filter may be used for the transmission filter P.

Further, the example of FIG. 16 illustrates that the narrowband filters NB are provided only in some pixels 51, but the narrowband filters NB can be provided in all the pixels 51. In this case, the transmission filter P having a transmission band including the transmission band of the narrowband filter NB in the pixel 51 may be provided for the color filter layer 107 per pixel 51.

Further, combinations of colors of the color filters in the color filter layer 107 are not limited to the above examples, and can be arbitrarily changed.

Further, in a case where a solution for flares is not required, for example, the transmission filter P may not be provided above the narrowband filter NB, or a dummy filter for transmitting lights with all the wavelengths may be provided.

<Third Embodiment of Imaging Device>

A third embodiment of the imaging device 12 of FIG. 1 will be described below with reference to FIG. 22.

Figure 22:
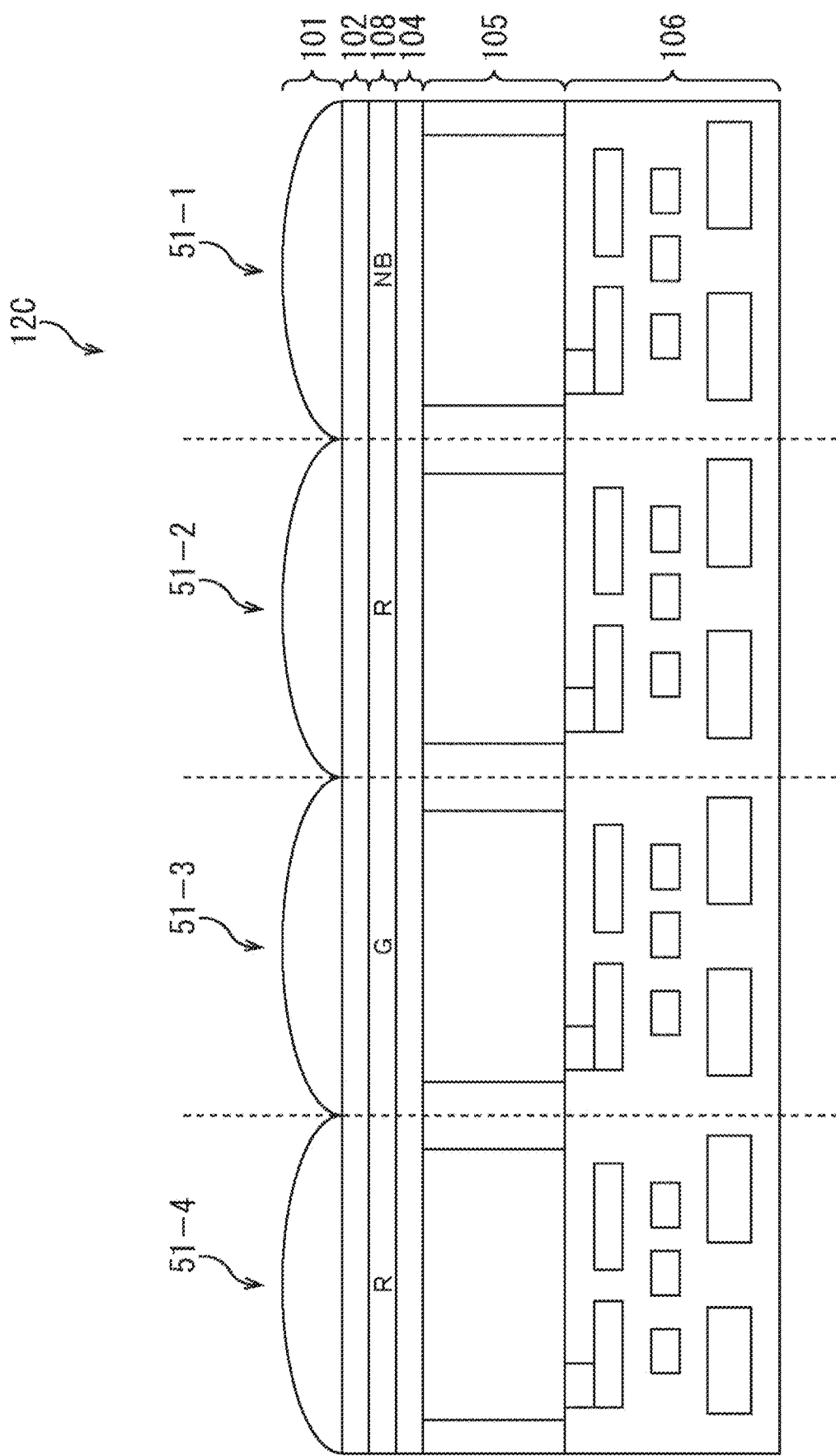
FIG. 22 is a cross-section view schematically illustrating an exemplary configuration of a third embodiment of the imaging device.

FIG. 22 schematically illustrates an exemplary cross-section configuration of an imaging device 12C as the third embodiment of the imaging device 12. Additionally, the parts corresponding to those in the imaging device 12A of FIG. 3 are denoted with the same reference numerals in the Figure, and the description thereof will be omitted as needed.

The imaging device 12C is different from the imaging device 12A in that a filter layer 108 is provided instead of the narrowband filter layer 103. Further, the imaging device 12C is different from the imaging device 12B of FIG. 16 in that the narrowband filter NB and the color filter (such as red filter R, green filter G, or blue filter B) are provided in the same filter layer 108.

Thereby, in a case where R pixels, G pixels, B pixels, and MS pixels are arranged in the pixel array 31 in the imaging device 12C, the color filter layer 107 can be omitted.

Additionally, in a case where an organic material-based color filter is used, the narrowband filter NB is earlier formed and a high-temperature final thermal processing such as sinter processing is performed, and then the color filter is formed, for example, in order to prevent a damage of the color filter due to heat or the like. On the other hand, in a case where an inorganic material-based color filter is used, the limitation of the above formation order is not basically required.

Further, in a case where a solution for flares is made as in the imaging device 12B of FIG. 16, a color filter layer may be laminated between the on-chip microlens 101 and the interlayer film 102 similarly to the imaging device 12B. In this case, the transmission filter P described above is provided in the color filter layer in the pixel 51 in which the filter layer 108 is provided with the narrowband filter NB. On the other hand, the color filter layer is not provided with a filter in the pixel 51 in which the filter layer 108 is provided with a color filter, or a dummy filter for transmitting lights with all the wavelengths or a color filter with the same color as the filter layer 108 is provided.

SECOND EMBODIMENT

A light with a desired frequency (frequency band) can be extracted by the plasmon filter 121. That is, the hole pitch P or the hole opening diameter D of the plasmon filter 121 is adjusted so that the plasmon filter 121 can be used as a filter for extracting a light with a desired frequency. In other words, a sensor including pixels for receiving lights with a plurality of frequencies can be configured by use of the plasmon filter 121.

Here, an imaging device including the plasmon filter 121 is described as multispectral pixel (MS pixel) as needed. Further, the description will be continued assuming that the narrowband filter layer 103 is the plasmon filter 121.

The description will be made according to the second embodiment in which pixels including a metallic thin film filter for transmitting an electromagnetic wave (light) in a predetermined frequency band (a first frequency band) such as the plasmon filter 121, and pixels including a color filter for transmitting an electromagnetic wave (light) in a predetermined frequency band (a second frequency band wider than the first frequency band) are provided, and the signals obtained from the pixels are processed thereby to generate a plurality of signals (signals in a plurality of frequency bands).

Specifically, the second embodiment assumes a configuration (configuration 1) in which G pixels are added to multispectral pixels, a configuration (configuration 2) in which W pixels are added to multispectral pixels, or a configuration (configuration 3) in which G pixels and W pixels are added to multispectral pixels, and then an improvement in color reproduction in a RGB color image and an improvement in multispectral spectroscopic characteristics will be described.

Additionally, a configuration (denoted as comparative configuration) in which R pixels, G pixels, B pixels, and multispectral pixels are combined different from the configuration 1, the configuration 2, or the configuration 3 described below is also assumed. In a case where one multispectral pixel is assumed, four pixels configure one unit in the comparative configuration.

To the contrary, both of the configuration 1 and the configuration 2 are combinations of a multispectral pixel and a G pixel or W pixel, and thus two pixels configure one unit. Further, the configuration 3 is combinations of a multispectral pixel, a G pixel, and a W pixel, and thus three pixels configure one unit.

In a case where the one unit generates a signal for one pixel, the resolution can be enhanced with more units arranged.

A plurality of single-unit configurations are repeatedly arranged in the pixel array 31. Thus, a smaller number of units are arranged in the pixel array 31 in the comparative configuration than in any of the configuration 1, the configuration 2, and the configuration 3. That is, a larger number of colors are used in the comparative configuration than in the configuration 1, the configuration 2, and the configuration 3, and thus the resolution lowers.

In this way, a smaller number of colors are used in the configuration 1, the configuration 2, and the configuration 3 than in the comparative configuration in which R pixels, G pixels, B pixels, and multispectral pixels are combined, thereby enhancing the resolution.

Further, as described below in detail, even in a case where the multispectral pixels and the G pixels are arranged as in the configuration 1, for example, a signal corresponding to a signal obtained from an R pixel or B pixel can be generated by use of a signal from a multispectral pixel, and thus a signal can be generated similarly as in a case where R pixels, G pixels, and B pixels are arranged as in the comparative configuration.

Therefore, for example, image quality comparable to that in a configuration with more colors such as the comparative configuration can be reproduced even with less colors as in the configuration 1. The configurations 1 to 3 will be additionally described.

<Configuration 1>

Figure 23:
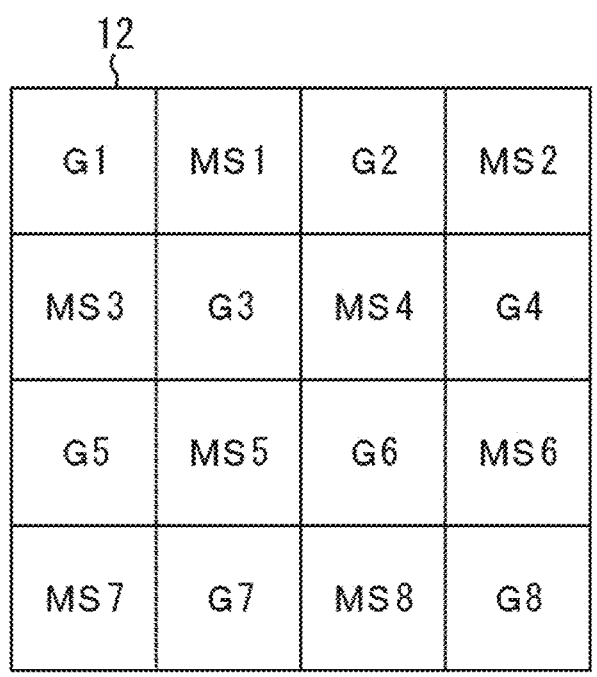
FIG. 23 is a diagram for explaining a color arrangement including multispectral pixels.

FIG. 23 is a diagram illustrating an exemplary configuration of the configuration 1 in which G pixels are added to multispectral pixels. In FIG. 23, the symbol "G" indicates a G pixel, and the symbol "MS" indicates an MS pixel. A G pixel is a pixel in which the color of the color filter layer 107 (FIG. 16) or the filter layer 108 (FIG. 22) is green. An MS pixel is a multispectral pixel for receiving a light in a predetermined frequency band (predetermined color).

FIG. 23 illustrates 16 pixels in 4×4 in the pixel array 31 (FIG. 2), and a group of thus-arranged pixels are repeatedly arranged in the pixel array 31. The 16 pixels illustrated in FIG. 23 are each numbered to be discriminated. For example, the pixel arranged at the upper left is a G1 pixel and a pixel arranged on the right side thereof is an MS1 pixel among the 16 pixels.

FIG. 23 illustrates an exemplary color arrangement in which the same numbers of G pixels and MS pixels are arranged. That is, G1 to G8 are the G pixels and MS1 to MS8 are the MS pixels in the 16 pixels. Further, the G pixels and the MS pixels are alternately arranged in the horizontal direction and in the vertical direction, respectively.

Additionally, the description will be continued herein assuming that the G pixels and the MS pixels are alternately arranged, but a different arrangement may be employed. For example, there may be employed a color arrangement in which two G pixels and two MS pixels are alternately arranged, or one G pixel and two MS pixels are alternately arranged. Other color arrangements described below are exemplary, and do not intend to limit the color arrangement.

A G pixel is directed for receiving a green light such as a light in a frequency band of 500 to 550 nm, for example. In FIG. 23, the G1 to G8 pixels are each assumed to receive a light in the frequency band.

An MS pixel is directed for receiving a light in a frequency band to be extracted. In FIG. 23, the MS1 to MS8 pixels receive lights in different frequency bands, respectively. That is, in this case, the MS1 to MS8 pixels are assumed as sensors capable of handing the lights in eight frequency bands.

Additionally, the description will be continued herein assuming that the MS1 to MS8 pixels receive lights in different frequency bands, respectively, but may be assumed to receive a light in the same frequency band. In a case where four frequency bands are handled, for example, depending on the number of frequency bands to be handled, there can be configured such that the MS1 pixel and the MS2 pixel are assumed to receive a light in a first frequency band, the MS3 pixel and the MS4 pixel are assumed to receive a light in a second frequency band, the MS5 pixel and the MS6 pixel are assumed to receive alight in a third frequency band, and the MS7 pixel and the MS8 pixel are assumed to receive a light in a fourth frequency band, for example.

Figure 24:
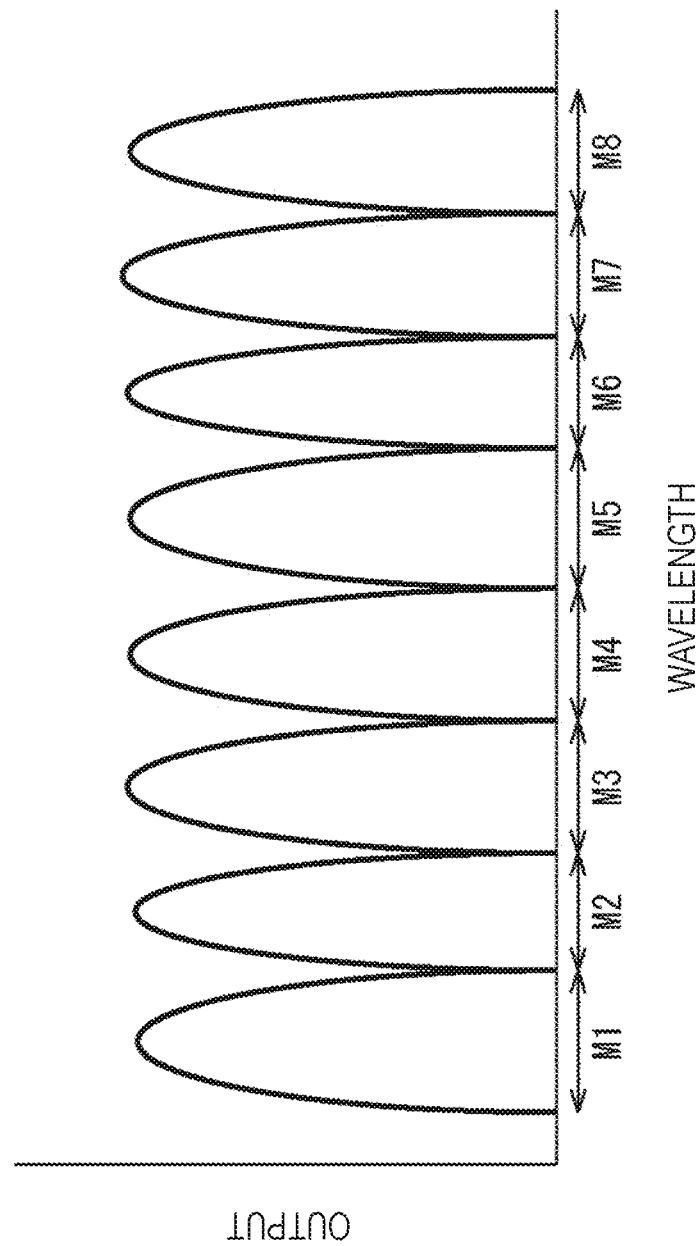
FIG. 24 is a diagram for explaining how to output from a multispectral pixel.

In a case where the MS1 to MS8 pixels are configured to receive lights in different frequency bands, respectively, the signals as illustrated in FIG. 24 are obtained from the MS1 to MS8 pixels, for example.

The MS1 pixel receives a light in a frequency band M1. Similarly, the MS2 pixel receives a light in a frequency band M2, the MS3 pixel receives a light in a frequency band M3, the MS4 pixel receives a light in a frequency band M4, the MS5 pixel receives a light in a frequency band M5, the MS6 pixel receives a light in a frequency band M6, the MS7 pixel receives a light in a frequency band M7, and the MS8 pixel receives a light in a frequency band M8.

In this way, the MS1 to MS8 pixels can be assumed to receive the lights in the different frequency bands M1 to M8, respectively. Further, the G1 to G8 pixels can be each assumed to receive a light in the green frequency band G as illustrated in FIG. 25.

Thus, in the configuration 1, in the 16 pixels illustrated in FIG. 23, the information indicating green is obtained from the G pixels, the information indicating the color M1 in the frequency band M1 is obtained from the MS1 pixel, the information indicating the color M2 in the frequency band M2 is obtained from the MS2 pixel, the information indicating the color M3 in the frequency band M3 is obtained from the MS3 pixel, the information indicating the color M4 in the frequency band M4 is obtained from the MS4 pixel, the information indicating the color M5 in the frequency band M5 is obtained from the MS5 pixel, the information indicating the color M6 in the frequency band M6 is obtained from the MS6 pixel, the information indicating the color M7 in the frequency band M7 is obtained from the MS7 pixel, and the information indicating the color M8 in the frequency band M8 is obtained from the MS8 pixel.

<Configuration 2>

Figures 25, 26:
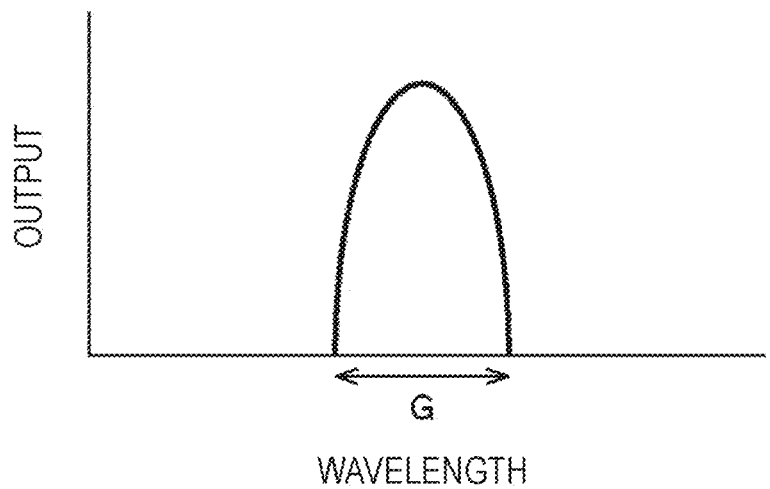
FIG. 25 is a diagram for explaining how to output from a G pixel.
FIG. 26 is a diagram for explaining other color arrangement including multispectral pixels.

FIG. 26 is a diagram illustrating an exemplary configuration of the configuration 2 in which W pixels are added to multispectral pixels. In FIG. 26, the symbol "W" indicates a W pixel and the symbol "MS" indicates an MS pixel. A W pixel is a pixel in which the color of the color filter layer 107 (FIG. 16) or the filter layer 108 (FIG. 22) is white (transparent). A W pixel is high in its sensitivity, thereby enhancing signal-noise ratio (SNR) in the configuration 2.

FIG. 26 illustrates an exemplary color arrangement in which the same numbers of W pixels and MS pixels are arranged. That is, W1 to W8 are assumed as W pixels and MS1 to MS8 are assumed as MS pixels in the 16 pixels. Further, the W pixels and the MS pixels are alternately arranged in the horizontal direction and in the vertical direction, respectively.

Additionally, the description will be continued herein assuming that the W pixels and the MS pixels are alternately arranged, but a different arrangement may be employed. For example, there may be employed a color arrangement in which two W pixels and two MS pixels are alternately arranged, or one W pixel and two MS pixels are alternately arranged.

A W pixel is directed for receiving a white light such as a light in a frequency band in the visible band. In FIG. 26, the W1 to W8 pixels are assumed to receive lights in frequency bands in the visible band, respectively.

An MS pixel is directed for receiving a light in a frequency band to be extracted. In FIG. 26, the MS1 to MS8 pixels can be assumed to receive lights in different frequency bands, respectively, like the MS pixels illustrated in FIG. 23. That is, in this case, the MS1 to MS8 pixels are assumed as sensors capable of handling lights in eight frequency bands.

In a case where the MS1 to MS8 pixels are configured to receive lights in different frequency bands, respectively, the signals as illustrated in FIG. 24 are obtained from the MS1 to MS8 pixels, for example. Further, a signal in the white frequency band W as illustrated in FIG. 27 is obtained from each of the W1 to W8 pixels.

In this configuration, in the 16 pixels illustrated in FIG. 26, the information indicating white (mainly information indicating the luminance value) is obtained from the W pixels, the information indicating the color M1 in the frequency band M1 is obtained from the MS1 pixel, the information indicating the color M2 in the frequency band M2 is obtained from the MS2 pixel, the information indicating the color M3 in the frequency band M3 is obtained from the MS3 pixel, the information indicating the color M4 in the frequency band M4 is obtained from the MS4 pixel, the information indicating the color M5 in the frequency band M5 is obtained from the MS5 pixel, the information indicating the color M6 in the frequency band M6 is obtained from the MS6 pixel, the information indicating the color M7 in the frequency band M7 is obtained from the MS7 pixel, and the information indicating the color M8 in the frequency band M8 is obtained from the MS8 pixel.

<Configuration 3>

Figures 27, 28:
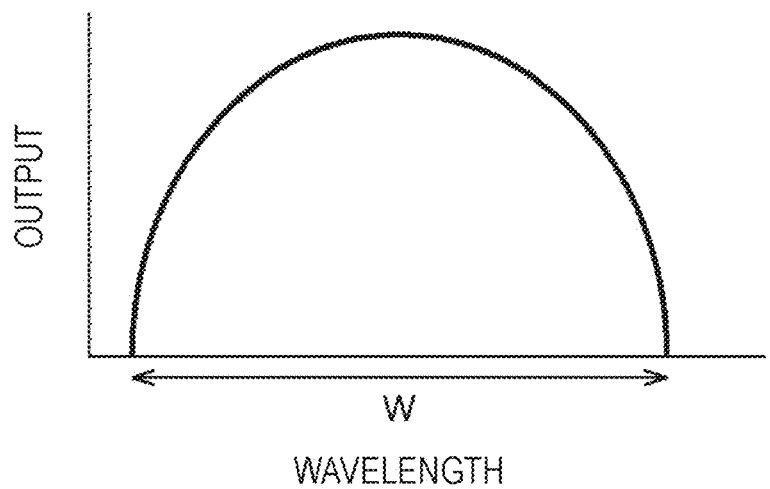
FIG. 27 is a diagram for explaining how to output from a W pixel.
FIG. 28 is a diagram for explaining other color arrangement including multispectral pixels.

FIG. 28 is a diagram illustrating an exemplary configuration of the configuration 3 in which W pixels and G pixels are added to multispectral pixels. In FIG. 28, the symbol "W" indicates a W pixel, the symbol "G" indicates a G pixel, and the symbol "MS" indicates an MS pixel.

A W pixel is high in its sensitivity and thus can enhance SNR, but is deteriorated in color resolution and color reproduction in the configuration 2. Therefore, not only W pixels but also G pixels are arranged together with MS pixels as in the configuration 3, thereby achieving a balance between SNR and color reproduction.

FIG. 28 illustrates an exemplary color arrangement in which the same numbers of G pixels and MS pixels are arranged and twice as many W pixels as the G pixels (or MS pixels) are arranged. That is, in the 16 pixels, G1 to G4 are assumed as the G pixels, MS1 to MS4 are assumed as the MS pixels, and W1 to W8 are assumed as W pixels.

Further, in the color arrangement illustrated in FIG. 28, the W pixels and the G pixels are alternately arranged in the first row and the third row, and the W pixels and the MS pixels are alternately arranged in the second row and the fourth row.

Additionally, the color arrangement illustrated in FIG. 28 is exemplary, and the numbers of G pixels, W pixels, and MS pixels and the arrangement pattern thereof are not limited to the example illustrated in FIG. 28.

A W pixel is directed for receiving a white light such as a light in a frequency band in the visible band. In FIG. 28, the W1 to W8 pixels are each assumed to receive a light in a frequency band in the visible band. Further, a G pixel is directed for receiving a green light such as a light in a frequency band of 500 to 550 nm. In FIG. 28, the G1 to G4 pixels are each assumed to receive a light in the frequency band.

An MS pixel is directed for receiving a light in a frequency band to be extracted. In FIG. 28, the MS1 to MS4 pixels can be assumed to receive lights in different frequency bands, respectively, like the MS pixels illustrated in FIG. 23. That is, in this case, the MS1 to MS4 pixels are assumed as sensors capable of handling lights in four frequency bands.

Additionally, there can be of course configured such that the pixels corresponding to the MS5 to MS8 pixels illustrated in FIG. 24 are provided in addition to the 16 pixels illustrated in FIG. 28, for example, and the MS1 to MS8 pixels are assumed as sensors capable of handling lights in eight frequency bands.

In a case where the MS1 to MS4 pixels are configured to receive lights in different frequency bands, respectively, the lights in the four wavelength bands among the signals illustrated in FIG. 24 are obtained from the MS1 to MS4 pixels, for example.

Further, the G1 to G4 pixels are each directed for receiving a light in the green frequency band G as illustrated in FIG. 25. Further, the W1 to W8 pixels are each directed for receiving a light in the white frequency band W as illustrated in FIG. 27.

In this configuration, in the 16 pixels illustrated in FIG. 28, the information indicating white (mainly information indicating the luminance value) is obtained from the W pixels, the information indicating green is obtained from the G pixels, the information indicating the color M1 in the frequency band M1 is obtained from the MS1 pixel, the information indicating the color M2 in the frequency band M2 is obtained from the MS2 pixel, the information indicating the color M3 in the frequency band M3 is obtained from the MS3 pixel, and the information indicating the color M4 in the frequency band M4 is obtained from the MS4 pixel.

In this way, the configuration 1 in which G pixels are added to multispectral pixels, the configuration 2 in which W pixels are added to multispectral pixels, and the configuration 3 in which G pixels and W pixels are added to multispectral pixels are assumed, thereby enhancing the color reproduction in the Bayer layout of RGB color image and enhancing the multispectral spectroscopic characteristics.

This will be further described. The following description will be made assuming that the configuration 1 is applied, but the description will be basically similar also in a case where the configuration 2 or the configuration 3 is applied.

<Signal Processing from Multispectral Pixel>

In a case where the MS1 to MS8 pixels for receiving the lights in the frequency bands M1 to M8, respectively, are arranged as multispectral pixels as illustrated in FIG. 23, for example, the signals as illustrated in FIG. 24 are obtained. A distribution of the obtained signals illustrated in FIG. 24 is illustrated in FIG. 29 again.

Figure 29:
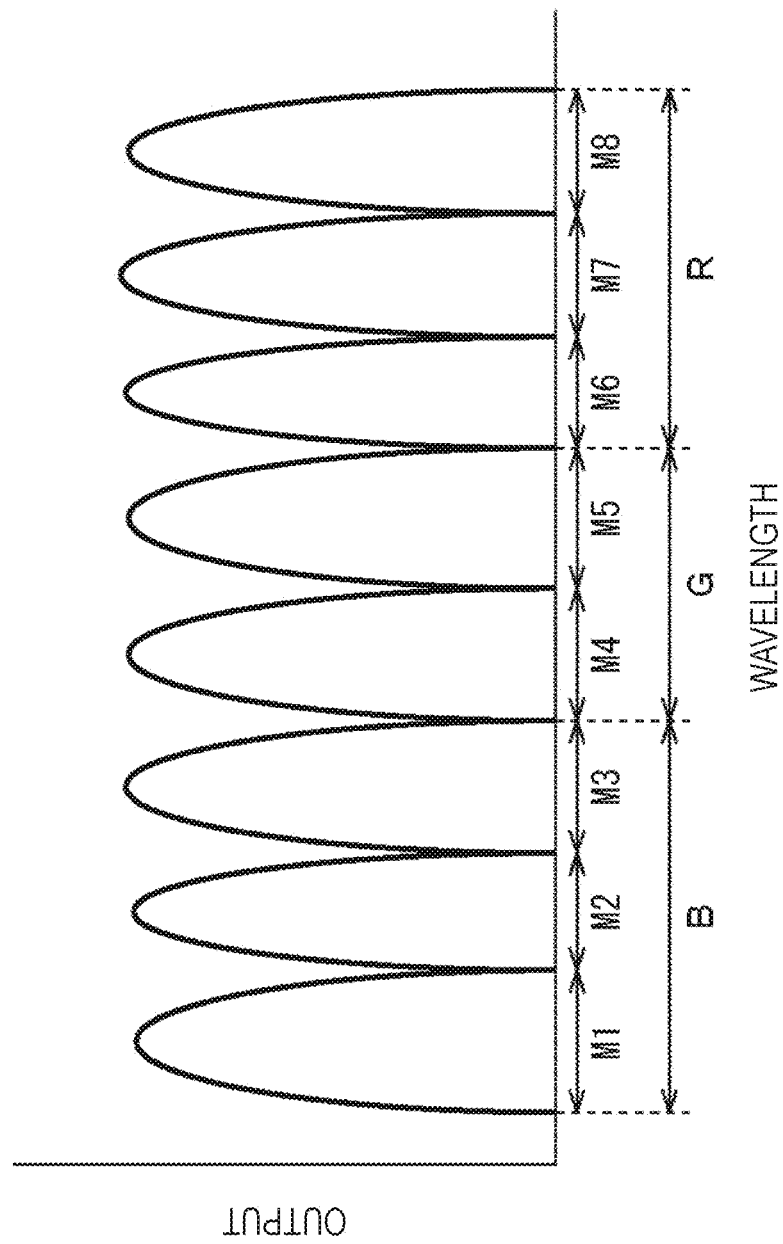
FIG. 29 is a diagram for explaining how to output from a multispectral pixel.

As illustrated in FIG. 29, it is assumed that the signals in the frequency bands M1 to M8 are obtained from the MS1 to MS8 pixels, respectively, and the plasmon filter 121 is configured such that each of the frequency bands M1 to M8 belongs to any of the blue frequency band B, the green frequency band G, and the red frequency band R.

Further, the plasmon filter 121 is configured such that the blue frequency band B includes the frequency band M1, the frequency band M2, and the frequency band M3, for example. Further, the plasmon filter 121 is configured such that the green frequency band G includes the frequency band M4 and the frequency band M5, for example. Further, the plasmon filter 121 is configured such that the red frequency band R includes the frequency band M6, the frequency band M7, and the frequency band M8, for example.

In a case where the plasmon filter 121 is configured in this way, a signal in the blue frequency band B can be generated from a signal 1 in the frequency band M1 obtained from the MS1 pixel, a signal 2 in the frequency band M2 obtained from the MS2 pixel, and a signal 3 in the frequency band M3 obtained from the MS3 pixel.

Signal in blue frequency band $B$=signal $M1$+signal $M2$+signal $M3$

Similarly, a signal in the green frequency band G can be generated from a signal 4 in the frequency band M4 obtained from the MS4 pixel and a signal 5 in the frequency band M5 obtained from the MS5 pixel.

Signal in green frequency band $G$=signal $M4$+ signal $M5$

Similarly, a signal in the red frequency band R can be generated from a signal 6 in the frequency band M6 obtained from the MS6 pixel, a signal 7 in the frequency band M7 obtained from the MS7 pixel, and a signal 8 in the frequency band M8 obtained from the MS8 pixel.

Signal in red frequency band $R$=signal $M6$+ signal $M7$+signal $M8$

In this way, the B (blue), G (green), and R (red) signals can be generated from the signals obtained from the multispectral pixels, respectively.

Further, the G pixels are present in the color arrangement illustrated in FIG. 23, and thus a signal in the green frequency band G can be obtained from the G pixels.

However, the multispectral signals are generally disadvantageous in terms of SNR, and thus the generated G signal can be less preferable in SNR. Therefore, the G signal generated from the multispectral signals M4 and M5 can be less preferable in SNR. It is therefore desirable that signals from the G pixels are used for a green signal.

On the other hand, the R signal and the B signal are similarly regarded, but the G signal is dominant in terms of contribution to a luminance signal, and thus the R signal and the B signal are low in contribution to SNR. Therefore, even if the R signal and the B signal are generated from the multispectral pixels, a reduction in SNR has low impact.

In this way, multispectral signals and signals for RGB color image can be generated by use of the signals from the multispectral pixels and the signals from the G pixels. For example, the signals can be generated in the following Equation (7).

[Math. 6]

$$\begin{bmatrix} a11 & a12 & a13 & \ldots & a18 \\ a21 & a22 & a23 & \ldots & a28 \\ a31 & a32 & a33 & \ldots & a38 \\ a41 & a42 & a43 & \ldots & a48 \\ a51 & a52 & a53 & \ldots & a58 \\ \vdots & \vdots & \vdots & & \vdots \\ a81 & a82 & a83 & \ldots & a88 \end{bmatrix} \begin{bmatrix} R \\ G \\ B \\ M1 \\ M2 \\ \vdots \\ M8 \end{bmatrix} = \begin{bmatrix} R' \\ G' \\ B' \\ M1' \\ M2' \\ \vdots \\ M8' \end{bmatrix} \quad (7)$$

A pixel value of a pixel at a predetermined position is calculated by the calculation based on Equation (7). The demosaic processing and the like are performed before the calculation based on Equation (7) is made, so that the pixel values corresponding to the signals M1 to M8 from the multispectral pixels and the pixel values corresponding to the signals G from the G pixels are generated per pixel.

For example, a pixel value for green is obtained from the G1 pixel in FIG. 23 but the pixel values for red and blue or the multispectral pixel values are not obtained, and thus the pixel values which are not obtained are complemented by the demosaic processing, and the complemented pixel values are used to make calculation in Equation (7).

Each element in the matrix of eight rows by eight columns in the left side in Equation (7) is a predetermined coefficient a. The coefficient a is appropriately set thereby to more accurately generate signals for multispectral image or signals for RGB color image. In this way, a degree of freedom increases due to more parameters, and the parameters are appropriately adjusted thereby to adjust the accuracy, thereby easily improving the resolution, the wavelength separation characteristics, or the like.

"R" in the elements in the matrix of eight rows by one column in the left side indicates a pixel value of the red frequency band R obtained by adding the signals from the multispectral pixels. "G" indicates a pixel value of the green frequency band G obtained by adding the signals from the multispectral pixels, or a pixel value of the green frequency band G obtained from the G pixels.

Additionally, the signal characteristics of both of multispectral signals and signals for RGB color image to be generated can be further enhanced by use of the pixel values of the green frequency band G obtained from the G pixels than by use of the pixel values of the green frequency band G obtained by adding the signals from the multispectral pixels, and thus the description will be continued assuming that the pixel values of the green frequency band G obtained from the G pixels are used.

"B" in Equation (7) indicates a pixel value of the blue frequency band B obtained by adding the signals from the multispectral pixels.

"M1" indicates a pixel value of the frequency band M1 obtained from the M1 pixel. Similarly, "M2" indicates a pixel value of the frequency band M2 obtained from the M2 pixel, "M3" indicates a pixel value of the frequency band M3 obtained from the M3 pixel, and "M4" indicates a pixel value of the frequency band M4 obtained from the M4 pixel.

"M5" indicates a pixel value of the frequency band M5 obtained from the M5 pixel, "M6" indicates a pixel value of the frequency band M6 obtained from the M6 pixel, "M7" indicates a pixel value of the frequency band M7 obtained from the M7 pixel, and "M8" indicates a pixel value of the frequency band M8 obtained from the M8 pixel.

The right side in Equation (7) is a calculation result, where "R'" indicates a generated pixel value of the red frequency band R, "G'" indicates a generated pixel value of the green frequency band G, and "B'" indicates a generated pixel value of the blue frequency band B.

Further, "M1'" indicates a generated pixel value of the frequency band M1, "M2'" indicates a generated pixel value of the frequency band M2, "M3'" indicates a generated pixel value of the frequency band M3, and "M4'" indicates a generated pixel value of the frequency band M4.

Further, "M5'" indicates a generated pixel value of the frequency band M5, "M6'" indicates a generated pixel value of the frequency band M6, "M7'" indicates a generated pixel value of the frequency band M7, and "M8'" indicates a generated pixel value of the frequency band M8.

The calculation based on Equation (7) is made per pixel in this way so that a multispectral signal and a signal for RGB color image can be generated in one pixel. Further, the multispectral signals and the signals for RGB color image are generated by use of the signals from the multispectral pixels and the signals from the G pixels, thereby restricting color mixture.

Further, a degree of freedom can be increased due to more parameters. Further, the RGB color reproduction is enhanced, thereby improving the multispectral wavelength separation characteristics such as characteristics indicated by a half bandwidth or peak value, for example.

Figure 30:
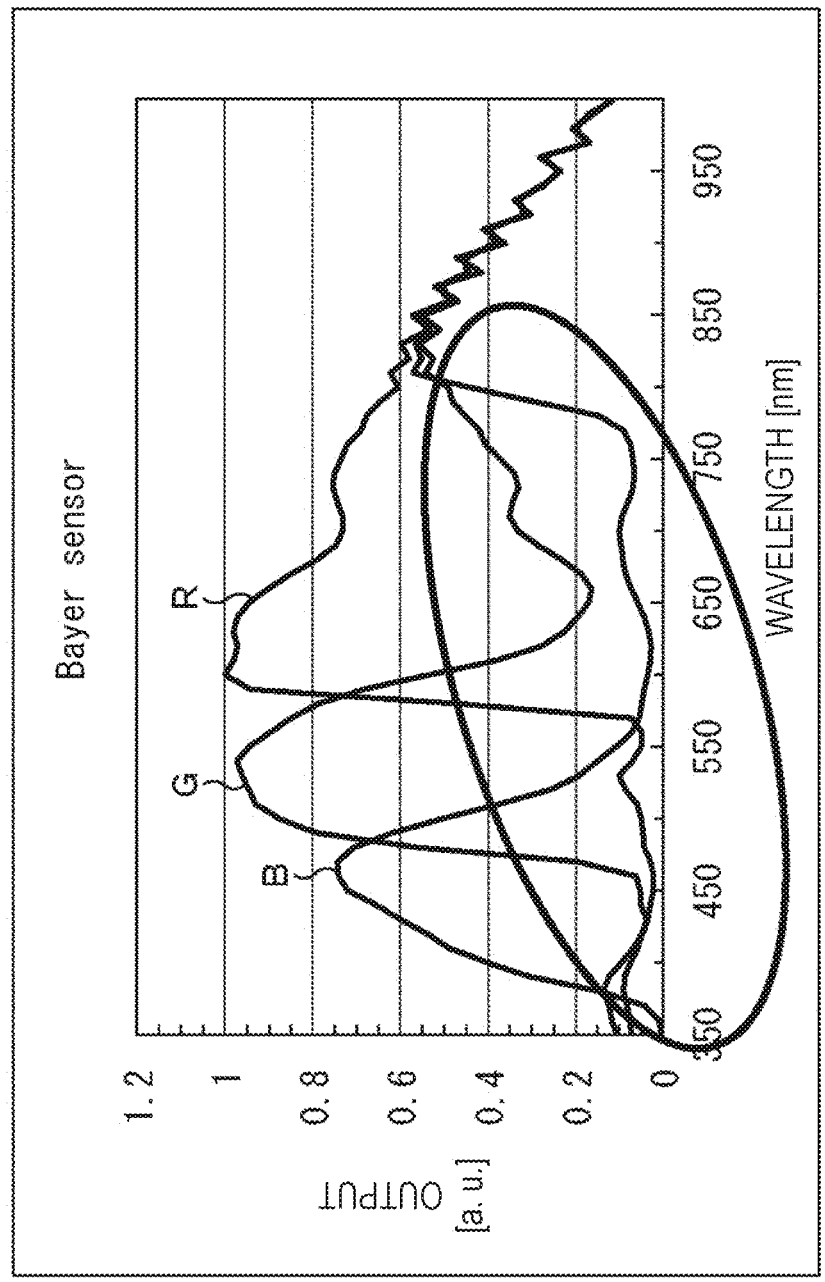
FIG. 30 is a diagram for explaining color mixture.

For example, conventionally, the signals obtained in the RGB Bayer layout are as illustrated in FIG. 30. As illustrated in FIG. 30, a signal B obtained from a B pixel, a signal G obtained from a G pixel, and a signal R obtained from a R pixel overlap in their frequency bands, which are not completely separated. That is, color mixture is caused in a part surrounded in a line in the Figure.

Color correction is made in the RGB sensor in a calculation equation as indicated in the following Equation (8), for example, which is denoted as linear matrix, color collection matrix, or the like, to approach the color-matching function.

[Math. 7]

$$\begin{bmatrix} a11 & a12 & a13 \\ a21 & a22 & a23 \\ a31 & a32 & a33 \end{bmatrix} \begin{bmatrix} R \\ G \\ B \end{bmatrix} = \begin{bmatrix} R' \\ G' \\ B' \end{bmatrix} \qquad (8)$$

However, the color mixture correction is limited by the subtraction processing for three colors RGB as illustrated in FIG. 30.

As described above, according to the present embodiment, the multispectral pixels and the G pixels are arranged in the pixel array 31, and the multispectral signals and the signals for RGB color image are generated by use of the signals of the multispectral pixels and the signals of the G pixels.

Figure 31:
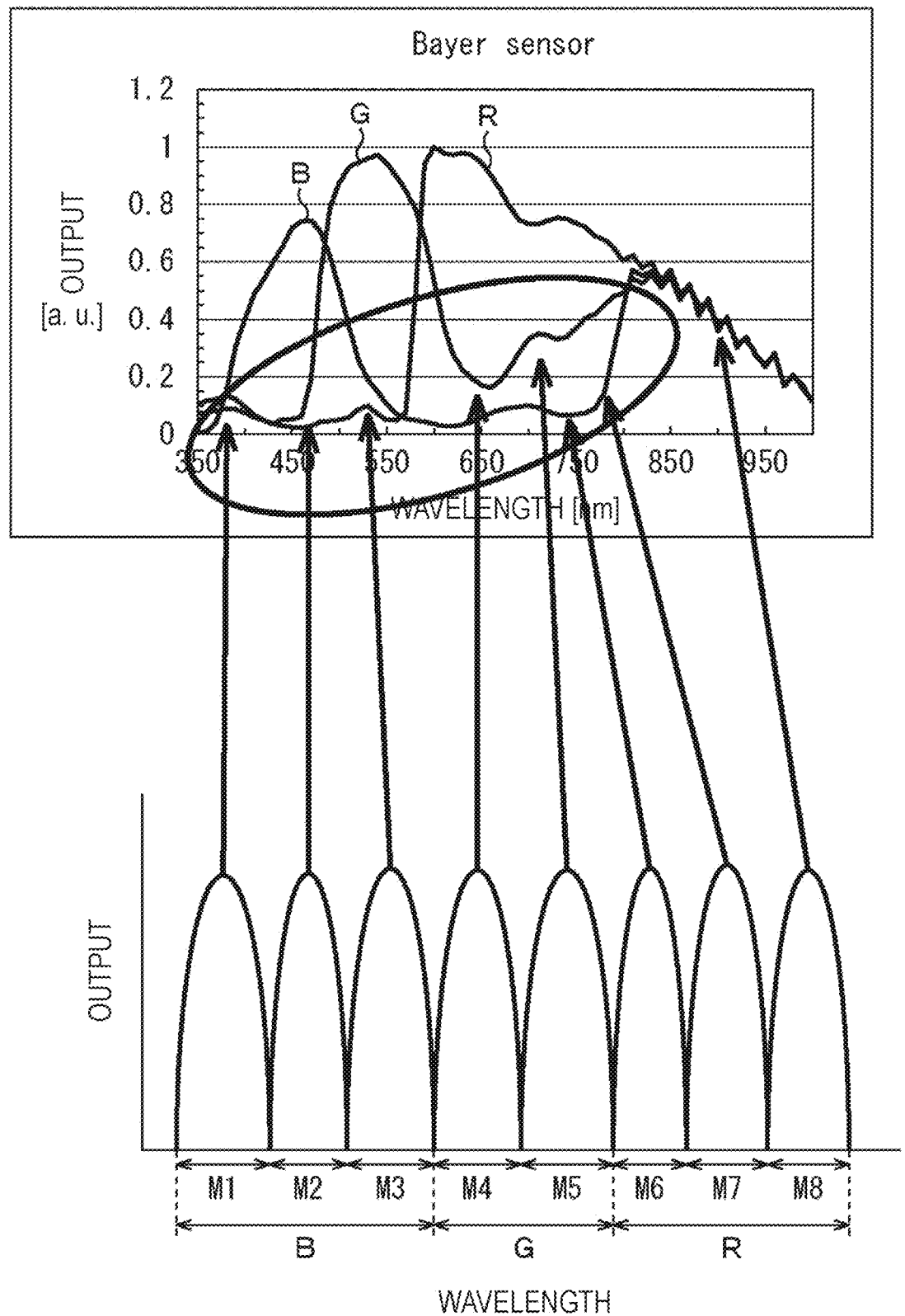
FIG. 31 is a diagram for explaining an improvement in color mixture.

FIG. 31 will be referred to. The upper diagram of FIG. 31 illustrates a distribution of signals obtained by the RGB sensors illustrated in FIG. 30, and the lower diagram of FIG. 31 illustrates a distribution of signals obtained from the multispectral pixels (the MS1 to MS8 pixels) illustrated in FIG. 29.

As described above, a red (R) signal R and a blue (B) signal B are generated by use of the signals from the MS1 to MS8 pixels, respectively. The signal R is divided into a plurality of frequency bands including the frequency band M6, the frequency band M7, and the frequency band M8, and is generated by use of the signals in the respective frequency bands with reference to the above example or FIG. 29 again. Similarly, the signal B is divided into a plurality of frequency bands including the frequency band M1, the frequency band M2, and the frequency band M3, and is generated by use of the signals in the respective frequency bands.

This means that a signal obtained from one R pixel is conventionally assumed as a signal R, for example, but the signal is divided into three frequency bands and the signals of the respective frequency bands are obtained and processed in the three MS pixels thereby to generate the signal R. Thus, the subtraction processing and the like can be finely performed per wavelength by use of the multispectral pixels, and the color mixture correction can be more finely made, thereby enhancing the color reproduction. Furthermore, the numerical value of each parameter can be totally lowered, and consequently the SNR can be enhanced and the image quality can be improved.

The signals (signal R, signal G, and signal B) for RGB color image can be corrected by the signals from the multispectral pixels, thereby enhancing the color reproduction of the signals for RGB color image.

Further, in a case where the signal R and the signal B are generated from the signals of the multispectral pixels and the G signal uses the signals of the G pixels, the color reproduction of the signals for RGB color image can be further enhanced.

With reference to the upper diagram of FIG. 31, the signal B, the signal G, and the signal R are assumed from the shorter wavelength side in the frequency band. The frequency band of the signal B is away from the frequency band of the signal R. Thus, an impact due to color mixture of the signal B into the signal R or an impact due to color mixture of the signal R into the signal B is regarded low.

On the other hand, the frequency band of the signal B is adjacent to the frequency band of the signal G, and thus an impact due to color mixture of the signal B into the signal G or an impact due to color mixture of the signal G into the signal B is regarded high. Further, similarly, the frequency band of the signal R is adjacent to the frequency band of the signal G, and thus an impact due to color mixture of the signal R into the signal G or an impact due to color mixture of the signal G into the signal R is regarded high.

From the above, the signal B and the signal R are generated from the signals of the multispectral pixels, thereby generating the signal B and the signal R with an impact of color mixture reduced. Further, the signal G can be generated without an impact due to the signals of the multispectral pixels by use of the signals of the G pixels. Therefore, the color reproduction of the signals for RGB color image can be further enhanced.

Figure 32:
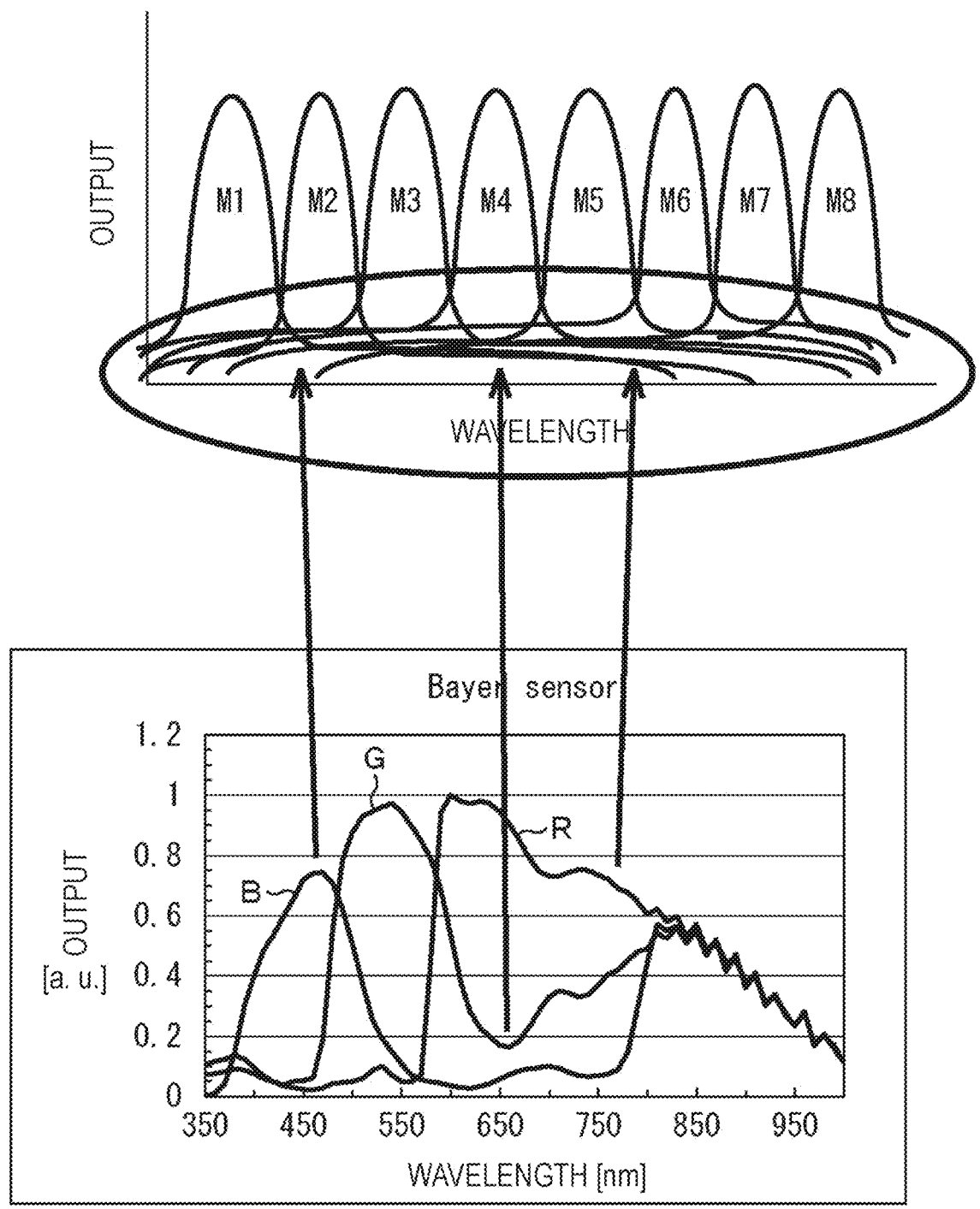
FIG. 32 is a diagram for explaining an improvement in color mixture.

Further, as illustrated in FIG. 32, the signals of the multispectral pixels can be corrected by the signals from the RGB sensors, thereby improving the characteristics such as wavelength resolution of the signals of the multispectral pixels.

For example, as illustrated in the upper diagram of FIG. 32, in a case where trailing due to color mixture is large, the signals of the multispectral pixels are easily corrected in a spectrum with a large half bandwidth like the signals from the RGB sensors.

For example, as described with reference to FIG. 29, in a case where the frequency band M4 of the signal M4 from the MS4 pixel and the frequency band M5 of the signal M5 from the MS5 pixel correspond to the green frequency band G, the half bandwidth of the signal G from the G pixel is larger than the half bandwidth of the signal M from the MS pixel. In a case where the signal M4 from the MS4 pixel or the signal M5 from the MS5 pixel is corrected by use of the signal G from the G pixel, preferable correction can be made.

The multispectral signals (the signals M1 to M8) can be corrected by the signals from the RGB sensors (the signals from the G pixels in the above example) in this way, thereby enhancing the wavelength resolution of the multispectral image.

<Configuration of Image Processing Part>

Figure 33:
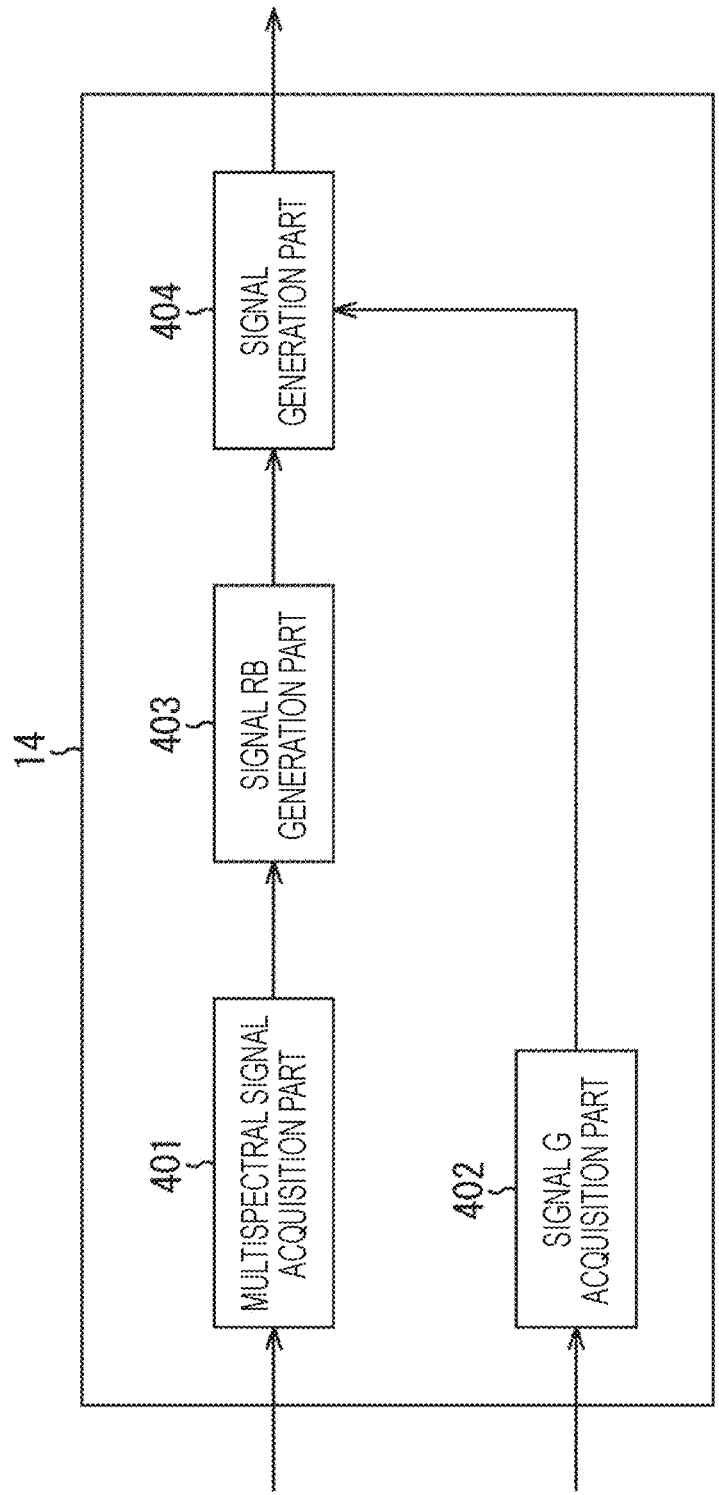
FIG. 33 is a diagram illustrating an exemplary configuration of a signal processing part.

FIG. 33 illustrates an exemplary internal configuration of the signal processing part 14 (FIG. 1) for performing the above processings. The signal processing part 14 illustrated in FIG. 33 includes a multispectral signal acquisition part 401, a signal G acquisition part 402, a signal RB generation part 403, and a signal generation part 404.

The multispectral signal acquisition part 401 acquires the signals M1 to M8 from the MS1 to MS8 pixels, and supplies them to the signal RB generation part 403. The signal RB generation part 403 generates a red signal R and a blue signal B by use of the signals M1 to M8, and supplies them to the signal generation part 404.

Additionally, the signal RB generation part 403 can be configured to generate a green signal G and to supply it to the signal generation part 404.

The signal G acquisition part 402 acquires a signal from a G pixel, and supplies it to the signal generation part 404. The signal generation part 404 generates the signals for multispectral image and the signals for RGB color image by making calculation based on the above Equation (7) using the supplied signals. The generated signals are supplied to the output part 15 (FIG. 1).

The signals for multispectral image and the signals for RGB color image are generated in this way.

Additionally, the signal processing part 14 can generate both of the signals for multispectral image and the signals for RGB color image, and can be of course configured to generate either of them.

Further, there can be configured such that the signals for multispectral image and the signals for RGB color image are generated and output to different destinations, respectively.

Further, the signals G from the G pixels may be used for the processing of adjusting the luminance values of the signals for multispectral image to be generated and the signals for RGB color image to be generated.

Further, also in a case where the configuration 2 (FIG. 26) is applied, the signals for multispectral image and the signals for RGB color image can be generated in the similar processings as in the configuration 1, but the signals W from the W pixels may be used for the processing of adjusting the luminance values of the signals for multispectral image to be generated and the signals for RGB color image to be generated.

Further, in a case where the configuration 2 is applied, a G pixel is not arranged, and thus the green signals G can be configured to be generated from the signals M of the multispectral pixels like the red signals R or the blue signals B, and can be generated by subtracting the signals R and the signals B from the W signals. Generally, subtraction of the signals R and the signals B from the W pixels is more advantageous in terms of SNR.

Further, also in a case where the configuration 3 (FIG. 28) is applied, the signals for multispectral image and the signals for RGB color image can be generated in the similar processings as in the configuration 1 and the configuration 2. In a case where the configuration 3 is applied, the signals G of the G pixels and the signals W of the W pixels may be used for the processing of adjusting the luminance values of the signals for multispectral image to be generated and the signals for RGB color image to be generated.

<Other Color Arrangements>

The above embodiments have been described assuming that the multispectral pixels and the G pixels are combined as illustrated in FIG. 23, the multispectral pixels and the W pixels are combined as illustrated in FIG. 26, or the multispectral pixels, the W pixels, and the G pixels are combined as illustrated in FIG. 28.

The present technology can be applied, not limited to the above color arrangements. For example, a color arrangement in which the RGB Bayer layout and the multispectral pixels are combined may be employed as illustrated in FIG. 34. The color arrangement illustrated in FIG. 34 is such that four pixels in 2×2 are assigned to a R pixel, a G pixel, a B pixel, and an MS pixel.

In terms of four pixels in 2×2, or in terms of the four pixels at the upper left in FIG. 34, for example, a G1 pixel is arranged at the upper left of the four pixels, a R1 pixel is arranged at the upper right, a B1 pixel is arranged at the lower left, and an M1 pixel is arranged at the lower right.

Also in a case where the R pixel, the G pixel, the B pixel, and the MS pixel are arranged in this way, the above embodiments can be applied to enhance the color reproduction of the RGB pixels and to enhance the wavelength resolution of the signal from the multispectral pixel. In the color arrangement, there can be configured such that the signal of the MS pixel is corrected by the signals of the R pixel, the G pixel, and B pixel and the signals of the R pixel, the G pixel, and the B pixel are corrected by the signal of the MS pixel.

Further, the present technology can be applied also in a case where the R pixels, the G pixels, the B pixels, and the MS pixels are arranged as illustrated in FIG. 35. The color arrangement illustrated in FIG. 35 is also assumed as an arrangement based on the RGB Bayer layout.

The four pixels in 2×2 at the upper left, the four pixels in 2×2 at the upper right, and the four pixels in 2×2 at the lower left in FIG. 35 are assumed as RGB Bayer layouts, respectively, for example, and only the MS pixels are arranged in the four pixels in 2×2 at the lower right.

The above embodiments can be applied also to the color arrangement in which the MS pixels are arranged together and the other parts are in the RGB Bayer layout, thereby enhancing the color reproduction of the RGB pixels and enhancing the wavelength resolution of the signals of the multispectral pixels.

Further, as illustrated in FIG. 36, there can be employed a color arrangement in which MS pixels are embedded in an arrangement based on the RGB Bayer layout. That is, MS pixels can be arranged at arbitrary positions in the pixel array of the pixel array 31.

Also in the color arrangement in which MS pixels are embedded, the above embodiments can be applied thereby to enhance the color reproduction of RGB pixels and to enhance the wavelength resolution of the signals of the multispectral pixels.

Additionally, the MS1 pixel, the MS2 pixel, the MS3 pixel, and the MS4 pixel illustrated in FIG. 34, FIG. 35, and FIG. 36 may be designed to extract an electromagnetic wave in the same frequency band or may be designed to extract electromagnetic waves in different frequency bands, respectively.

Further, a configuration with W pixels added may be employed. That is, the present technology can be applied also in a case where W pixels, R pixels, G pixels, B pixels, and MS pixels are arranged as illustrated in FIG. 37, for example.

In the example illustrated in FIG. 37, a G1 pixel, a W1 pixel, a W3 pixel, and a B1 pixel are arranged in the four pixels in 2×2 at the upper left. A G2 pixel, a W2 pixel, a W4 pixel, and a R1 pixel are arranged in the four pixels in 2×2 at the upper right. A G3 pixel, an MS1 pixel, a W7 pixel, and a R2 pixel are arranged in the four pixels in 2×2 at the lower left. A G4 pixel, a W6 pixel, a W8 pixel, and a B2 pixel are arranged in the four pixels in 2×2 at the lower right.

In the example illustrated in FIG. 37, more W pixels are arranged, and thus an arrangement in which some W pixels are replaced with MS pixels is illustrated. The W pixels are used for correcting the luminance values, for example, and the G pixels can be similarly used for correcting the luminance values, for example. Thus, though not illustrated, some G pixels may be replaced with MS pixels. For example, the G4 pixel may be replaced with an MS pixel.

The above embodiments can be applied also in a color arrangement with W pixels combined, thereby enhancing the color reproduction of RGB pixels and enhancing the wavelength resolution of signals of multispectral pixels.

Additionally, the above color arrangements are exemplary, and do not intend to limit. The present technology can be applied in a case where pixels such as R pixels, G pixels, B pixels, and W pixels, and multispectral pixels (MS pixels) are combined.

Further, the above embodiments have been described by way of R (red), G (green), and B (blue), but the present technology can be applied also in a case where colors such as Y (yellow), M (magenta), and C (cyan) are employed. That is, the present technology can be applied to color spaces such as RGB space and YCbCr space, or other color spaces, and the processings (such as calculation based on Equation (7)) suitable for the color spaces are performed.

According to the present technology, the color reproduction of RGB pixels can be enhanced, and the wavelength resolution of signals of multispectral pixels can be enhanced.

Further, the multispectral pixels can be used as pixels for obtaining signals for generating an image, and can be regarded similarly to normal pixels such as R pixels, G pixels, and B pixels. That is, even if multispectral pixels are embedded, a reduction in the number of normal pixels and a reduction in resolution can be prevented.

According to the present technology, a hole array type plasmon filter or a dot array type plasmon filter can be employed as a metallic thin film filter.

Further, the present technology can be applied to not only the CMOS image sensor of backside irradiation type described above but also other imaging devices using a plasmon filter. For example, the present technology can be applied to CMOS image sensors of surface irradiation type, charge coupled device (CCD) image sensors, image sensors in a photoconductor structure including organic photoelectric conversion film or quantum dot structure, and the like.

Figure 38:
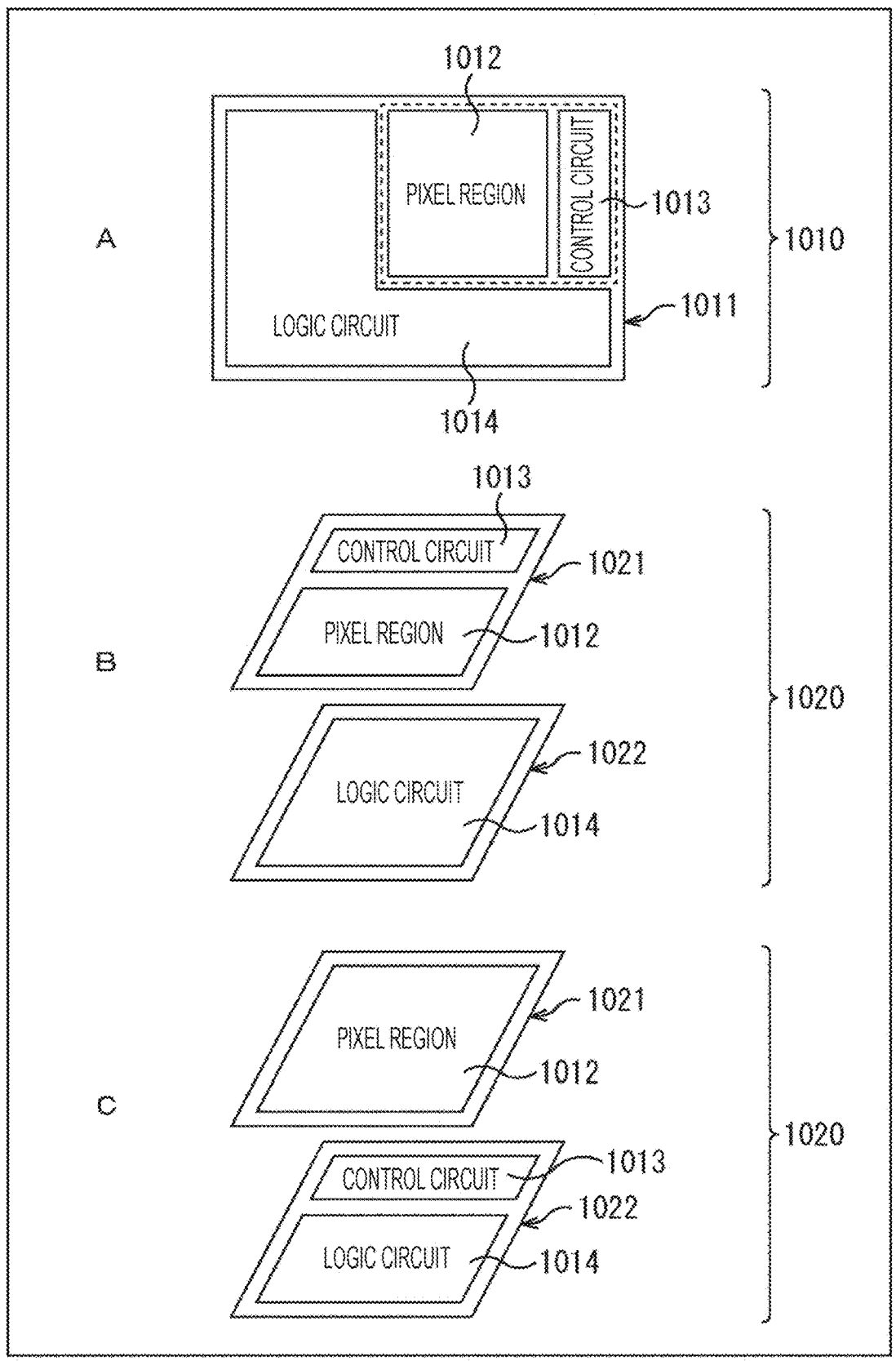
FIG. 38 is a diagram illustrating an outline of exemplary configurations of a solid-state shooting apparatus of laminated type to which the present technology can be applied.

Further, the present technology can be applied to a solid-state shooting apparatus of laminated type illustrated in FIG. 38, for example.

A of FIG. 38 illustrates an exemplary schematic configuration of a solid-state shooting apparatus of non-laminated type. As illustrated in A of FIG. 38, a solid-state shooting apparatus 1010 has a die (semiconductor substrate) 1011. The die 1011 mounts a pixel region 1012 in which pixels are arranged in an array shape, a control circuit 1013 for performing various controls in addition to driving pixels, and a logic circuit 1014 for performing signal processings.

B of FIG. 38 and C of FIG. 38 illustrate exemplary schematic configurations of a solid-state shooting apparatus of laminated type. A solid-state shooting apparatus 1020 is configured as one semiconductor chip in which two dies including a sensor die 1021 and a logic die 1022 are laminated and electrically connected as illustrated in B of FIG. 38 and C of FIG. 38.

In B of FIG. 38, the sensor die 1021 mounts the image region 1012 and the control circuit 1013 thereon, and the logic die 1022 mounts the logic circuit 1014 including a signal processing circuit for performing signal processings thereon.

In C of FIG. 38, the sensor die 1021 mounts the pixel region 1012 thereon, and the logic die 1024 mounts the control circuit 1013 and the logic circuit 1014 thereon.

Further, the present technology can be applied to a metallic thin film filter using a metallic thin film other than plasmon filter, and possible applications are assumed such as an application to photonic crystal using a semiconductor material or Fabry-Perot interference filter.

<Applications>

Applications of the present technology will be described below.

<Applications of Present Technology>

Figure 39:
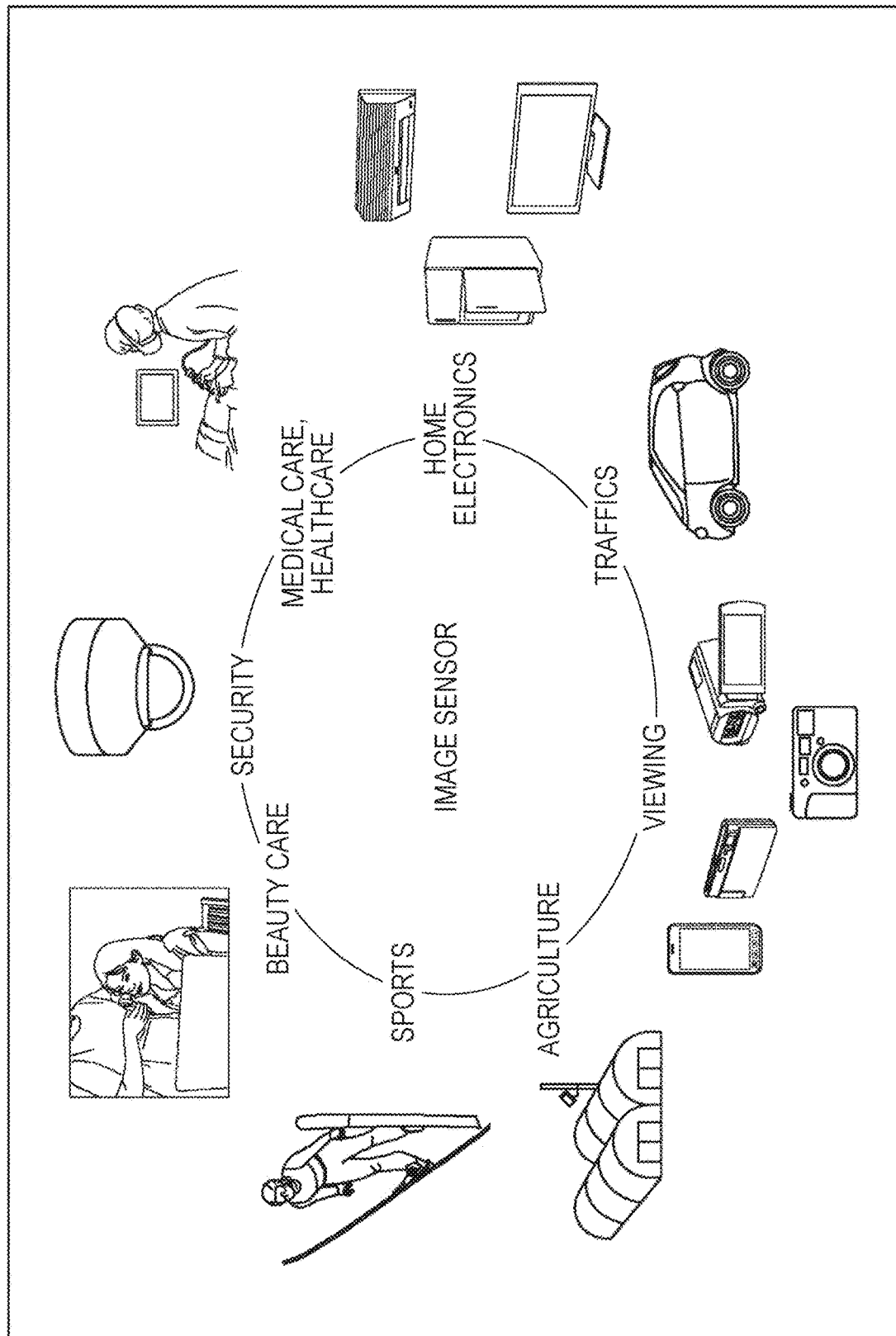
FIG. 39 is a diagram illustrating applications of the present technology.

The present technology can be applied in various cases for sensing a ray such as visible ray, infrared ray, ultraviolet ray, or X ray as illustrated in FIG. 39, for example.

Apparatuses for shooting images to be viewed such as digital camera or portable apparatus with camera function Traffic apparatuses for safe driving such as automatic stop, recognition of driver's state, or the like, such as vehicle-mounted sensor for shooting in front of, behind, around, or inside an automobile, for example, monitoring camera for monitoring traveling vehicle or road, or distance measuring sensor for measuring intervehicle distance or the like Home electronics such as TV, refrigerator, and air conditioner for shooting user's gesture and performing a device operation according to the gesture Medical-care or healthcare apparatuses such as endoscope, or apparatus for performing angiography by received infrared ray Security apparatus such as monitoring camera for crime prevention, or camera for person authentication Beauty care apparatuses such as skin measurement device for shooting the skin, or microscope for shooting the scalp Sports apparatuses such as action camera or wearable camera for sports or the like Agricultural apparatus such as camera for monitoring state of field or crops More specific applications will be described below.

For example, the transmission band of the narrowband filter NB of each pixel 51 in the shooting apparatus 10 of FIG. 1 is adjusted thereby to adjust the wavelength band (denoted as detection band) of a light detected by each pixel 51 in the shooting apparatus 10. Then, the detection band of each pixel 51 is appropriately set so that the shooting apparatus 10 can be applied in various cases.

For example, FIG. 40 illustrates exemplary detection bands in a case where umami or freshness of food is detected.

For example, the peak wavelength of the detection band is in a range of 580 to 630 nm and the half bandwidth is in a range of 30 to 50 nm in a case where myoglobin indicating umami of tuna, beef, or the like is detected. The peak wavelength of the detection band is 980 nm and the half bandwidth is in a range of 50 to 100 nm in a case where oleic acid indicating freshness of tuna, beef, or the like is detected. The peak wavelength of the detection band is in a range of 650 to 700 nm and the half bandwidth is in a range of 50 to 100 nm in a case where chlorophyll indicating freshness of leaf vegetable such as *Brassica rapa* is detected.

FIG. 41 illustrates exemplary detection bands in a case where sugar content or water of a fruit is detected.

For example, the peak wavelength of the detection band is 880 nm and the half bandwidth is in a range of 20 to 30 nm in a case where a pulp optical path length indicating sugar content of raiden as a kind of melon is detected. The peak wavelength of the detection band is 910 nm and the half bandwidth is in a range of 40 to 50 nm in a case where sucrose indicating sugar content of raiden is detected. The peak wavelength of the detection band is 915 nm and the half bandwidth is in a range of 40 to 50 nm in a case where sucrose indicating sugar content of raiden red as a kind of melon is detected. The peak wavelength of the detection band is 955 nm and the half bandwidth is in a range of 20 to 30 nm in a case where water indicating sugar content of raiden red is detected.

The peak wavelength of the detection band is 912 nm and the half bandwidth is in a range of 40 to 50 nm in a case where sucrose indicating sugar content of sugar content of apple is detected. The peak wavelength of the detection band is 844 nm and the half bandwidth is 30 nm in a case where water of mikan is detected. The peak wavelength of the detection band is 914 nm and the half bandwidth is in a range of 40 to 50 nm in a case where sucrose indicating sugar content of mikan is detected.

FIG. 42 illustrates exemplary detection bands in a case where plastics are classified.

For example, the peak wavelength of the detection band is 1669 nm and the half bandwidth is in a range of 30 to 50 nm in a case where poly ethylene terephthalate (PET) is detected. The peak wavelength of the detection band is 1688 nm and the half bandwidth is in a range of 30 to 50 nm in a case where poly styrene (PS) is detected. The peak wavelength of the detection band is 1735 nm and the half bandwidth is in a range of 30 to 50 nm in a case where poly ethylene (PE) is detected. The peak wavelength of the detection band is in a range of 1716 to 1726 nm and the half bandwidth is in a range of 30 to 50 nm in a case where poly vinyl cloride (PVC) is detected. The peak wavelength of the detection band is in a range of 1716 to 1735 nm and the half bandwidth is in a range of 30 to 50 nm in a case where polyepropylene (PP) is detected.

Further, the present technology can be applied to managing freshness of cut flowers, for example.

Further, the present technology can be applied to inspecting a foreign material mixed into food, for example. The present technology can be applied to detecting a foreign material such as peel, shell, stone, leaf, branch, and piece of wood mixed into nuts such as almond, blueberry, and walnut, fruits, for example. Further, the present technology can be applied to detecting a foreign material such as plastic piece mixed into processed food, beverage, and the like, for example.

Further, the present technology can be applied to detecting normalized difference vegetation index (NDVI) as an index of vegetation, for example.

Further, the present technology can be applied to detecting a person on the basis of one or both of a spectroscopic shape at a wavelength of around 580 nm derived from hemoglobin of human skin and a spectroscopic shape at a wavelength of around 960 nm derived from melanin pigment included in human skin, for example.

Further, the present technology can be applied for biometric sensing (biometric authentication), user interface, prevention of falsification of sign and the like, monitoring, and the like, for example.

<Application to Endoscopic Surgery System>

Further, the technology according to the present disclosure (the present technology) may be applied to an endoscopic surgery system, for example.

Figure 43:
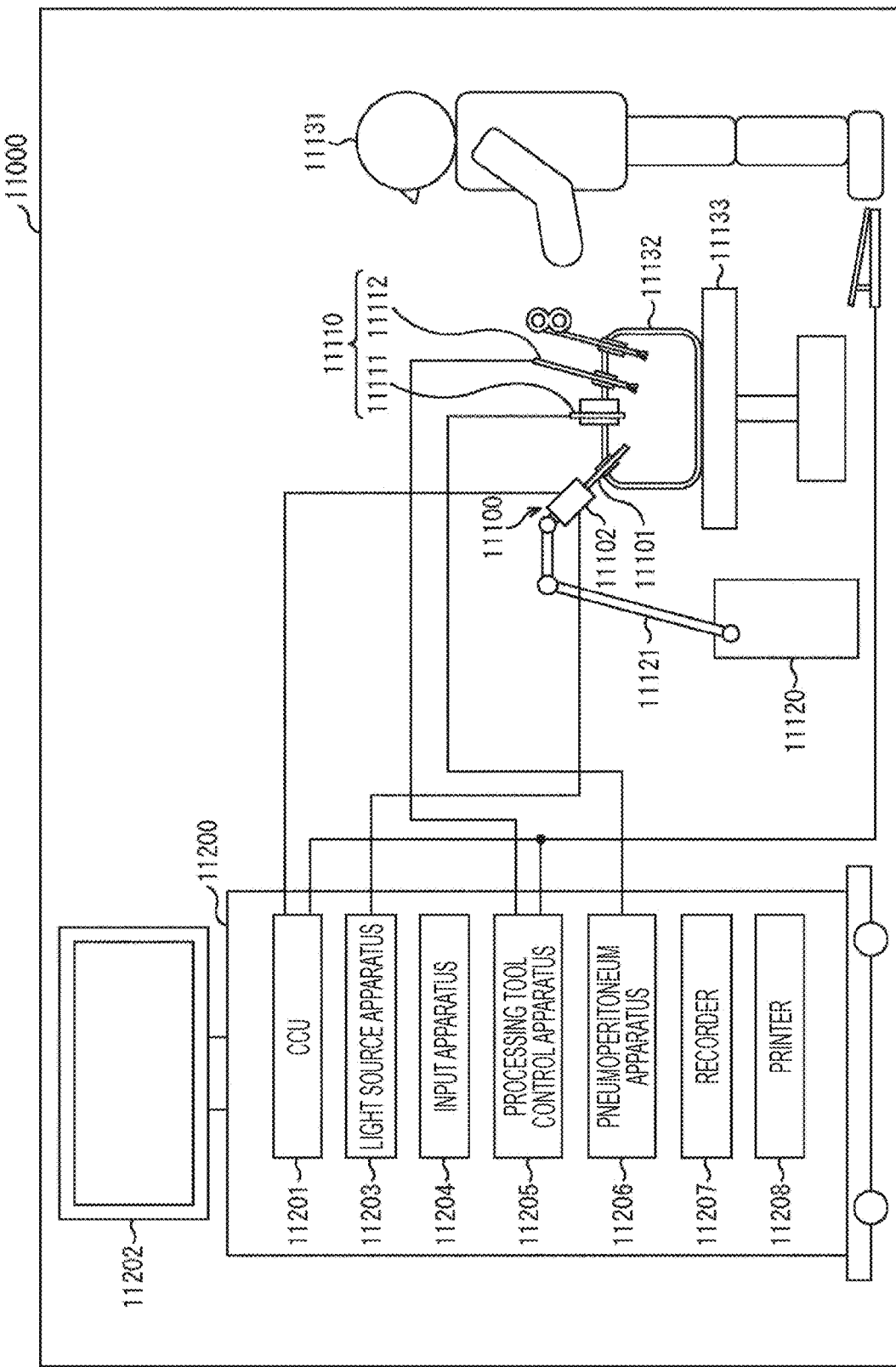
FIG. 43 is a diagram illustrating an exemplary schematic configuration of an endoscopic surgery system.

FIG. 43 is a diagram illustrating an exemplary schematic configuration of an endoscopic surgery system to which the technology according to the present disclosure (the present technology) can be applied.

FIG. 43 illustrates how an operator (doctor) 11131 performs an operation on a patient 11132 on a patient's bed 11133 by use of an endoscopic surgery system 11000. As illustrated, the endoscopic surgery system 11000 is configured of an endoscope 11100, the other surgical instruments 11110 such as pneumoperitoneum tube 11111 and energy treatment tool 11112, a support arm apparatus 11120 for supporting the endoscope 11100, and a cart 11200 on which various apparatuses for endoscopic surgery are mounted.

The endoscope 11100 is configured of a lens tube 11101 the region of which at a predetermined length from the tip is inserted into the body cavity of the patient 11132, and a camera head 11102 connected to the base of the lens tube 11101. In the illustrated example, the endoscope 11100 configured as a rigid scope having the hard lens tube 11101 is illustrated, but the endoscope 11100 may be configured as a flexible scope having a flexible lens tube.

An opening with an objective lens fitted is provided at the tip of the lens tube 11101. A light source apparatus 11203 is connected to the endoscope 11100, and a light generated by the light source apparatus 11203 is guided to the tip of the lens tube by a light guide extending into the lens tube 11101, and is emitted toward an object to be observed in the body cavity of the patient 11132 via the objective lens. Additionally, the endoscope 11100 may be a direct-viewing lens, or may be an oblique-viewing lens or side-viewing lens.

An optical system and an imaging device are provided inside the camera head 11102, and a reflected light (observation light) from an object to be observed is condensed on the imaging device via the optical system. The observation light is photoelectrically converted by the imaging device, and an electric signal corresponding to the observation light, or an image signal corresponding to the observed image is generated. The image signal is transmitted as RAW data to a camera control unit (CCU) 11201.

The CCU 11201 is configured of a central processing unit (CPU), a graphics processing unit (GPU), or the like, and totally controls the operations of the endoscope 11100 and a display apparatus 11202. Further, the CCU 11201 receives an image signal from the camera head 11102, and performs various image processings for displaying an image based on the image signal, such as development processing (demosaic processing), for example, on the image signal.

The display apparatus 11202 displays the image based on the image signal subjected to the image processing by the CCU 11201 under control of the CCU 11201.

The light source apparatus 11203 is configured of a light source such as light emitting diode (LED), for example, and supplies an irradiation light to the endoscope 11100 when shooting a surgical site or the like.

An input apparatus 11204 is an input interface for the endoscopic surgery system 11000. A user can input various items of information or instructions into the endoscopic surgery system 11000 via the input apparatus 11204. For example, the user inputs an instruction to change shooting conditions (such as kind of irradiation light, magnification, and focal distance) of the endoscope 11100, or the like.

A processing tool control apparatus 11205 controls the driving of the energy treatment tool 11112 for cauterizing or cutting a tissue, sealing a blood vessel, and the like. A pneumoperitoneum apparatus 11206 feeds gas into the body cavity via the pneumoperitoneum tube 11111 to expand the body cavity of the patient 11132 in order to secure the field of view of the endoscope 11100 and to secure a working space of the operator. A recorder 11207 is an apparatus capable of recording various items of information regarding a surgery. A printer 11208 is an apparatus capable of printing various items of information regarding a surgery in various forms such as text, image, or graph.

Additionally, the light source apparatus 11203 for supplying an irradiation light to the endoscope 11100 when shooting a surgical site can be configured of a white light source including an LED, a laser light source, or a combination thereof, for example. In a case where the white light source is configured in a combination of RGB laser light sources, the output intensity and the output timing of each color (each wavelength) can be controlled with high accuracy, and thus the white balance of a shot image can be adjusted in the light source apparatus 11203. Further, in this case, the laser lights from the respective RGB laser light sources are emitted on an object to be observed in a time division manner, and the driving of the imaging device in the camera head 11102 is controlled in synchronization with the irradiation timings, thereby shooting the images corresponding to RGB in a time division manner. According to the method, a color image can be obtained without a color filter in the imaging device.

Further, the driving of the light source apparatus 11203 may be controlled for changing the intensity of a light to be output at a predetermined time. The driving of the imaging device in the camera head 11102 is controlled in synchronization with the timings to change the intensities of the lights thereby to obtain images in a time division manner, and the images are combined thereby to generate an image with a high dynamic range without blocked-up shadows and blown-out highlights.

Further, the light source apparatus 11203 may be configured to supply a light in a predetermined wavelength band corresponding to special light observation. Under the special light observation, for example, a light in a narrower band than an irradiation light (or white light) during normal observation is emitted by use of the wavelength dependency of absorption of a light in a body tissue, thereby performing narrow band imaging for shooting a predetermined tissue such as blood vessel in the superficial portion of the mucous membrane at high contrast. Alternatively, under the special light observation, fluorescent observation for obtaining an image by fluorescence caused by emitting an excitation light may be performed. Under the fluorescent observation, an excitation light can be emitted on a body tissue thereby to observe fluorescence from the body tissue (autofluorescence observation), a reagent such as indocyanine green (ICG) can be locally injected into a body tissue, and an excitation light corresponding to the fluorescent wavelength of the reagent can be emitted on the body tissue thereby to obtain a fluorescent image, for example. The light source apparatus 11203 can be configured to supply a narrowband light and/or excitation light corresponding to the special light observation.

Figure 44:
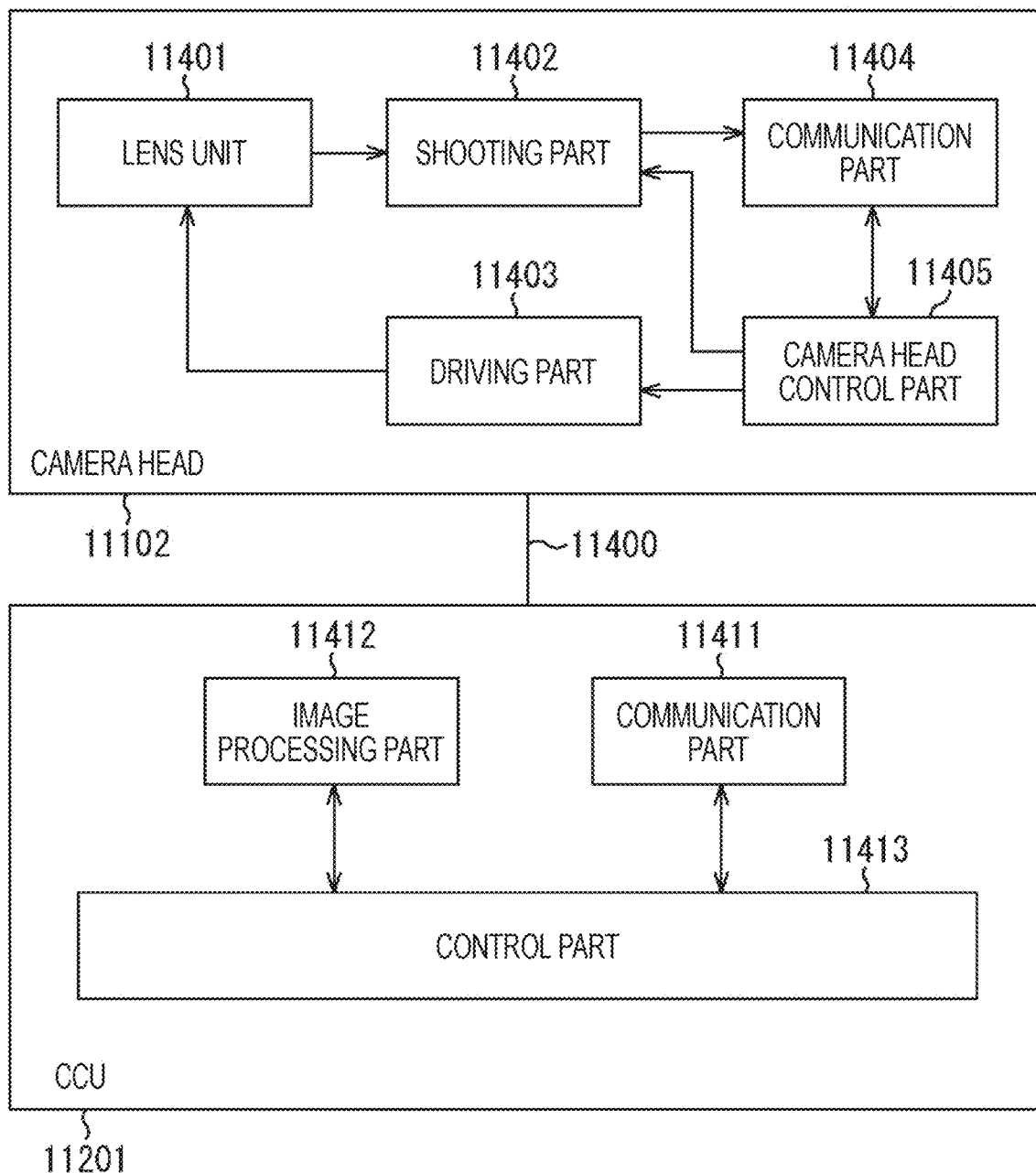
FIG. 44 is a block diagram illustrating an exemplary functional configuration of a camera head and a CCU.

FIG. 44 is a block diagram illustrating an exemplary functional configuration of the camera head 11102 and the CCU 11201 illustrated in FIG. 43.

The camera head 11102 has a lens unit 11401, a shooting part 11402, a driving part 11403, a communication part 11404, and a camera head control part 11405. The CCU 11201 has a communication part 11411, an image processing part 11412, and a control part 11413. The camera head 11102 and the CCU 11201 are communicably connected to each other via a transmission cable 11400.

The lens unit 11401 is an optical system provided at the connection part to the lens tube 11101. An observation light taken from the tip of the lens tube 11101 is guided to the camera head 11102, and is incident into the lens unit 11401. The lens unit 11401 is configured in a combination of a plurality of lenses including a zoom lens and a focus lens.

The shooting part 11402 may be configured of one imaging device (or single plate) or may be configured of a plurality of imaging devices (or multiplate). In a case where the shooting part 11402 is configured in multiplate, the image signals corresponding to RGB are generated by the imaging devices, respectively, and are combined thereby to obtain a color image, for example. Alternatively, the shooting part 11402 may have a pair of imaging devices for obtaining right-eye and left-eye image signals for 3 dimensional (D) display. 3D display is performed so that the operator 11131 can more accurately grasp the depth of a body tissue at a surgical site. Additionally, in a case where the shooting part 11402 is configured in multiplate, a plurality of lens units 11401 corresponding to the imaging devices can be provided, respectively.

Further, the shooting part 11402 may not necessarily be provided in the camera head 11102. For example, the shooting part 11402 may be provided immediately behind the objective lens inside the lens tube 11101.

The driving part 11403 is configured of an actuator, and moves the zoom lens and the focus lens in the lens unit 11401 by a predetermined distance along the optical axis under control of the camera head control part 11405. Thereby, the magnification and the focal point of an image shot by the shooting part 11402 can be adjusted as needed.

The communication part 11404 is configured of a communication apparatus for exchanging various items of information with the CCU 11201. The communication part 11404 transmits an image signal obtained from the shooting part 11402 as RAW data to the CCU 11201 via the transmission cable 11400.

Further, the communication part 11404 receives a control signal for controlling the driving of the camera head 11102 from the CCU 11201, and supplies it to the camera head control part 11405. The control signal includes information regarding the shooting conditions such as information for designating a frame rate of a shot image, information for designating an exposure value on shooting, and/or information for designating the magnification and the focal point of a shot image, for example.

Additionally, the shooting conditions such as frame rate, exposure value, magnification, and focal point may be designated by the user as needed, or may be automatically set by the control part 11413 in the CCU 11201 on the basis of the obtained image signal. In the latter case, the auto exposure (AE) function, the auto focus (AF) function, and the auto white balance (AWB) function are mounted on the endoscope 11100.

The camera head control part 11405 controls the driving of the camera head 11102 on the basis of the control signal from the CCU 11201 received via the communication part 11404.

The communication part 11411 is configured of a communication apparatus for exchanging various items of information with the camera head 11102. The communication part 11411 receives an image signal transmitted from the camera head 11102 via the transmission cable 11400.

Further, the communication part 11411 transmits the control signal for controlling the driving of the camera head 11102 to the camera head 11102. The image signal or control signal can be transmitted via electric communication, optical communication, or the like.

The image processing part 11412 performs various image processings on the image signal as RAW data transmitted from the camera head 11102.

The control part 11413 performs various controls for shooting a surgical site or the like by the endoscope 11100 and displaying a shot image obtained by shooting a surgical site or the like. For example, the control part 11413 generates the control signal for controlling the driving of the camera head 11102.

Further, the control part 11413 causes the display apparatus 11202 to display a shot image shooting a surgical site or the like therein on the basis of the image signal subjected to the image processing by the image processing part 11412. At this time, the control part 11413 may recognize various objects in the shot image by use of various image recognition technologies. For example, the control part 11413 detects the shapes, colors, and the like of the edges of the objects included in the shot image thereby to recognize a surgical tool such as forceps, a specific living body site, bleeding, mist during the use of the energy treatment tool 11112, and the like. When causing the display apparatus 11202 to display a shot image, the control part 11413 may overlap various items of surgery support information on the image of the surgical site to be displayed by use of the recognition result. The surgery support information is overlapped to be displayed, and is presented to the operator 11131 so that the loads on the operator 11131 can be alleviated and the operator 11131 can accurately perform the operation.

The transmission cable 11400 connecting the camera head 11102 and the CCU 11201 is an electric signal cable for communication of electric signals, an optical fiber for optical communication, or a composite cable thereof.

Here, wired communication is made by use of the transmission cable 11400 in the illustrated example, but wireless communication may be made between the camera head 11102 and the CCU 11201.

An exemplary endoscopic surgery system to which the technology according to the present disclosure can be applied has been described above. The technology according to the present disclosure can be applied to the camera head 11102 or the shooting part 11402 in the camera head 11102 among the above-described components, for example. Specifically, the imaging device 12 of FIG. 1 can be applied to the shooting part 11402, for example. The technology according to the present disclosure is applied to the shooting part 11402 so that a more detailed and more accurate image of a surgical site can be obtained and thus the operator can accurately confirm the surgical site.

Additionally, the endoscopic surgery system has been described herein by way of example, but the technology according to the present disclosure may be additionally applied to a microscopic surgery system and the like, for example.

<Application to Moving Object>

Further, the technology according to the present disclosure may be realized as an apparatus mounted on any kind of moving object such as vehicle, electric vehicle, hybrid electric vehicle, motorcycle, bicycle, personal mobility, airplane, drone, ship, or robot.

Figure 45:
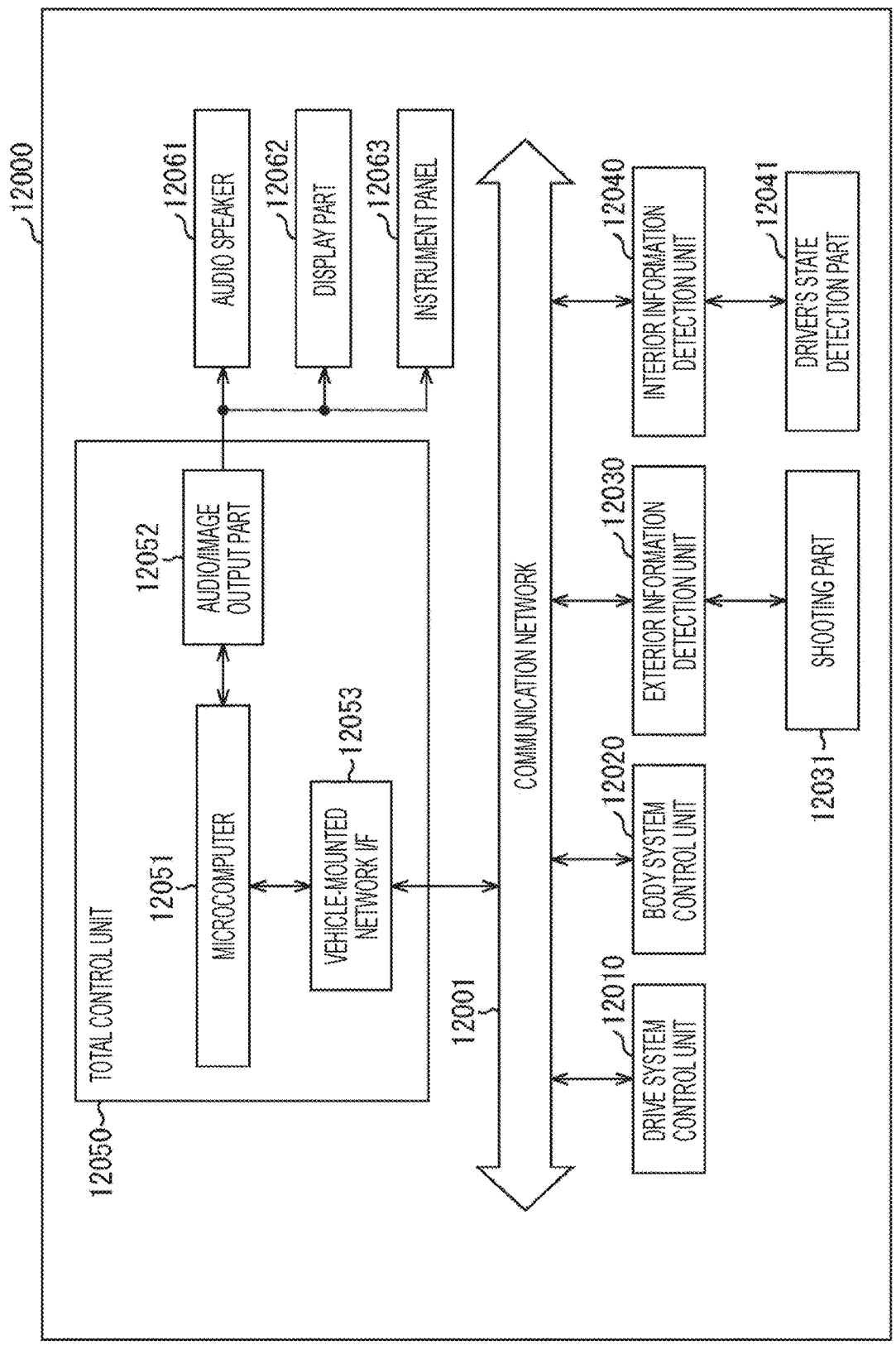
FIG. 45 is a block diagram illustrating an exemplary schematic configuration of a vehicle control system.

FIG. 45 is a block diagram illustrating an exemplary schematic configuration of a vehicle control system as an exemplary moving object control system to which the technology according to the present disclosure can be applied.

A vehicle control system 12000 includes a plurality of electronic control units connected via a communication network 12001. In the example illustrated in FIG. 45, the vehicle control system 12000 includes a drive system control unit 12010, a body system control unit 12020, an exterior information detection unit 12030, an interior information detection unit 12040, and a total control unit 12050. Further, a microcomputer 12051, an audio/image output part 12052, and a vehicle-mounted network interface (I/F) 12053 are illustrated as the functional components of the total control unit 12050.

The drive system control unit 12010 controls the operations of the apparatuses for the vehicle drive system according to various programs. For example, the drive system control unit 12010 functions as a control apparatus for a driving force generation apparatus such as internal combustion engine or drive motor for generating a driving force of the vehicle, a driving force transmission mechanism for transmitting a driving force to the wheels, a steering mechanism for adjusting the steering angle of the vehicle, a braking apparatus for generating a braking force of the vehicle, and the like.

The body system control unit 12020 controls the operations of various apparatuses equipped in the vehicle body according to various programs. For example, the body system control unit 12020 functions as a control apparatus for a keyless entry system, a smart key system, a power window apparatus, or various lights such as head lights, back lights, brake light, directional signals, or fog light. In this case, the body system control unit 12020 can have a radio wave originated from a portable machine as a key, or signals of various switches input. The body system control unit 12020 receives the input of the radio wave or signals, and controls the door lock apparatus, the power window apparatus, the lights, and the like of the vehicle.

The exterior information detection unit 12030 detects the information indicating the exterior of the vehicle mounting the vehicle control system 12000 thereon. For example, the exterior information detection unit 12030 is connected with a shooting part 12031. The exterior information detection unit 12030 causes the shooting part 12031 to shoot an image of the exterior of the vehicle, and receives the shot image. The exterior information detection unit 12030 may perform a processing of detecting an object such as person, vehicle, obstacle, road sign, or character on the road, or a distance detection processing on the basis of the received image.

The shooting part 12031 is a light sensor for receiving a light and outputting an electric signal depending on the amount of received light. The shooting part 12031 can output the electric signal as an image, or can output it as distance measurement information. Further, a light received by the shooting part 12031 may be a visible ray or a non-visible ray such as infrared ray.

The interior information detection unit 12040 detects the information indicating the interior of the vehicle. The interior information detection unit 12040 is connected with a driver's state detection part 12041 for detecting a driver's state, for example. The driver's state detection part 12041 includes a camera for shooting the driver, for example, and the interior information detection unit 12040 may calculate a degree of fatigue or a degree of concentration of the driver or may determine whether the driver is asleep at the wheel on the basis of the detection information input from the driver's state detection part 12041.

The microcomputer 12051 can calculate a control target value of the driving force generation apparatus, the steering mechanism, or the braking apparatus on the basis of the information indicating the exterior or interior of the vehicle obtained by the exterior information detection unit 12030 or the interior information detection unit 12040, and can output a control instruction to the drive system control unit 12010. For example, the microcomputer 12051 can perform cooperative control for realizing the advanced driver assistance system (ADAS) functions including collision avoidance or collision alleviation of the vehicle, follow-up traveling based on inter-vehicle distance, traveling at kept vehicle speed, collision alarm of the vehicle, lane deviation alarm of the vehicle, and the like.

Further, the microcomputer 12051 controls the driving force generation apparatus, the steering mechanism, the braking apparatus, or the like on the basis of the information indicating the surrounding of the vehicle obtained by the exterior information detection unit 12030 or the interior information detection unit 12040, thereby performing cooperative control for automatic driving of autonomous traveling irrespective of driver's operation, and the like.

Further, the microcomputer 12051 can output a control instruction to the body system control unit 12020 on the basis of the information indicating the exterior of the vehicle obtained by the exterior information detection unit 12030. For example, the microcomputer 12051 can control the head lights depending on the position of a leading vehicle or an oncoming vehicle detected by the exterior information detection unit 12030, and can perform cooperative control in order to achieve anti-glare such as switching from high beam to low beam.

The audio/image output part 12052 transmits an output signal of at least one of audio or image to an output apparatus capable of visually or aurally notifying the passengers in the vehicle or the outside of the vehicle of information. In the example of FIG. 45, an audio speaker 12061, a display part 12062, and an instrument panel 12063 are illustrated as output apparatuses by way of example. The display part 12062 may include at least one of an on-board display or a head-up display, for example.

Figure 46:
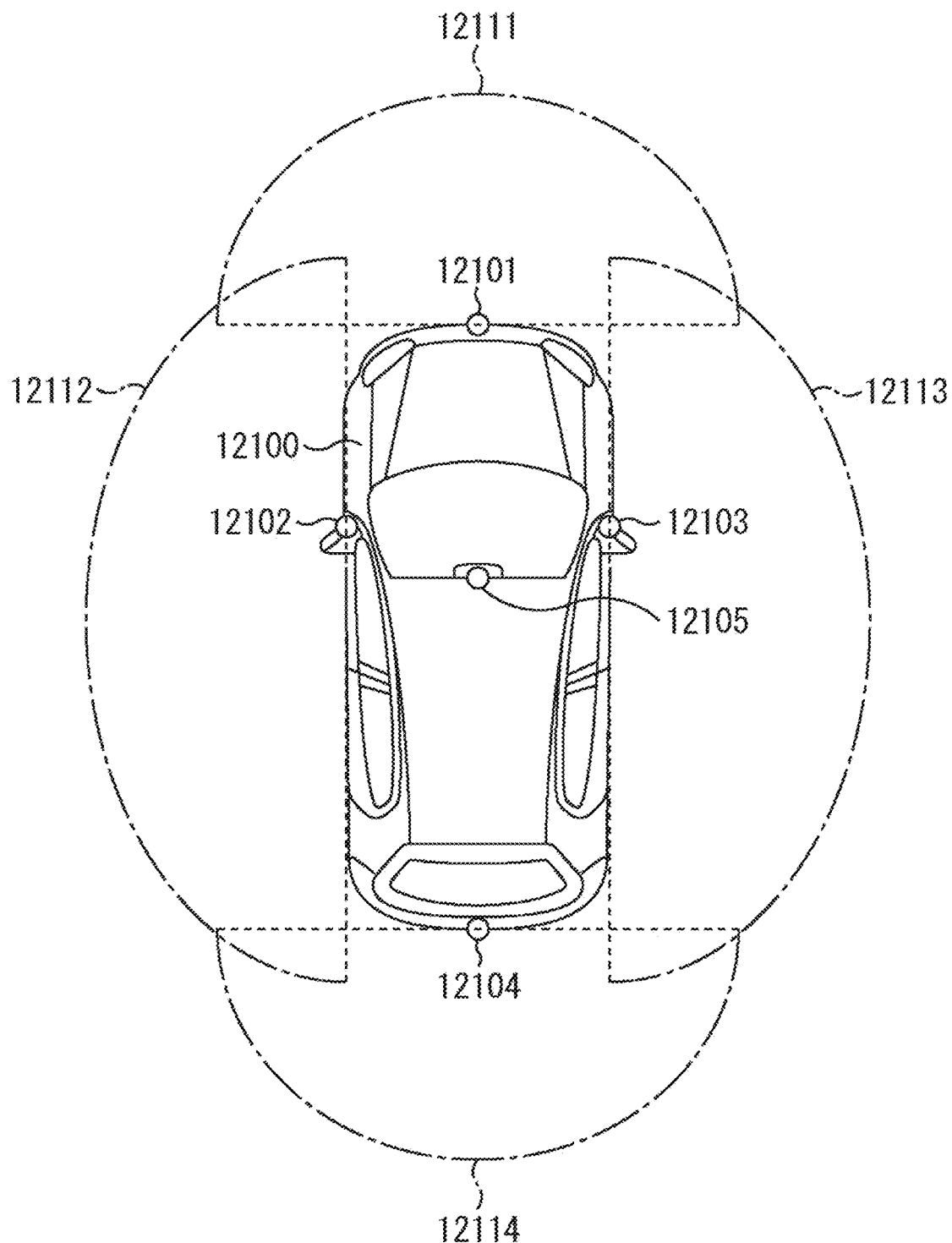
FIG. 46 is an explanatory diagram illustrating exemplary installation positions of an exterior information detection part and shooting parts.

FIG. 46 is a diagram illustrating exemplary installation positions of the shooting part 12031.

In FIG. 46, the shooting part 12031 has shooting parts 12101, 12102, 12103, 12104, and 12105.

The shooting parts 12101, 12102, 12103, 12104, and 12105 are provided at the front nose, the side mirrors, the rear bumper, the back door, at the top part of the windshield inside the vehicle 12100, and the like, for example. The shooting part 12101 provided at the front nose and the shooting part 12105 provided at the top part of the windshield inside the vehicle mainly obtain images in front of the vehicle 12100. The shooting parts 12102 and 12103 provided at the side mirrors mainly obtain images on both sides of the vehicle 12100. The shooting part 12104 provided at the rear bumper or back door mainly obtains an image behind the vehicle 12100. The shooting part 12105 provided at the top part of the windshield inside the vehicle is mainly used to detect a leading vehicle, a pedestrian, an obstacle, a traffic light, a road sign, a traffic lane, or the like.

Additionally, FIG. 46 illustrates exemplary shooting ranges of the shooting parts 12101 to 12104. A shooting range 12111 indicates a shooting range of the shooting part 12101 provided at the front nose, the shooting ranges 12112 and 12113 indicate the shooting ranges of the shooting parts 12102 and 12103 provided at the side mirrors, respectively, and a shooting range 12114 indicates a shooting range of the shooting part 12104 provided at the rear bumper or back door. For example, the image data shot by the shooting parts 12101 to 12104 are overlapped thereby to obtain a perspective image of the vehicle 12100 viewed from above.

At least one of the shooting parts 12101 to 12104 may have a function of obtaining distance information. For example, at least one of the shooting parts 12101 to 12104 may be a stereo camera configured of a plurality of imaging devices, or may be an imaging device having pixels for phase difference detection.

For example, the microcomputer 12051 finds a distance to each stereoscopic object in the shooting ranges 12111 to 12114 and a temporal change in the distance (relative speed to the vehicle 12100) on the basis of the distance information obtained from the shooting parts 12101 to 12104, thereby extracting, as a leading vehicle, a stereoscopic object traveling at a predetermined speed (0 km/h or more, for example) substantially in the same direction as the vehicle 12100, which is the closest stereoscopic object to the vehicle 12100 on the road. Further, the microcomputer 12051 can set an inter-vehicle distance to be previously secured behind the leading vehicle, and can perform automatic brake control (including follow-up stop control), automatic acceleration control (including follow-up start control), or the like. Cooperative control for automatic driving of autonomous traveling irrespective of driver's operation, and the like can be performed in this way.

For example, the microcomputer 12051 can classify and extract stereoscopic data regarding stereoscopic objects into two-wheel vehicle, standard-sized vehicle, large-sized vehicle, pedestrian, and other stereoscopic objects such as power pole on the basis of the distance information obtained from the shooting parts 12101 to 12104, and can use it for automatic obstacle avoidance. For example, the microcomputer 12051 discriminates the obstacles around the vehicle 12100 into obstacles capable of being visually confirmed by the driver of the vehicle 12100 and obstacles difficult to visually confirm. The microcomputer 12051 then determines a collision risk indicating a degree of risk of collision with each obstacle, and outputs an alarm to the driver via the audio speaker 12061 or the display part 12062 or performs forcible deceleration or avoidance steering via the drive system control unit 12010 when there is a collision possibility at a set value or more of collision risk, thereby performing driving support for collision avoidance.

At least one of the shooting parts 12101 to 12104 may be an infrared camera for detecting an infrared ray. For example, the microcomputer 12051 determines whether or not a pedestrian is present in the images shot by the shooting parts 12101 to 12104, thereby recognizing the pedestrian. The pedestrian is recognized in a procedure of extracting the characteristic points in the images shot by the shooting parts 12101 to 12104 as infrared cameras and a procedure of performing a pattern matching processing on a series of characteristic points indicating the contour of an object and determining whether or not the contour of the object is a pedestrian, for example. When the microcomputer 12051 determines that a pedestrian is present in the images shot by the shooting parts 12101 to 12104 and recognizes the pedestrian, the audio/image output part 12052 controls the display part 12062 to overlap a square contour line for emphasis on the recognized pedestrian for display. Further, the audio/image output part 12052 may control the display part 12062 to display an icon or the like indicating a pedestrian at a desired position.

An exemplary vehicle control system to which the technology according to the present disclosure can be applied has been described above. The technology according to the present disclosure can be applied to the shooting part 12031 among the above-described components, for example. Specifically, for example, the shooting apparatus 10 of FIG. 1 can be applied to the shooting part 12031. The technology according to the present disclosure is applied to the shooting part 12031 thereby to obtain more detailed and more accurate information indicating the exterior of the vehicle and to realize an enhancement in safety of automatic driving, for example.

Additionally, embodiments of the present technology are not limited to the above embodiments, and can be variously changed without departing from the scope of the present technology.

Additionally, the present technology can take the following configurations.

(1)
An imaging device including:
a first pixel including a metallic thin film filter configured to transmit a light in a first frequency band; and
a second pixel including a color filter configured to transmit alight in a second frequency band wider than the first frequency band.

(2)
The imaging device according to (1),
in which a signal in a third frequency band is generated from the respective signals of a plurality of first pixels each including a metallic thin film filter configured to transmit a light in the different first frequency bands.

(3)
The imaging device according to (2),
in which the third frequency band includes a red frequency band.

(4)
The imaging device according to (2) or (3),
in which the third frequency band includes a blue frequency band.

(5)
The imaging device according to any of (2) to (4),
in which a signal for a color image is generated from a signal in the third frequency band and a signal of the second pixel.

(6)
The imaging device according to any of (2) to (5),
in which a signal for a multispectral image is generated from a signal in the third frequency band and a signal of the second pixel.

(7)
The imaging device according to any of (2) to (6),
in which the first pixel divides the third frequency band into a plurality of frequency bands and receives lights in the respective frequency bands.

(8)
The imaging device according to any of (1) to (7),
in which the second frequency band includes a green frequency band.

(9)
The imaging device according to any of (1) to (8),
in which the second frequency band includes a white frequency band.

(10)
The imaging device according to any of (1) to (9),
in which the metallic thin film filter is configured of a plasmon resonator.

(11)
The imaging device according to any of (1) to (10),
in which the metallic thin film filter includes a plasmon filter in a hole array structure.

(12)
The imaging device according to any of (1) to (10),
in which the metallic thin film filter includes a plasmon filter in a dot array structure.

(13)
The imaging device according to (1),
in which the metallic thin film filter includes a Fabry-Perot interference filter.

(14)
An electronic apparatus including:
an imaging device; and
a signal processing part configured to process a signal output from the imaging device,
in which the imaging device includes:
a first pixel including a metallic thin film filter configured to transmit a light in a first frequency band; and
a second pixel including a color filter configured to transmit alight in a second frequency band wider than the first frequency band.

REFERENCE SIGNS LIST

10 Shooting apparatus
11 Optical system
12, 12A to 12C Imaging device
14 Signal processing part
31 Pixel array
51 Pixel 61 Photodiode
101 On-chip microlens
102 Interlayer film
103 Narrowband filter layer
104 Interlayer film
105 Photoelectric conversion device layer
106 Signal wiring layer
107 Color filter layer
108 Filter layer
121A to 121D Plasmon filter
131A to 131C Conductive thin film
132A to 132C' Hole
133A, 133B Dot
134A, 134B Dielectric layer
151 Plasmon filter
161A Conductive thin film
162 SiO2 film
163 SiN film
164 SiO2 substrate
203, 221 Semiconductor chip
401 Multispectral signal acquisition part
402 Signal RB generation part
403 Signal G acquisition part
404 Signal generation part

The invention claimed is:

1. An imaging device comprising:
a first pixel including a metallic thin film filter configured to transmit light in a first frequency band; and
a second pixel including a color filter configured to transmit light in a second frequency band wider than the first frequency band,
wherein a signal in a third frequency band is generated from respective signals of a plurality of first pixels each including a metallic thin film filter configured to transmit a light in different first frequency bands and
wherein a signal for a color image is generated from a signal in the third frequency band and a signal of the second pixel.

2. The imaging device according to claim 1, wherein the third frequency band includes a red frequency band.

3. The imaging device according to claim 1, wherein the third frequency band includes a blue frequency band.

4. The imaging device according to claim 1, wherein the second frequency band includes a green frequency band.

5. The imaging device according to claim 1, wherein the second frequency band includes a white frequency band.

6. The imaging device according to claim 1, wherein the metallic thin film filter is configured of a plasmon resonator.

7. The imaging device according to claim 1, wherein the metallic thin film filter includes a plasmon filter in a hole array structure.

8. The imaging device according to claim 1, wherein the metallic thin film filter includes a plasmon filter in a dot array structure.

9. The imaging device according to claim 1, wherein the metallic thin film filter includes a Fabry-Perot interference filter.

10. An imaging device comprising:
a first pixel including a metallic thin film filter configured to transmit light in a first frequency band; and
a second pixel including a color filter configured to transmit light in a second frequency band wider than the first frequency band,
wherein a signal in a third frequency band is generated from respective signals of a plurality of first pixels each including a metallic thin film filter configured to transmit a light in different first frequency bands, and
wherein a signal for a multispectral image is generated from a signal in the third frequency band and a signal of the second pixel.

11. An imaging device comprising:
a first pixel including a metallic thin film filter configured to transmit light in a first frequency band; and
a second pixel including a color filter configured to transmit light in a second frequency band wider than the first frequency band,
wherein a signal in a third frequency band is generated from respective signals of a plurality of first pixels each including a metallic thin film filter configured to transmit a light in different first frequency bands, and
wherein the first pixel divides the third frequency band into a plurality of frequency bands and receives lights in the respective frequency bands.

12. An electronic apparatus comprising:
an imaging device; and
signal processing circuitry configured to process a signal output from the imaging device,
wherein the imaging device includes:
a first pixel including a metallic thin film filter configured to transmit light in a first frequency band; and
a second pixel including a color filter configured to transmit light in a second frequency band wider than the first frequency band,
wherein a signal in a third frequency band is generated from respective signals of a plurality of first pixels each including a metallic thin film filter configured to transmit a light in different first frequency bands and
wherein a signal for a color image is generated from a signal in the third frequency band and a signal of the second pixel.

* * * * *